United States Patent
Seo et al.

(10) Patent No.: US 8,659,008 B2
(45) Date of Patent: Feb. 25, 2014

(54) COMPOSITE MATERIAL AND LIGHT EMITTING ELEMENT, LIGHT EMITTING DEVICE, AND ELECTRONIC DEVICE USING THE COMPOSITE MATERIAL

(75) Inventors: Satoshi Seo, Kanagawa (JP); Kumi Kojima, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1304 days.

(21) Appl. No.: 11/482,086

(22) Filed: Jul. 6, 2006

(65) Prior Publication Data

US 2007/0007516 A1    Jan. 11, 2007

(30) Foreign Application Priority Data

Jul. 8, 2005 (JP) .................. 2005-200953

(51) Int. Cl.
    *H01L 29/08* (2006.01)
(52) U.S. Cl.
    USPC .................. 257/40; 438/99; 257/E51.024
(58) Field of Classification Search
    USPC ........ 257/40, E51.001–E51.052; 252/301.16, 252/301.21–301.22, 301.27; 313/504; 428/690, 917; 438/99
    See application file for complete search history.

(56) References Cited

U.S. PATENT DOCUMENTS

| | | | |
|---|---|---|---|
| 5,989,737 A | 11/1999 | Xie et al. | |
| 6,395,409 B2 | 5/2002 | Ueda et al. | |
| 6,423,429 B2 | 7/2002 | Kido et al. | |
| 6,486,601 B1 | 11/2002 | Sakai et al. | |
| 6,566,807 B1 | 5/2003 | Fujita et al. | |
| 6,589,673 B1 | 7/2003 | Kido et al. | |
| 7,338,722 B2 | 3/2008 | Thompson et al. | |
| 7,357,992 B2 | 4/2008 | Kato et al. | |
| 7,387,904 B2 | 6/2008 | Saito et al. | |

(Continued)

FOREIGN PATENT DOCUMENTS

| | | |
|---|---|---|
| CN | 1447629 A | 10/2003 |
| EP | 1 017 118 A2 | 7/2000 |

(Continued)

OTHER PUBLICATIONS

Lever, A.B.P., et al. The Redox Chemistry of Metallophthalocyanines in Solution. Office of Naval Research. Contract N00014-91-J-1910, R&T Code 4131025, Technical Report #45, May 19, 1992.*

(Continued)

*Primary Examiner* — Mark Tornow
(74) *Attorney, Agent, or Firm* — Husch Blackwell LLP

(57) ABSTRACT

The present invention provides a composite material in which an organic compound and an inorganic compound are composited, which is superior in conductivity, a composite material which is superior in a property of injecting carriers to an organic compound, and a composite material having low resistance with metal. Further, the present invention provides a light emitting element operating at a low drive voltage by applying the composite material to a current excitation type light emitting element, and a light emitting device consuming low power by manufacturing a light emitting device using the light emitting element. The present invention provides a composite material including metal oxide and an organic compound having an oxidation peak potential with respect to an oxidation-reduction potential of ferrocene in dimethylformamide (DMF) at room temperature within the range of 0 V and 1.5 V (vs. Fc/Fc$^+$), preferably within the range of 0.1 V and 1.0 V (vs. Fc/Fc$^+$).

60 Claims, 48 Drawing Sheets

(56) References Cited

U.S. PATENT DOCUMENTS

| | | | |
|---|---|---|---|
| 7,402,701 B2 | 7/2008 | Kato et al. | |
| 7,449,830 B2 * | 11/2008 | Aziz | 313/504 |
| 7,622,200 B2 | 11/2009 | Ohsawa et al. | |
| 7,649,197 B2 | 1/2010 | Iwaki et al. | |
| 7,732,808 B2 | 6/2010 | Ikeda et al. | |
| 7,790,296 B2 | 9/2010 | Kawakami et al. | |
| 7,883,788 B2 | 2/2011 | Kawakami et al. | |
| 8,048,543 B2 | 11/2011 | Kawakami et al. | |
| 8,080,934 B2 | 12/2011 | Kido et al. | |
| 2002/0161074 A1 * | 10/2002 | Zhang et al. | 524/88 |
| 2003/0155004 A1 | 8/2003 | Takahashi et al. | |
| 2003/0189401 A1 | 10/2003 | Kido et al. | |
| 2005/0024293 A1 | 2/2005 | Sakata et al. | |
| 2005/0037234 A1 * | 2/2005 | Kim et al. | 428/690 |
| 2005/0072977 A1 | 4/2005 | Saito et al. | 257/72 |
| 2005/0084712 A1 * | 4/2005 | Kido et al. | 428/690 |
| 2005/0084713 A1 | 4/2005 | Kido et al. | |
| 2005/0098207 A1 * | 5/2005 | Matsumoto et al. | 136/263 |
| 2005/0106419 A1 * | 5/2005 | Endoh et al. | 428/690 |
| 2005/0123751 A1 * | 6/2005 | Tsutsui et al. | 428/364 |
| 2005/0170208 A1 | 8/2005 | Yatsunami et al. | |
| 2005/0248267 A1 | 11/2005 | Gyoutoku et al. | |
| 2005/0260442 A1 | 11/2005 | Yu et al. | |
| 2006/0008740 A1 * | 1/2006 | Kido et al. | 430/296 |
| 2006/0027830 A1 | 2/2006 | Kumaki et al. | 257/103 |
| 2006/0046096 A1 | 3/2006 | Nomura et al. | 428/690 |
| 2006/0243967 A1 | 11/2006 | Nomura et al. | |
| 2006/0261728 A1 | 11/2006 | Yamazaki et al. | |
| 2006/0263638 A1 | 11/2006 | Kawakami et al. | |
| 2007/0001570 A1 | 1/2007 | Nomura et al. | |
| 2007/0013301 A1 | 1/2007 | Yamazaki et al. | |
| 2007/0159082 A1 * | 7/2007 | Ikeda et al. | 313/506 |
| 2007/0182317 A1 | 8/2007 | Kido et al. | |
| 2007/0241667 A1 | 10/2007 | Ohsawa et al. | |
| 2008/0136325 A1 | 6/2008 | Yamazaki et al. | |
| 2008/0176102 A1 | 7/2008 | Thompson et al. | |
| 2008/0191611 A1 | 8/2008 | Iwaki et al. | |
| 2009/0026922 A1 | 1/2009 | Iwaki et al. | |
| 2009/0058267 A1 | 3/2009 | Nakashima et al. | |
| 2009/0091246 A1 | 4/2009 | Tsuji et al. | |
| 2009/0134383 A1 | 5/2009 | Imahayashi et al. | |
| 2009/0206732 A1 | 8/2009 | Seo et al. | |
| 2010/0084645 A1 | 4/2010 | Iwaki et al. | |
| 2010/0096627 A1 | 4/2010 | Ikeda et al. | |
| 2010/0207518 A1 | 8/2010 | Ikeda et al. | |

FOREIGN PATENT DOCUMENTS

| | | |
|---|---|---|
| EP | 1 331 653 A2 | 7/2003 |
| EP | 1 351 558 A1 | 10/2003 |
| EP | 1 524 706 A2 | 4/2005 |
| EP | 1 530 245 A2 | 5/2005 |
| EP | 1 531 501 A2 | 5/2005 |
| EP | 1 617 493 A2 | 1/2006 |
| EP | 1 667 494 A1 | 6/2006 |
| EP | 1 865 566 A1 | 12/2007 |
| EP | 1 881 543 A1 | 1/2008 |
| EP | 2 062 908 A1 | 5/2009 |
| EP | 2 241 570 A1 | 10/2010 |
| JP | 3-274695 | 12/1991 |
| JP | 7-26256 | 1/1995 |
| JP | 9-63771 | 3/1997 |
| JP | 09-063771 | 3/1997 |
| JP | 2824411 | 11/1998 |
| JP | 11-162647 | 6/1999 |
| JP | 11-307259 | 11/1999 |
| JP | 11-307264 | 11/1999 |
| JP | 2000-196140 | 7/2000 |
| JP | 2000-315580 | 11/2000 |
| JP | 2003-272860 | 9/2003 |
| JP | 2003-297446 | 10/2003 |
| JP | 2005-26121 | 1/2005 |
| JP | 2005-32618 | 2/2005 |
| JP | 2005-93402 | 4/2005 |
| JP | 2005-100921 | 4/2005 |
| JP | 2005-108804 | 4/2005 |
| JP | 2005-116203 | 4/2005 |
| JP | 2005-123095 | 5/2005 |
| JP | 2005-135600 | 5/2005 |
| JP | 2005-166637 | 6/2005 |
| JP | 2005-166641 | 6/2005 |
| JP | 2005-251587 | 9/2005 |
| JP | 2006-24791 | 1/2006 |
| JP | 2006-210848 | 8/2006 |
| JP | 2006-523231 | 10/2006 |
| JP | 2006-319070 | 11/2006 |
| WO | WO 2004/085450 A2 | 10/2004 |
| WO | WO 2005/031798 A2 | 4/2005 |
| WO | WO 2005/064995 A1 | 7/2005 |
| WO | WO 2005/115061 A1 | 12/2005 |
| WO | WO 2006/009262 A1 | 1/2006 |
| WO | WO 2006/013990 A1 | 2/2006 |
| WO | WO 2006/033285 A1 | 3/2006 |
| WO | WO 2006/033472 A1 | 3/2006 |
| WO | WO 2006/035952 A1 | 4/2006 |
| WO | WO 2006/035973 A1 | 4/2006 |
| WO | WO 2006/038573 A1 | 4/2006 |
| WO | WO 2006035952 A1 * | 4/2006 |
| WO | WO 2006/049323 A1 | 5/2006 |
| WO | WO 2006/049334 A1 | 5/2006 |
| WO | WO 2006/057420 A1 | 6/2006 |
| WO | WO 2006/059745 A1 | 6/2006 |
| WO | WO 2006/093171 A1 | 9/2006 |
| WO | WO 2006/101016 A1 | 9/2006 |
| WO | WO 2006/115232 A1 | 11/2006 |
| WO | WO 2006/126363 A1 | 11/2006 |
| WO | WO 2007/004729 A1 | 1/2007 |

OTHER PUBLICATIONS

Tanaka, A., et al. "Femtosecond Time-Resolved Two-Photon Photoemission Study of Organic Semiconductor Copper Phthalocyanine Film." J. Elect. Spectro. & Rel. Phenom., vol. 144-17 (2005): pp. 327-329.*

Itano, K., et al. "Fabrication and Performances of a Double-Layer Organic Electroluminescent Device Using a Novel Starburst Molecule, 1,3,5-TrisN-(4-diphenylaminophenyl)phenylamino benzene, as a Hole-Transport Material and Tris(8-quinolinolato)aluminum as an Emitting Material." IEEE Trans. Elect. Dev., vol. 44, No. 8 (Aug. 1997): pp. 1218-1221.*

Goldsmith, C.R. et al, "C-H Bond Activation by a Ferric Methoxide Complex: Modeling the Rate-Determining Step in the Mechanism of Lipoxygenase," J. Am. Chem. Soc., vol. 124, No. 1, 2002, pp. 83-96.

Onishi et al, High Molecular EL Materials—Development of Light-Emitting High Molecular Compounds, Kyoritsu Shuppan, 2004, pp. 64-67 (with English translation).

Huang, J. et al, "High-Brightness Organic Double-Quantum-Well Electroluminescent Devices," Applied Physics Letters, vol. 77, No. 12, Sep. 18, 2000, pp. 1750-1752.

Baldo, M.A. et al, "Very High-Efficiency Green Organic Light-Emitting Devices Based on Electrophosphorescence," Applied Physics Letters, vol. 75, No. 1, Jul. 5, 1999, pp. 4-6.

Office Action re Chinese application No. CN 201110026716.5, dated Feb. 3, 2012 (with English translation).

Office Action re Chinese application No. CN 201110026712.7, dated Feb. 3, 2012 (with English translation).

* cited by examiner

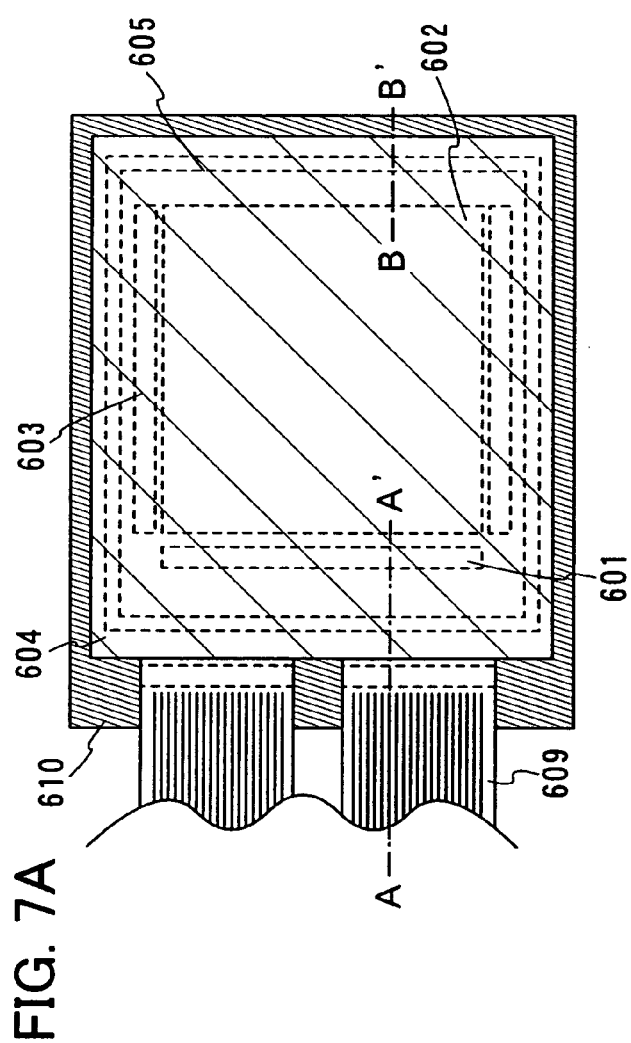
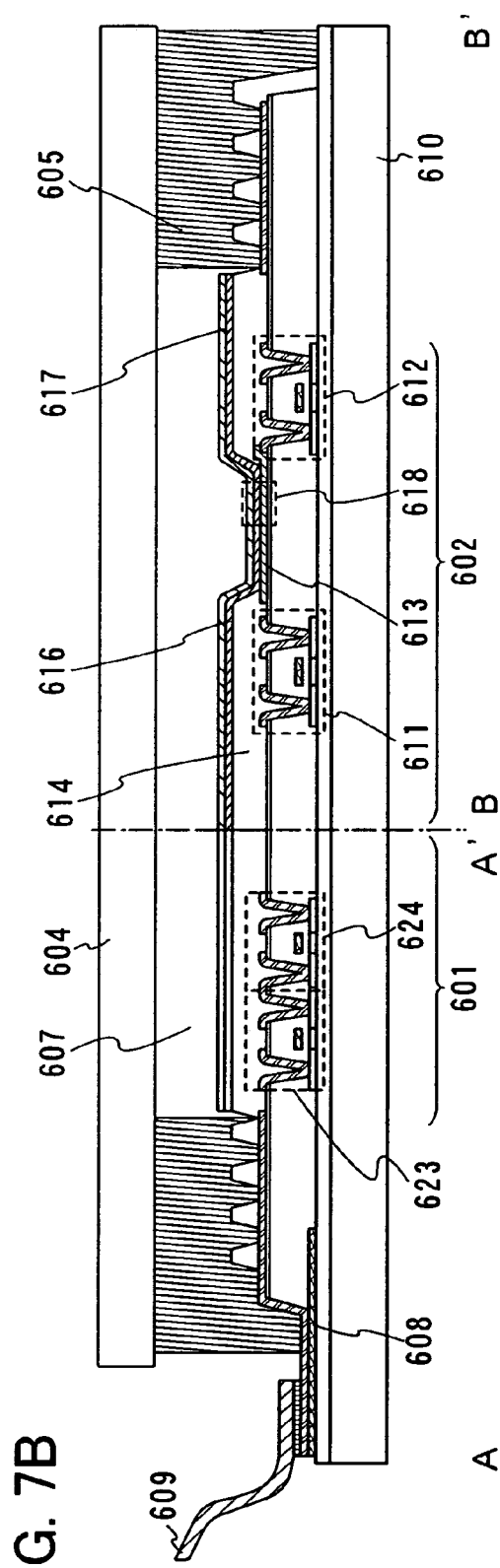
FIG. 7A
FIG. 7B

COMPOSITE MATERIAL AND LIGHT EMITTING ELEMENT, LIGHT EMITTING DEVICE, AND ELECTRONIC DEVICE USING THE COMPOSITE MATERIAL

BACKGROUND OF THE PRESENT INVENTION

1. Field of the Present Invention

The present invention relates to a composite material in which an organic compound and inorganic compound are composited and which is superior in a carrier transporting property and a property of injecting carriers to an organic compound. Moreover, the present invention relates to a current excitation type light emitting element using the composite material. In addition, the present invention relates to a light emitting device and an electronic device having the light emitting element.

2. Description of the Related Art

In recent years, a light emitting element using an organic compound having a light emitting property has been actively researched and developed. These light emitting elements basically have a structure in which a layer including an organic compound having a light emitting property is interposed between a pair of electrodes. By applying voltage to this element, electrons and holes are injected to the layer including an organic compound having a light emitting property from the pair of electrodes, respectively, to feed current. Then, the carriers (electrons and holes) are recombined, and accordingly, an excitation state is formed by an organic compound having a light emitting property. Light is emitted when the excitation state returns to a ground state. From such a mechanism, such a light emitting element is referred to as a current excitation type light emitting element.

A singlet excitation state and a triplet excitation state can be given as types of an excitation state formed by an organic compound. Light emission from a singlet excitation state is referred to as fluorescence and light emission from a triplet excitation state is referred to as phosphorescence.

A great advantage of such a light emitting element is that such a light emitting element can be manufactured to have a thin shape and lightweight, because the light emitting element is made of an organic thin film, for example, having a thickness of approximately 0.1 μm. In addition, extremely high response speed is another advantage, because time between carrier injection and light emission is approximately 1 μsec or less. These characteristics are considered suitable for a flat panel display.

Such a light emitting element is formed in a film shape. Thus, surface emission can be easily obtained by forming a large-area element. This characteristic is difficult to be obtained by a point light source typified by an incandescent lamp or an LED or a line light source typified by a fluorescent lamp. Therefore, the above-described light emitting element also has a high utility value as a surface light source which is applicable to lighting or the like.

Meanwhile, in a display device to be incorporated into various kinds of information processing appliances which have developed rapidly in recent years, reduction of power consumption is particularly required, and it has been attempted to decrease the drive voltage of a light emitting element in order to achieve the low power consumption. Further, in view of commercialization, not only the decrease in the drive voltage but also the extension of lifetime of a light emitting element is significant. Therefore, development of a light emitting element to achieve the extension of lifetime has been advanced.

For example, in Patent Document 1 (Patent Document 1: Japanese Patent Laid-Open No. H9-63771), the decrease in a drive voltage of a light emitting element has been achieved by forming an anode with metal oxide having a high work function such as molybdenum oxide. Moreover, an advantageous effect of long lifetime is also obtained.

However, in order to extend the lifetime, a means described in Patent Document 1 is insufficient and technical development to achieve the longer lifetime has been required.

SUMMARY OF THE PRESENT INVENTION

In view of the foregoing problem, it is an object of the present invention to provide a composite material in which an organic compound and an inorganic compound are composited and which is superior in conductivity. It is another object of the present invention to provide a composite material which is superior in a property of injecting carriers to an organic compound. Moreover, it is another object of the present invention to provide a composite material having low resistance with metal.

Further, it is another object of the present invention to provide a light emitting element operating at a low drive voltage by applying the composite material to a current excitation type light emitting element. Furthermore, it is another object of the present invention to provide a light emitting device consuming low power by manufacturing a light emitting device using the light emitting element.

As a result of diligent study, the inventors have finally found out that the object can be solved by applying a composite material including an organic compound and an inorganic compound.

In other words, one feature of the present invention is a composite material including metal oxide and an organic compound having an oxidation peak potential with respect to an Ag/Ag$^+$ electrode in dimethylformamide (DMF) at room temperature within the range of 0 V or more and 1.5 V or less (vs. Ag/Ag$^+$).

Another feature of the present invention is a composite material including metal oxide and an organic compound having an oxidation peak potential with respect to an Ag/Ag electrode in dimethylformamide (DMF) at room temperature within the range of 0.2 V or more and 1.1 V or less (vs. Ag/Ag$^+$).

Another feature of the present invention is a composite material including metal oxide and an organic compound having an oxidation peak potential with respect to an oxidation-reduction potential of ferrocene in dimethylformamide (DMF) at room temperature within the range of 0 V or more and 1.5 V or less (vs. Fc/Fc$^+$).

Another feature of the present invention is a composite material including metal oxide and an organic compound having an oxidation peak potential with respect to an oxidation-reduction potential of ferrocene in dimethylformamide (DMF) at room temperature within the range of 0.1 V or more and 1.0 V or less (vs. Fc/Fc$^+$).

Another feature of the present invention is a composite material including metal oxide and an organic compound having ionization potential in dimethylformamide (DMF) solution at room temperature is 4.8 eV or more and 6.4 eV or less.

Another feature of the present invention is a composite material including metal oxide and an organic compound having ionization potential in dimethylformamide (DMF) solution at room temperature is 5.0 eV or more and 6.0 eV or less.

Another feature of the present invention is a composite material including metal oxide and an organic compound in which a half-wave potential [V vs. Ag/Ag$^+$] in dimethylformamide (DMF) solution is 0.2 to 0.9 [V vs. Ag/Ag$^+$].

Another feature of the present invention is a composite material including metal oxide and an organic compound in which a half-wave potential [vs. Fc/Fc$^+$] in dimethylformamide (DMF) solution is 0.1 to 0.8 [vs. Fc/Fc$^+$].

In the above-described structure, another feature of the present invention is that the organic compound is an aromatic amine compound.

In addition, another feature of the present invention is that the organic compound is a carbazole derivative.

In addition, another feature of the present invention is that the organic compound is an aromatic hydrocarbon.

In addition, another feature of the present invention is that the organic compound is a metal complex.

In addition, another feature of the present invention is that the organic compound is an organic metal complex.

In addition, another feature of the present invention is that the organic compound is a high molecular compound.

In the above-described structure, another feature of the present invention is that the metal oxide shows an electron accepting property with respect to the organic compound.

In the above-described structure, the metal oxide is preferably transition metal oxide. In particular, oxide of metal belonging to Groups 4 to 8 in the periodic table is preferable. More preferably, one or more of vanadium oxide, niobium oxide, tantalum oxide, chromium oxide, molybdenum oxide, tungsten oxide, manganese oxide, and rhenium oxide is preferable.

In addition, the composite material of the present invention can be used for a light emitting element. Therefore, another feature of the present invention is that a light emitting element has a layer including a light emitting substance between a pair of electrodes and the layer including a light emitting substance has a layer including the composite material described above.

In the above-described structure, the layer including the composite material of the present invention may be provided to be in contact with an electrode serving as an anode or an electrode serving as a cathode among the pair of electrodes. Further, the layers each including the composite material of the present invention may be provided to be in contact with the pair of electrodes, respectively.

Another feature of the present invention is a light emitting element having n (n is an arbitrary natural number of 2 or more) layers each including a light emitting substance between a pair of electrodes and having a layer including the composite material described above between an m-th (m is an arbitrary natural number which satisfies 1≤m<n) layer including a light emitting substance and an (m+1)-th layer including a light emitting substance.

In addition, a light emitting device having the above-described light emitting element is also within the present invention. A light emitting device in the present specification includes an image display device, a light emitting device, or a light source (including a lighting installation). Further, the following are all included in a light emitting device: a module in which a connector, for example, an FPC (flexible printed circuit), a TAB (tape automated bonding) tape, or a TCP (tape carrier package) is attached to a panel provided with a light emitting element; a module provided with a printed wiring board at the end of the TAB tape or the TCP; and a module in which an IC (integrated circuit) is directly mounted to a light emitting element by a COG (chip on glass) method.

Further, an electronic device in which a light emitting element of the present invention is used for a display portion is also within the present invention. Therefore, another feature of the present invention is an electronic device having a display portion, where the display portion is provided with the light emitting element described above and a controlling means for controlling light emission of the light emitting element.

By implementing the present invention, a composite material can be provided, in which an organic compound and an inorganic compound are composited and which is superior in a carrier transporting property and a property of injecting carriers to an organic compound.

By applying the composite material of the present invention to a light emitting element, low voltage driving and low current driving can be realized.

By applying the composite material of the present invention to a light emitting device, a light emitting device consuming low power can be obtained.

BRIEF DESCRIPTION OF THE DRAWINGS

FIGS. 7A and 7B are explanatory views of a light emitting device of the present invention;

DETAILED DESCRIPTION OF THE PRESENT INVENTION

Figure 1A:
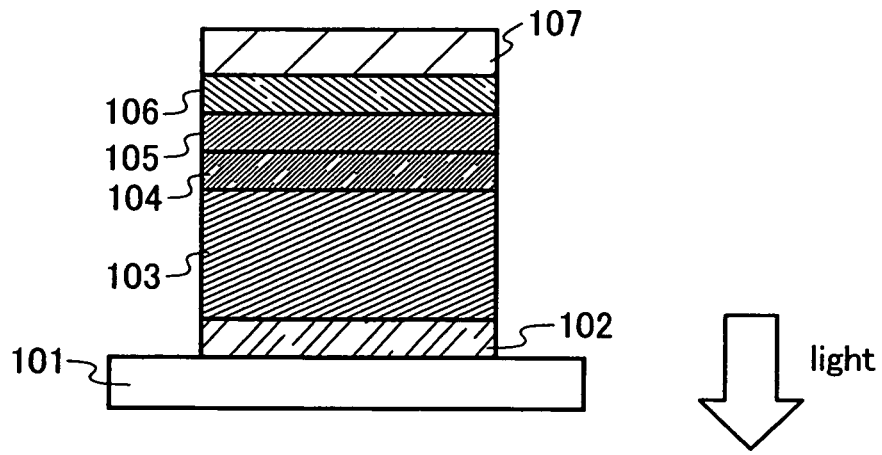
FIGS. 1A to 1C are explanatory views of a light emitting element of the present invention.

Hereinafter, embodiment modes of the present invention will be explained in detail with reference to the accompanied drawings or the like. However, the present invention is not limited to the explanation given below. The present invention can be implemented in various embodiments, and it is to be easily understood that various changes and modifications in modes and details thereof will be apparent to those skilled in the art. Therefore, it should be noted that the present invention should not be interpreted as being limited to the description of embodiment modes.

Embodiment Mode 1

A composite material of the present invention has a feature of including metal oxide and an organic compound having an oxidation peak potential with respect to an Ag/Ag$^+$ electrode in dimethylformamide (DMF) at room temperature within the range of 0 V or more and 1.5 V or less (vs. Ag/Ag$^+$), preferably 0.2 V or more and 1.1 V or less (vs. Ag/Ag$^+$). In addition, a composite material of the present invention has a feature of including metal oxide and an organic compound having an oxidation peak potential with respect to an oxidation-reduction potential of ferrocene in dimethylformamide (DMF) at room temperature within the range of 0 V or more and 1.5 V or less (vs. Fc/Fc$^+$), preferably 0.1 V or more and 1.0 V or less (vs. Fc/Fc$^+$). Further, a composite material of the present invention has a feature of including metal oxide and an organic compound having ionization potential in dimethylformamide (DMF) solution at room temperature is 4.8 eV or more and 6.4 eV or less, preferably 5.0 eV or more and 6.0 eV or less.

With such a structure, an organic compound is easily oxidized by metal oxide in the composite material of the present invention. In other words, in the composite material of the present invention, a radical cation of the organic compound is easily generated. As a result, conductivity of the composite material can be enhanced compared with a case of using only the organic compound. In addition, a property of injecting carriers (particularly, a property of injecting holes) to the organic compound can be enhanced. Further, an electrical barrier to various metal is relieved and a contact resistance with metal can be reduced.

As the organic compound which is used for the composite material of the present invention, various compounds each having the oxidation peak potential within the range described above such as an aromatic amine compound, a carbazole derivative, an aromatic hydrocarbon, a metal complex, an organic metal complex, or a high molecular compound (an oligomer, a dendrimer, a polymer, or the like) can be used. As long as the compound described above is used, any of a compound having a hole transporting property and a compound having an electron transporting property can be used; however, an organic compound having a hole transporting property is particularly preferable. Hereinafter, organic compounds which can be used for the composite material of the present invention will be specifically listed.

For example, as an aromatic amine compound, 4,4'-bis[N-(1-naphthyl)-N-phenylamino]biphenyl (abbreviation: NPB), 4,4'-bis[N-(3-methylphenyl)-N-phenylamino]biphenyl (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and the like can be given.

In addition, N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), 4,4'-bis(N-{4-[N-(3-methylphenyl)-N-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), and the like can be given.

As a carbazole derivative which can be used for the present invention, specifically, 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphtyl)-N-(9-phenylcarbazol-3-yl)amino]-9-phenylcarbazole (abbreviation: PCzPCN1), and the like can be given.

In addition, 4,4'-di(N-carbazolyl)biphenyl (abbreviation: CBP); 1,3,5-tris[4-(N-carbazolyl)phenyl]benzene (abbreviation: TCPB); and the like can be used.

As an aromatic hydrocarbon which can be used for the present invention, for example, 2-tert-butyl-9,10-di(2-naphthyl)anthracene (abbreviation: t-BuDNA), anthracene, 9,10-diphenylanthracene, tetracene, rubrene, perylene, 2,5,8,11-tetra(tert-butyl)perylene, and the like are given. In addition to this, pentacene, coronene, and the like can also be used. Thus, it is more preferable to use an aromatic hydrocarbon having hole mobility of $1\times10^{-6}$ cm$^2$/Vs or more and having 14 to 42 carbon atoms.

An aromatic hydrocarbon which can be used for the present invention may have a vinyl skeleton. As an aromatic hydrocarbon having a vinyl group, for example, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like are given.

As a metal complex which can be used for the present invention, for example, tris(8-quinolinolato)aluminum (abbreviation: Alq), bis(8-quinolinolato)zinc (abbreviation: Znq), and the like are given.

As an organic metal complex which can be used for the present invention, for example, tris(2-phenylpyridinato)iridium(III) (abbreviation: Ir(ppy)$_3$), tris[N-(2-pyridyl)pyrazolato]cobalt(III) (abbreviation: Co(ppz)$_3$), and the like are given.

In addition, a high molecular compound such as poly(N-vinylcarbazole) (abbreviation: PVK) or poly(4-vinyl triphenylamine) (abbreviation: PVTPA) can also be used.

In addition, as an inorganic compound which is used for the composite material of the present invention, transition metal oxide is preferable. Further, oxide of metal belonging to Groups 4 to 8 in the periodic table is preferable. Specifically, vanadium oxide, niobium oxide, tantalum oxide, chromium oxide, molybdenum oxide, tungsten oxide, manganese oxide, and rhenium oxide are preferable because of a high electron accepting property. In particular, molybdenum oxide is preferable because it is stable in the air and easy to deal with.

As a manufacturing method of the composite material of the present invention, any method may be used regardless of a wet method or a dry method. For example, the composite material of the present invention can be manufactured by co-evaporation of the organic compound and the inorganic compound described above or can be obtained by applying and baking a solution including the organic compound described above and metal alkoxide. It is to be noted that molybdenum oxide is easily vaporized in vacuum and preferable in view of a manufacturing process.

Embodiment Mode 2

A light emitting element of the present invention has a plurality of layers between a pair of electrodes. The plurality of layers are stacked by combining a layer made of a substance having a high carrier injecting property or having a high carrier transporting property so that a light emitting region is formed in a position separated from an electrode, in other words, so that carriers are recombined in a site separated from an electrode.

One mode of the light emitting element of the present invention will be explained with reference to FIG. 1A.

In this embodiment mode, the light emitting element is formed by a first electrode 102; a first layer 103, a second layer 104, a third layer 105, and a fourth layer 106 which are sequentially stacked over the first electrode 102; and a second electrode 107 provided thereover. It is to be noted that explanation will be made with the assumption that the first electrode 102 serves as an anode and the second electrode 107 serves as a cathode in this embodiment mode.

The substrate 101 is used as a support body of the light emitting element. As the substrate 101, for example, glass, plastic, or the like can be used. A material except these may be used as long as the material serves as a support body in a manufacturing step of the light emitting element.

As the first electrode 102, various kinds of metal, alloy, compounds having an electrical conduction property, and a mixture of these can be used. For example, gold (Au), platinum (Pt), nickel (Ni), tungsten (W), chromium (Cr), molybdenum (Mo), iron (Fe), cobalt (Co), titanium (Ti), copper (Cu), palladium (Pd), aluminum (Al), aluminum-silicon (Al—Si), aluminum-titanium (Al—Ti), aluminum-silicon-copper (Al—Si—Cu), nitride of a metal material (TiN), or the like can be used as well as indium tin oxide (ITO), indium tin oxide including silicon, or indium zinc oxide (IZO) in which zinc oxide (ZnO) of 2 to 20 wt % is mixed into indium oxide. However, among these substances, it is preferable to form the first electrode 102 by a material having a high work function (work function of 4.0 eV or more) in a case of using the first electrode as an anode.

It is to be noted that, in the light emitting element of the present invention, the material for the first electrode 102 is not limited to a material having a high work function, and a material having a low work function can be used.

The first layer 103 is a layer including a composite material described in Embodiment Mode 1.

The second layer 104 is a layer made of a substance having a high hole transporting property, for example, an aromatic amine-based compound (in other words, a compound having a bond of benzene ring-nitrogen) such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4"-tris(N,N-diphenylamino)triphenylamine (abbreviation: TDATA), or 4,4',4"-tris[N-(3-methylphenyl)-N-phenylamino]triphenylamine (abbreviation: MTDATA). The substances described here are mainly substances having hole mobility of $10^{-6}$ cm$^2$/Vs or more. However, a substance except these may be used as long as the substance has a higher hole transporting property than an electron transporting property. It is to be noted that the second layer 104 may be not only a single layer but also has a structure in which two or more layers made of the above-described substance are stacked.

The third layer 105 is a layer including a substance having a high light emitting property. For example, the third layer 105 is formed by freely combining a substance having a high light emitting property such as N,N'-dimethylquinacridone (abbreviation: DMQd) or 3-(2-benzothiazoyl)-7-diethylaminocoumarin (abbreviation: coumarin 6) and a substance having a high carrier transporting property and favorable film quality (namely, a substance which is not easily crystallized) such as tris(8-quinolinolato)aluminum (abbreviation: Alq) or 9,10-di(2-naphthyl)anthracene (abbreviation: DNA). However, the third layer 105 may have a structure using each of these substances independently because Alq and DNA are substances also having a high light emitting property.

The fourth layer 106 is a layer made of a substance having a high electron transporting property, for example, a metal complex or the like having a quinoline skeleton or a benzoquinoline skeleton such as tris(8-quinolinolato)aluminum (abbreviation: Alq), tris(5-methyl-8-quinolinolato)aluminum (abbreviation: Almq3), bis(10-hydroxybenzo[h]-quinolinato)beryllium (abbreviation: BeBq2), or bis(2-methyl-8-quinolinolato)-4-phenylphenolato-aluminum (abbreviation: BAlq). In addition to this, a metal complex or the like having an oxazole-based or thiazole-based ligand such as bis[2-(2-hydroxyphenyl)benzoxazolato]zinc (abbreviation: Zn(BOX)$_2$) or bis[2-(2-hydroxyphenyl)-benzothiazolato]zinc (abbreviation: Zn(BTZ)$_2$) can also be used. Further, other than a metal complex, 2-(4-biphenylyl)-5-(4-tert-buthylphenyl)-1,3,4-oxadiazole (abbreviation: PBD), 1,3-bis[5-(p-tert-butylphenyl)-1,3,4-oxadiazol-2-yl]benzene (abbreviation: OXD-7), 2,2',2"-(1,3,5-benzenetriyl)tris(1-phenyl-1-1H-benzimidazole) (abbreviation: TPBi), 3-(4-tert-buthylphenyl)-4-phenyl-5-(4-biphenylyl)-1,2,4-triazole (abbreviation: TAZ), 3-(4-tert-buthylphenyl)-4-(4-ethylphenyl)-5-(4-biphenylyl)-1,2,4-triazole (abbreviation: p-EtTAZ), bathophenanthroline (abbreviation: BPhen), bathocuproin (abbreviation: BCP), or the like can also be used. The substances described here are mainly substances having electron mobility of $10^{-6}$ cm$^2$/Vs or more. In addition, the substance except the above may be used as the fourth layer 106 as long as the substance has a higher electron transporting property than a hole transporting property. Further, the fourth layer 106 may not only be a single layer but also has a structure in which two or more layers made of the above-described substances are stacked.

As a substance for forming the second electrode 107, metal, alloy, a compound having an electrical conduction property, a mixture of these, and the like having a low work function (work function of 3.8 eV or less) can be used. As a specific example of such a cathode material, an element belonging to Group 1 or Group 2 in the periodic table, namely alkali metal such as lithium (Li) or cesium (Cs); alkaline earth metal such as magnesium (Mg), calcium (Ca), or strontium (Sr); and alloy including these (Mg:Ag, Al:Li) are given. However, by providing a layer having a function of assisting electron injection between the second electrode 107 and the fourth layer 106, various conductive materials such as Al, Ag, ITO, or ITO including silicon can be used as the second electrode 107 regardless of whether a work function is high or low.

As the layer having a function of assisting electron injection, a compound of alkali metal or alkaline earth metal such as lithium fluoride (LiF), cesium fluoride (CsF), or calcium fluoride (CaF2) can be used. In addition to this, an object in which alkali metal or alkaline earth metal is included in a layer made of a substance having an electron transporting property, for example, an object in which magnesium (Mg) is included in Alq, or the like can be used.

Further, as a method for forming the first layer 103, the second layer 104, the third layer 105, and the fourth layer 106, various methods such as an evaporation method, an ink-jet method, or a spin-coating method can be used. In addition, a different film formation method may be used to form each electrode or each layer.

According to the light emitting element of the present invention having the above-described structure, current flows by a potential difference generated between the first electrode 102 and the second electrode 107, and holes and electrons are recombined in the third layer 105, which is a layer including a substance having a high light emitting property, to emit light. In other words, the light emitting element of the present invention has a structure in which a light emitting region is formed in the third layer 105. However, the entire of the third layer 105 is not necessary to serve as the light emitting region, and for example, a light emitting region may be formed only on a second layer 104 side or a fourth layer side of the third layer 105.

Figure 1B:
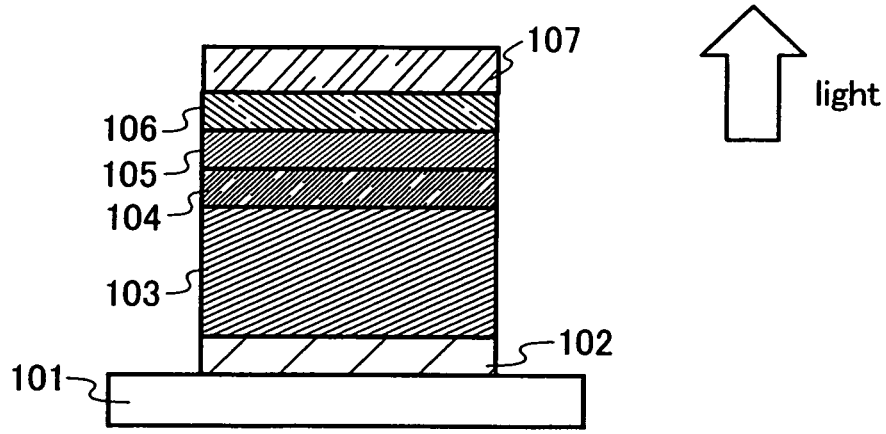
Figure 1C:
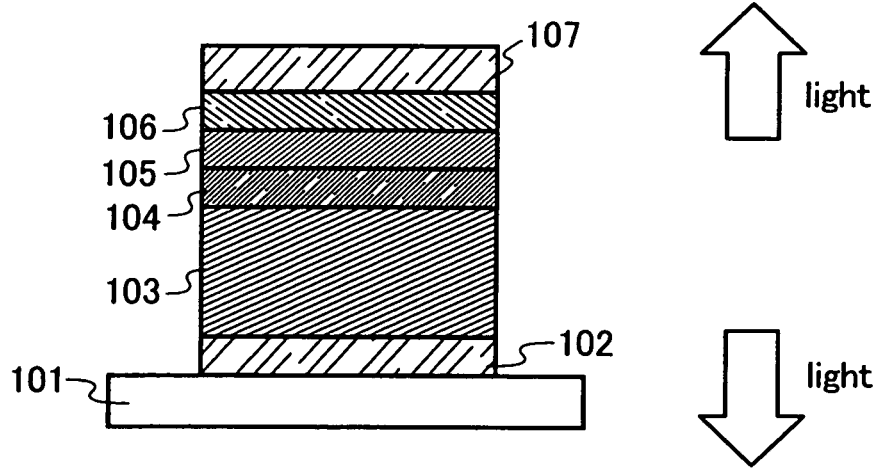

Light emission is extracted outside through one or both of the first electrode 102 and the second electrode 107. Therefore, one or both of the first electrode 102 and the second electrode 107 is/are made of a substance having a light transmitting property. In a case where only the first electrode 102 is made of a substance having a light transmitting property, as shown in FIG. 1A, light emission is extracted from a substrate side through the first electrode 102. Alternatively, in a case where only the second electrode 107 is made of a substance having a light transmitting property, as shown in FIG. 1B, light emission is extracted from the side opposite to the substrate through the second electrode 107. Further alternatively, in a case where each of the first electrode 102 and the second electrode 107 is made of a substance having a light transmitting property, as shown in FIG. 1C, light emission is extracted from both of the substrate side and the side opposite to the substrate through the first electrode 102 and the second electrode 107.

A structure of a layer provided between the first electrode 102 and the second electrode 107 is not limited to the above-described structure. A structure except the above-described structure may be used as long as the structure has a region in which holes and electrons are recombined in a site separated from the first electrode 102 and the second electrode 107 so that quenching generated by close contact between the light emitting region and the metal is reduced, and has a layer including the composite material described in Embodiment Mode 1.

In other words, a stacked structure of the layer is not limited in particular, and a layer made of a substance having a high electron transporting property, a substance having a high hole transporting property, a substance having a high electron injecting property, a substance having a high hole injecting property, a bipolar substance (substance having a high electron transporting property and high hole transporting property), or the like may be freely combined with a layer including the composite material of the present invention. In addition, a structure may be employed, in which a recombination region of carriers is controlled by providing a layer including a silicon oxide film or the like over the first electrode 102.

Figure 2:
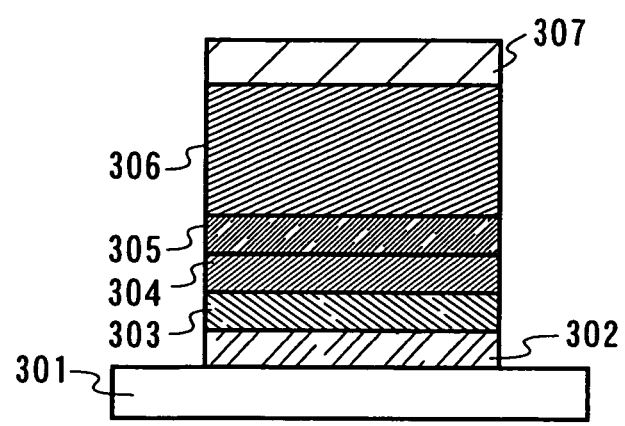
FIG. 2 is an explanatory view of a light emitting element of the present invention.

A light emitting element shown in FIG. 2 has a structure in which a first layer 303 made of a substance having a high electron transporting property, a second layer 304 including a substance having a high light transmitting property, a third layer 305 made of a substance having a high hole transporting property, a fourth layer 306 which is a layer including the composite material of the present invention, and a second electrode 307 serving as an anode are sequentially stacked over a first electrode 302 serving as a cathode. Reference numeral 301 denotes a substrate.

In this embodiment mode, a light emitting element is manufactured over a substrate made of glass, plastic, or the like. By manufacturing a plurality of light emitting elements described above over one substrate, a passive light emitting device can be manufactured. In addition, a light emitting element may be manufactured, for example, over a thin film transistor (TFT) array substrate other than the substrate made of glass, plastic, or the like. According to this, an active matrix light emitting device can be manufactured, in which driving of the light emitting element is controlled by a TFT. A structure of the TFT is not limited in particular, and may be a staggered TFT or an inverted staggered TFT. In addition, a circuit for driving formed over the TFT array substrate may be formed by an N-type TFT and a P-type TFT, or may be formed by any one of an N-type TFT and a P-type TFT. In addition, crystallinity of a semiconductor used for the TFT is also not limited in particular, and an amorphous semiconductor may be used, or a crystalline semiconductor may be used.

The light emitting element of the present invention has a layer including a composite material described in Embodiment Mode 1, namely a composite material including metal oxide and an organic compound having an oxidation peak potential with respect to an Ag/Ag$^+$ electrode in dimethylformamide (DMF) at room temperature within the range of 0 V or more and 1.5 V or less (vs. Ag/Ag$^+$), preferably 0.2 V or more and 1.1 V or less (vs. Ag/Ag$^+$); a composite material including metal oxide and an organic compound having an oxidation peak potential with respect to an oxidation-reduction potential of ferrocene in dimethylformamide (DMF) at room temperature within the range of 0 V or more and 1.5 V or less (vs. Fc/Fc$^+$), preferably 0.1 V or more and 1.0 V or less (vs. Fc/Fc$^+$); or a composite material including metal oxide and an organic compound having ionization potential in dimethylformamide (DMF) solution at room temperature in the range of 4.8 eV or more and 6.4 eV or less, preferably 5.0 eV or more and 6.0 eV or less. The composite material of the present invention has high conductivity because carriers are generated intrinsically; therefore, low voltage driving of a light emitting element can be realized.

In addition, by thickening the layer including the composite material, improvement of color purity by an optical design can be realized without increasing a drive voltage.

Further, by thickening the layer including the composite material, short-circuit due to dust, impact, or the like can be prevented, and accordingly, a light emitting element with high reliability can be obtained. For example, a thickness between electrodes of a light emitting element using the layer including the composite material can be 100 nm to 500 nm, preferably 200 nm to 500 nm, whereas a thickness between electrodes of a general light emitting element is 100 nm to 150 nm.

Furthermore, the layer including the composite material used for the light emitting element of the present invention can form an ohmic contact with the electrode, and has low contact resistance with the electrode. Therefore, an electrode material can be selected without any consideration of a work function or the like. In other words, choices for an electrode material can be increased.

Embodiment Mode 3

In this embodiment mode, a light emitting element having a different structure from a structure described in Embodiment Mode 2 will be explained with reference to FIGS. 5A to 5C and FIGS. 6A to 6C. In the structure described in this embodiment mode, a layer including a composite material of the present invention can be provided so as to be in contact with an electrode serving as a cathode.

Figure 5A:
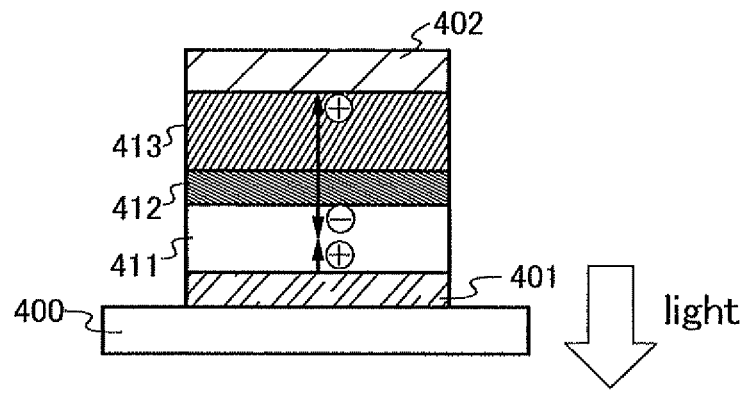
FIGS. 5A to 5C are explanatory views of a light emitting element of the present invention.

FIG. 5A shows an example of a structure of a light emitting element of the present invention. The light emitting element has a structure in which a first layer 411, a second layer 412, and a third layer 413 are stacked between a first electrode 401 and a second electrode 402. In this embodiment mode, a case where the first electrode 401 serves as an anode and the second electrode 402 serves as a cathode will be explained.

A structure which is the same as Embodiment Mode 2 can be applied to the first electrode 401 and the second electrode 402. The first layer 411 is a layer including a substance having a high light emitting property. The second layer 412 is a layer including a compound selected from electron donating substances and a compound having a high electron transporting property, and the third layer 413 is a layer including the composite material described in Embodiment Mode 1. As the electron donating substance included in the second layer 412, alkali metal, alkaline earth metal, or oxide or salt of these is preferable. Specifically, lithium, cesium, calcium, lithium oxide, calcium oxide, barium oxide, cesium carbonate, and the like are given.

With such a structure, as shown in FIG. 5A, electrons are given and received in the vicinity of an interface between the second layer 412 and the third layer 413 by applying voltage, thereby generating electrons and holes. The second layer 412 transports the electrons to the first layer 411 while the third layer 413 transports the holes to the second electrode 402. In other words, the second layer 412 and the third layer 413 collectively serve as a carrier generation layer. Further, it can be said that the third layer 413 has a function of transporting holes to the second electrode 402.

The third layer 413 shows an extremely high hole injecting property and hole transporting property. Therefore, a drive voltage can be reduced. In a case of increasing the thickness of the third layer 413, increase in a drive voltage can be suppressed.

In addition, even when the third layer 413 is thickened, increase in a drive voltage can be suppressed. Therefore, the thickness of third layer 413 can be freely set, and extraction efficiency of light emission from the first layer 411 can be improved. Further, the thickness of the third layer 413 can be set so that color purity of light emission from the first layer 411 is improved.

When FIG. 5A is taken as an example, damage to the first layer 411 including a light emitting substance can be reduced in a case or the like of forming the second electrode 402 by a sputtering method.

It is to be noted that the light emitting element of this embodiment mode also has different variations by changing materials for the first electrode 401 and the second electrode 402. Schematic views thereof are shown in FIGS. 5B, 5C, and FIGS. 6A to 6C. It is to be noted that reference numerals in FIG. 5A are also used in FIGS. 5B, 5C, and FIGS. 6A to 6C, and reference numeral 400 denotes a substrate for supporting the light emitting element of the present invention.

Figure 5B:
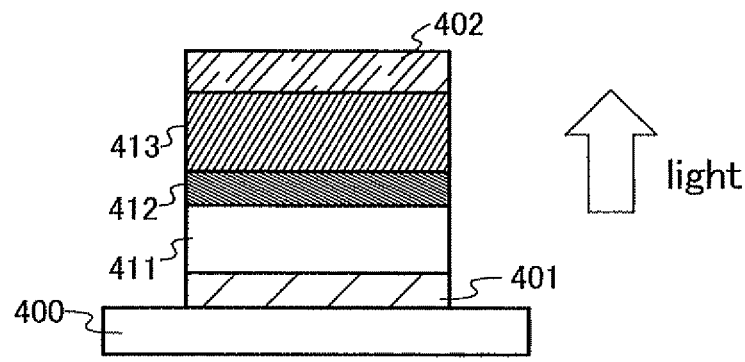
Figure 5C:
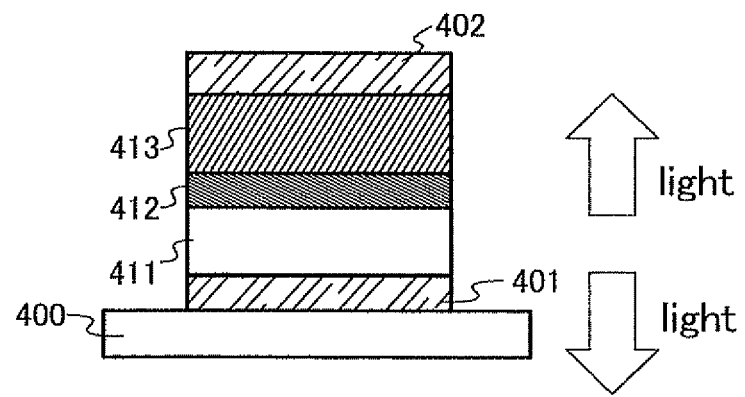

FIGS. 5A to 5C show examples of a case where the first layer 411, the second layer 412, and the third layer 413 are sequentially stacked from a substrate 400 side. At this time, when the first electrode 401 has a light transmitting property and the second electrode 402 has a light shielding property (in particular, reflectivity), light is emitted from the substrate 400 side as shown in FIG. 5A. When the first electrode 401 has a light shielding property (in particular, reflectivity) and the second electrode 402 has a light transmitting property, light is emitted from the side opposite to the substrate 400 as shown in FIG. 5B. Further, when each of the first electrode 401 and the second electrode 402 has a light transmitting property, a structure can be used, in which light is emitted from both of the substrate 400 side and the side opposite to the substrate 400 as shown in FIG. 5C.

Figure 6A:
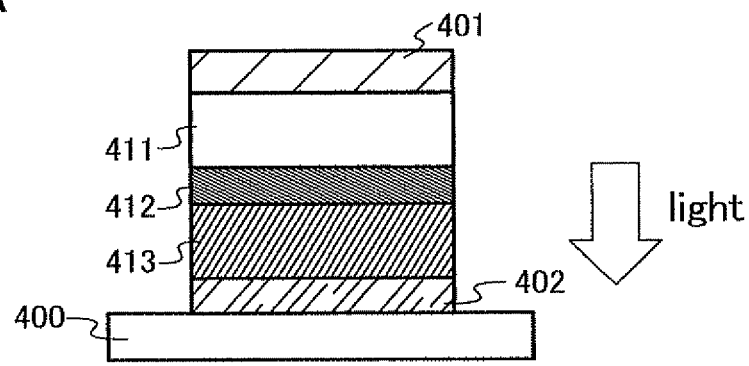
FIGS. 6A to 6C are explanatory views of a light emitting element of the present invention.
Figure 6B:
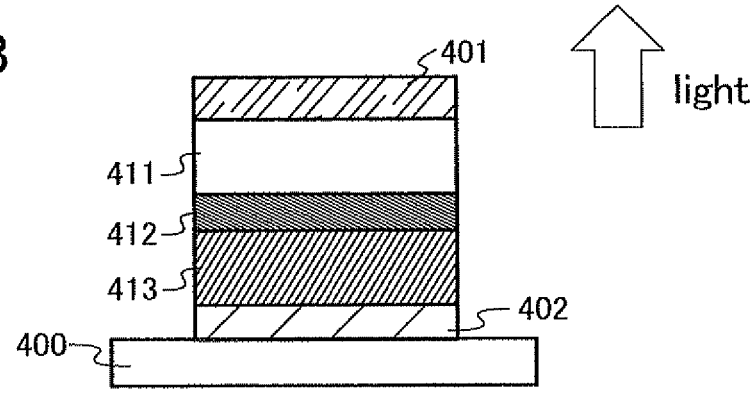
Figure 6C:
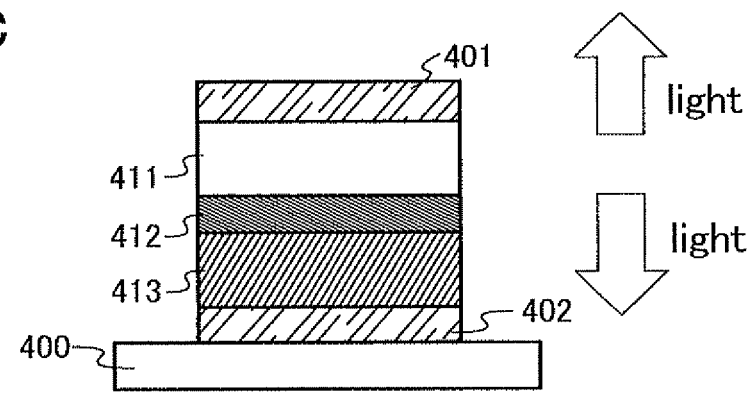

FIGS. 6A to 6C show examples of a case where the third layer 413, the second layer 412, and the first layer 411 are sequentially stacked from a substrate 400 side. At this time, when the first electrode 401 has a light shielding property (in particular, reflectivity) and the second electrode 402 has a light transmitting property, light is extracted from the substrate 400 side as shown in FIG. 6A. When the first electrode 401 has a light transmitting property and the second electrode 402 has a light shielding property (in particular, reflectivity), light is extracted from the side opposite to the substrate 400 as shown in FIG. 6B. Further, when both of the first electrode 401 and the second electrode 402 have a light transmitting property, a structure can be used, in which light is emitted from both of the substrate 400 side and the side opposite to the substrate 400 as shown in FIG. 6C.

In a case of manufacturing the light emitting element in this embodiment mode, various methods can be used regardless of a wet method or a dry method.

As shown in FIGS. 5A to 5C, the first layer 411, the second layer 412, and the third layer 413 may be sequentially stacked after forming the first electrode 401, and then, the second electrode 402 may be formed. Alternatively, as shown in FIGS. 6A to 6C, the third layer 413, the second layer 412, and the first layer 411 may be sequentially stacked after forming the second electrode 402, and then, the first electrode 401 may be formed.

It is to be noted that this embodiment mode can be appropriately combined with another embodiment mode.

Embodiment Mode 4

In this embodiment mode, a light emitting element having a structure different from those described in Embodiment Modes 2 and 3 will be explained with reference to FIGS. 3A to 3C and FIGS. 4A to 4C. In a structure to be described in this embodiment mode, layers each having the composite material of the present invention can be provided to be in contact with two electrodes of the light emitting element, respectively.

Figure 3A:
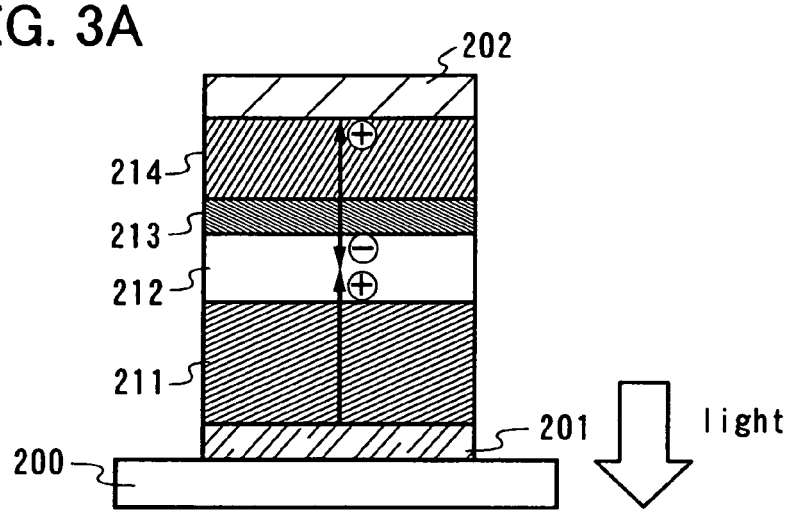
FIGS. 3A to 3C are explanatory views of a light emitting element of the present invention.

An example of a structure of a light emitting element of the present invention is shown in FIG. 3A. In the structure, a first layer 211, a second layer 212, a third layer 213, and a fourth layer 214 are stacked between a first electrode 201 and a second electrode 202. In this embodiment mode, a case where the first electrode 201 serves as an anode and the second electrode 202 serves as a cathode will be explained.

The first electrode 201 and the second electrode 202 can employ the same structure as that described in Embodiment Mode 2. The first layer 211 is a layer including the composite material described in Embodiment Mode 1, and the second layer 212 is a layer including a material having a high light emitting property. The third layer 213 is a layer including both an electron donating substance and a compound having a high electron transporting property, and the fourth layer 214 is a layer including the composite material described in Embodiment Mode 1. The electron donating substance included in the third layer 213 is preferably an alkali metal or an alkaline earth metal, or oxide or salt thereof. Specifically, lithium, cesium, calcium, lithium oxide, calcium oxide, barium oxide, cesium carbonate, or the like is given.

With such a structure described above, as shown in FIG. 3A, electrons are given and received in the vicinity of an interface between the third layer 213 and the fourth layer 214 by applying voltage, thereby generating electrons and holes. The third layer 213 transports the electrons to the second layer 212 while the fourth layer 214 transports the holes to the second electrode 202. In other words, the third layer 213 and the fourth layer 214 collectively serve as a carrier generation layer. Further, it can be said that the fourth layer 214 has a function of transporting holes to the second electrode 202. It is to be noted that a tandem light emitting element can also be formed by additionally stacking the second layer and the third layer between the fourth layer 214 and the second electrode 202.

In addition, the first layer 211 and the fourth layer 214 exhibit an extremely high hole injection property and hole transporting property. Therefore, a drive voltage of the light emitting element can be reduced. In addition, when the first layer 211 and the fourth layer 214 are thickened, increase in a drive voltage can be suppressed.

In addition, even when the first layer 211 and the fourth layer 214 are thickened, increase in a drive voltage can be suppressed. Thus, the thicknesses of the first layer 211 and the fourth layer 214 can be freely set, and extraction efficiency of light emission from the second layer 212 can be improved. In addition, the thicknesses of the first layer 211 and the fourth layer 214 can be set so that color purity of light emission from the second layer 212 is improved.

Further, in the light emitting element of this embodiment mode, a layer between the anode and the second layer having a function of emitting light and a layer between the cathode and the second layer having a function of emitting light can be made extremely thick, and further, a short-circuit of the light emitting element can be prevented effectively. When FIG. 3A is taken as an example, damage to the second layer 212 including a light emitting substance can be reduced in a case or the like of forming the second electrode 202 by a sputtering method. Further, by forming the first layer 211 and the fourth layer 214 by the same material, a layer constituted by the same material can be provided on either side of a layer having a function of emitting light so as to interpose the layer having a function of emitting light therebetween. Accordingly, an effect of suppressing stress distortion can also be expected.

It is to be noted that the light emitting element in this embodiment mode also has different variations by changing materials for the first electrode 201 and the second electrode 202. Schematic diagrams thereof are shown in FIGS. 3B, 3C, and FIGS. 4A to 4C. It is to be noted that reference numerals in FIG. 3A are also used in FIGS. 3B, 3C, and FIGS. 4A to 4C, and reference numeral 200 denotes a substrate for supporting the light emitting element of the present invention.

Figure 3B:
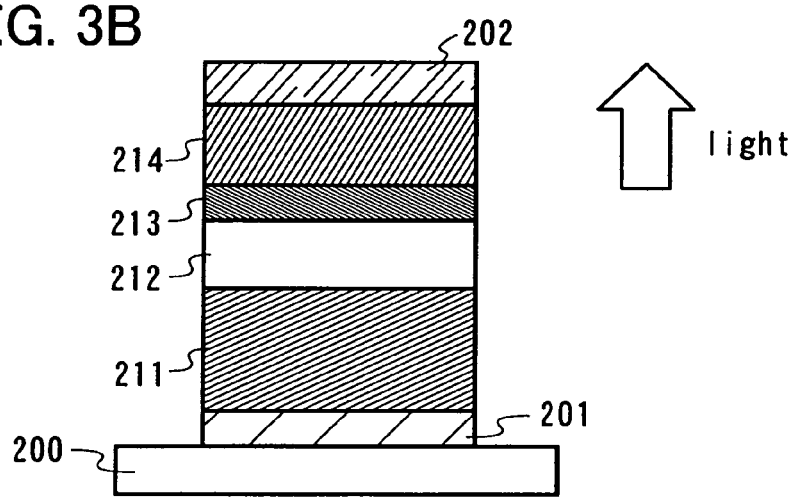
Figure 3C:
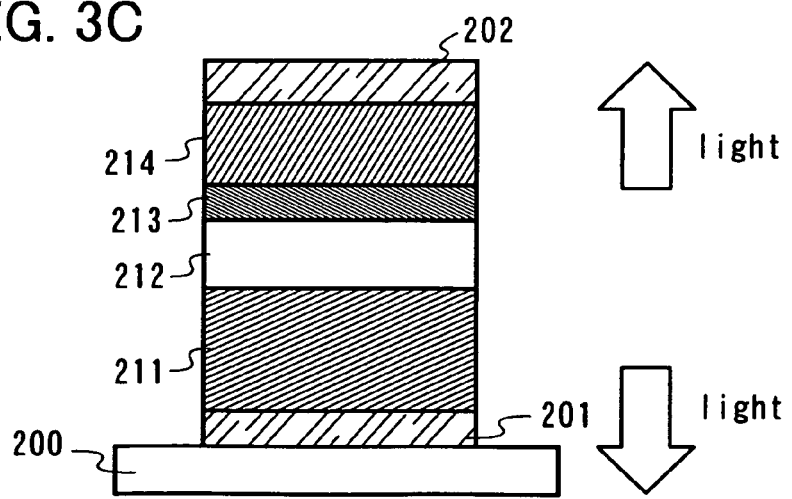

FIGS. 3A to 3C show examples of a case where the first layer 211, the second layer 212, the third layer 213, and the fourth layer 214 are sequentially stacked from a substrate 200 side. In these examples, when the first electrode 201 has a light transmitting property and the second electrode 202 has a light shielding property (in particular, reflectivity), light is emitted from the substrate 200 side as shown in FIG. 3A. When the first electrode 201 has a light shielding property (in particular, reflectivity) and the second electrode 202 has a light transmitting property, light is emitted from the side opposite to the substrate 200 as shown in FIG. 3B. Further, when both the first electrode 201 and the second electrode 202 have light transmitting properties, light can be extracted from both the substrate 200 side and the side opposite to the substrate 200 as shown in FIG. 3C.

Figure 4A:
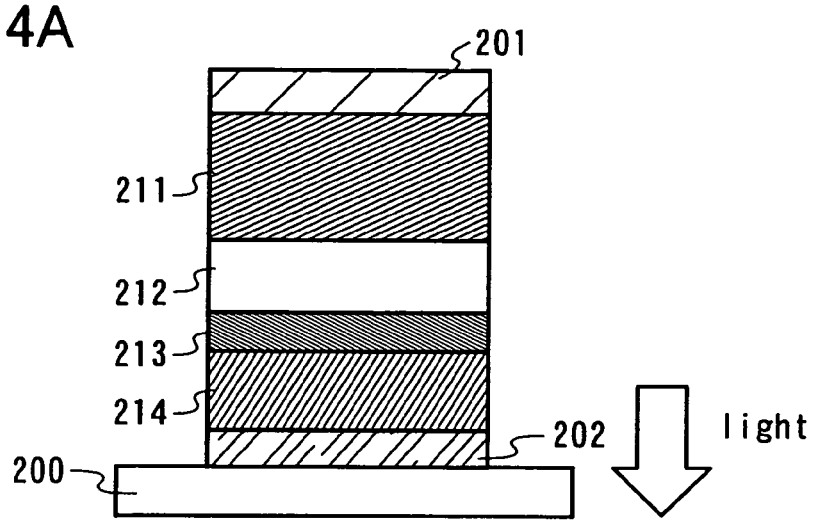
FIGS. 4A to 4C are explanatory views of a light emitting element of the present invention.
Figure 4B:
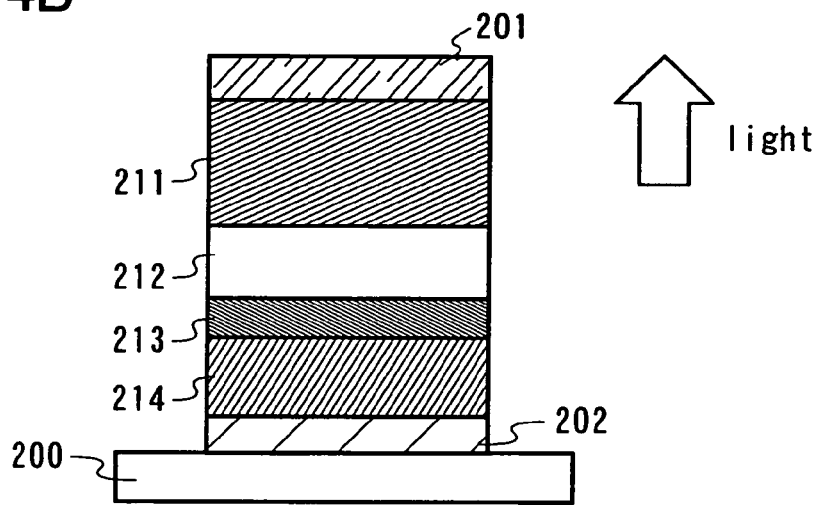
Figure 4C:
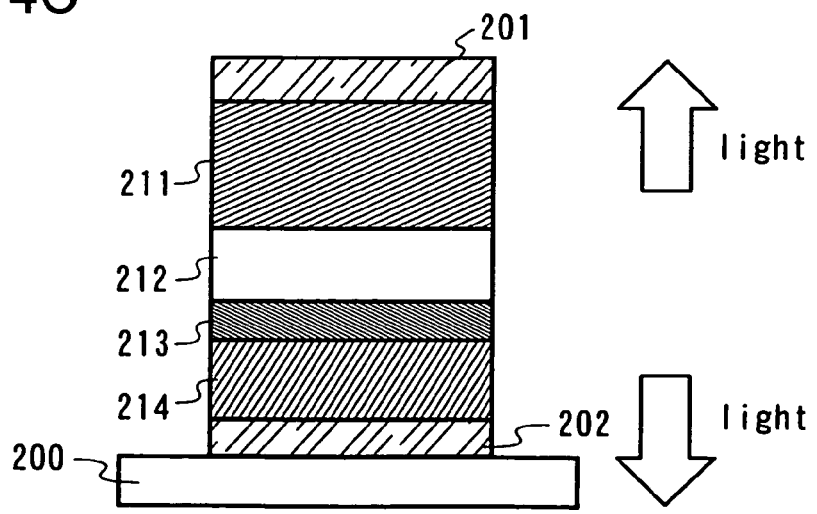

FIGS. 4A to 4C show examples of a case where the fourth layer 214, the third layer 213, the second layer 212, and the first layer 211 are sequentially stacked from a substrate 200 side. In these examples, when the first electrode 201 has a light shielding property (in particular, reflectivity) and the second electrode 202 has a light transmitting property, light is extracted from the substrate 200 side as shown in FIG. 4A. In addition, when the first electrode 201 has a light transmitting property and the second electrode 202 has a light shielding property (in particular, reflectivity), light is extracted from the side opposite to the substrate 200 as shown in FIG. 4B. Further, when each of the first electrode 201 and the second electrode 202 has a light transmitting property, a structure can be employed, in which light is emitted from both of the substrate 200 side and the side opposite to the substrate 200 as shown in FIG. 4C.

It is to be noted that a structure can also be used, in which the first layer 211 includes one compound selected from electron donating substances and a compound having a high electron transporting property; the second layer 212 includes a light emitting substance; the third layer 213 is a layer including the composite material described in Embodiment Mode 1; and the fourth layer 214 includes both one compound selected from electron donating substances and a compound having a high electron transporting property.

In a case of manufacturing the light emitting element in this embodiment mode, various methods can be used regardless of a wet method or a dry method.

As shown in FIGS. 3A to 3C, the first layer 211, the second layer 212, the third layer 213, and the fourth layer 214 may be sequentially stacked after forming the first electrode 201, and then, the second electrode 202 may be formed. Alternatively, as shown in FIGS. 4A to 4C, the fourth layer 214, the third layer 213, the second layer 212, and the first layer 211 may be sequentially stacked after forming the second electrode 202, and then, the first electrode may be formed.

It is to be noted that this embodiment mode can be appropriately combined with another embodiment mode.

Embodiment Mode 5

In this embodiment mode, a light emitting element having a structure different from those described in Embodiment Modes 2 to 4 will be explained. A structure described in this embodiment mode is a structure in which the composite material of the present invention is applied to a charge generation layer of a light emitting element having a structure in which a plurality of light emitting units is stacked.

Figure 66:
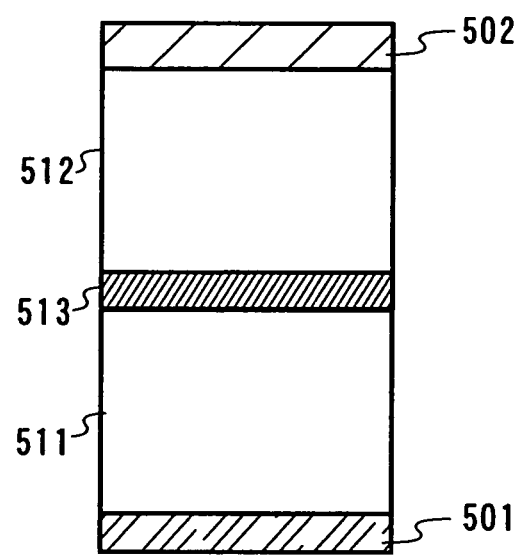
FIG. 66 is an explanatory view of a light emitting element of the present invention.

In this embodiment mode, a light emitting element having a structure in which a plurality of light emitting units are stacked (hereinafter referred to as a tandem element) will be explained. In other words, the tandem element is a light emitting element having a plurality of light emitting units between a first electrode and a second electrode. FIG. 66 shows a tandem element in which two light emitting units are stacked.

In FIG. 66, a first light emitting unit 511 and a second light emitting unit 512 are stacked between a first electrode 501 and a second electrode 502. A charge generation layer 513 is formed between the first light emitting unit 511 and the second light emitting unit 512.

Various materials can be used for the first electrode 501 and the second electrode 502.

The first light emitting unit 511 and the second light emitting unit 512 can each have various structures.

The charge generation layer 513 includes the composite material of the present invention described in Embodiment Mode 1. Since the composite material of the present invention is superior in a carrier injection property and a carrier transporting property, low voltage driving and low current driving can be realized.

It is to be noted that the charge generation layer 513 may be formed with a combination of the composite material of the present invention and other materials. For example, as described in Embodiment Mode 3, the charge generation layer 513 may be formed with a combination of a layer made of the composite material of the present invention and a layer including one compound selected from electron donating substances and a compound having a high electron transporting property. Further, the charge generation layer 513 may be formed with a combination of a layer made of the composite material of the present invention and a transparent conductive film.

The light emitting element having two light emitting units is explained in this embodiment mode; however, the material of the present invention can be similarly applied to a light emitting element in which three or more light emitting units are stacked. For example, in a light emitting element in which three light emitting units are stacked, a first light emitting unit, a first charge generation layer, a second light emitting unit, a second charge generation layer, and a third light emitting unit are sequentially stacked. The composite material of the present invention may be included only in either of the charge generation layers or in all of the charge generation layers.

It is to be noted that this embodiment mode can be appropriately combined with another embodiment mode.

Embodiment Mode 6

In this embodiment mode, an optical design of a light emitting element will be explained.

In each of the light emitting elements described in Embodiment Modes 2 to 5, light extraction efficiency of each emission color can be improved by differentiating a thickness of at least one of the layers except the first electrode and the second electrode among light emitting elements which emit each emission color.

Figure 10:
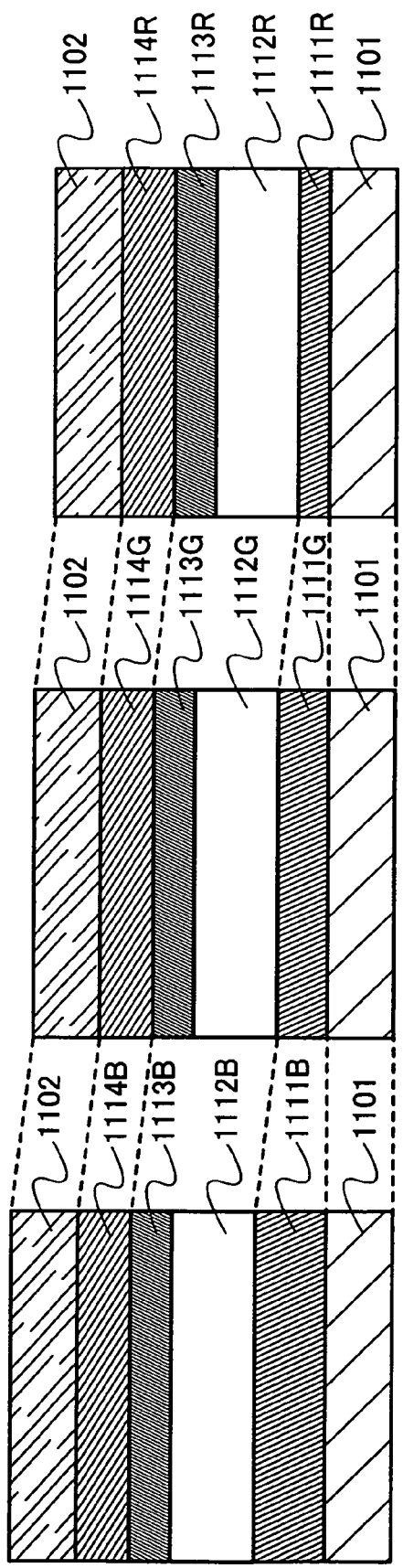
FIG. 10 is an explanatory view of a light emitting element of the present invention.

For example, as shown in FIG. 10, light emitting elements which individually emit light of reddish color (R), greenish color (G), and bluish color (B) share a first electrode 1101 that is a reflective electrode and a second electrode 1102 having a light transmitting property, and have first layers 1111R, 1111G and 1111B, second layers 1112R, 1112G, and 1112B, third layers 1113R, 1113G and 1113B, and fourth layers 1114R, 1114G, and 1114B, respectively. Then, thicknesses of the first layers 1111R, 1111G, and 1111B can be differentiated for each emission color.

It is to be noted that, in each of the light emitting elements shown in FIG. 10, when a voltage is applied so that a potential of the first electrode 1101 becomes higher than that of the second electrode 1102, holes are injected from the first layer 1111 to the second layer 1112. Electrons are given and received in the vicinity of an interface between the third layer 1113 and the fourth layer 1114, thereby generating electrons and holes. Further, the third layer 1113 transports the electrons to the second layer 1112 while the fourth layer 1114 transports the holes to the second electrode 1102. The holes and the electrons are recombined in the second layer 1112 to put a light emitting substance into an excitation state. Then, the light emitting substance in the excitation state emits light when returning to a ground state.

As shown in FIG. 10, by differentiating thicknesses of the first layers 1111R, 1111G, and 111B for each emission color, decrease in light extraction efficiency can be prevented which is caused by a difference in light path between a case of recognizing light directly through the second electrode and a case of recognizing light reflected by the first electrode through the second electrode.

Specifically, when light enters the first electrode, phase reversal occurs in the reflected light, thereby producing a light interference effect. Consequently, in a case where an optical distance between a light emitting region and a reflective electrode (i.e., refractive index×distance) is the emission wavelength multiplied by $(2m-1)/4$ (m is an arbitrary positive integer), namely $1/4$, $3/4$, $5/4$ ... of the emission wavelength, the light external extraction efficiency is increased. In the meanwhile, in a case where the optical distance is the emission wavelength multiplied by $m/2$ (m is an arbitrary positive integer), namely $1/2$, $1$, $3/2$ ... of the emission wavelength, the light external extraction efficiency is decreased.

Therefore, among light emitting elements of each emission color, thicknesses of any of the first to fourth layers are differentiated so that the optical distance between the light emitting region and the reflective electrode (i.e., refractive index×distance) is the emission wavelength multiplied by $(2m-1)/4$ (m is an arbitrary positive integer).

In particular, in the first to fourth layers, thicknesses of the layer between the layer in which electrons and holes are recombined and the reflective electrode are preferably differentiated. Alternatively, thicknesses of the layer between the layer in which electrons and holes are recombined and the electrode having a light transmitting property may be differentiated. Further alternatively, thicknesses of both layers may be differentiated. Consequently, light can be extracted outside efficiently.

In order to differentiate thicknesses of any of the first to fourth layers, the layer needs to be thickened. One feature of the light emitting element of the present invention is that a layer including the composite material described in Embodiment Mode 1 is used for a layer to be thickened.

Generally, it is not preferable to thicken a layer of the light emitting element, because a drive voltage is increased. However, by using the composite material described in Embodiment Mode 1 for the layer to be thickened, a drive voltage itself can be reduced, which can suppress increase in a drive voltage due to thickening.

It is to be noted that FIG. 10 shows a case where an optical distance between the light emitting region and the reflective electrode of the light emitting element of reddish (R) is $1/4$ of an emission wavelength; an optical distance between the light emitting region and the reflective electrode of the light emitting element of greenish (G) is $3/4$ of the emission wavelength; and an optical distance between the light emitting region and the reflective electrode of the light emitting element of bluish (B) is $5/4$ of the emission wavelength. It is to be noted that the present invention is not limited to these values, and the value of m can be appropriately set. As shown in FIG. 10, values of m in $(2m-1)/4$ of the emission wavelength may be different among the light emitting elements of each emission color.

By thickening any of the first to fourth layers, a short circuit between the first and second electrodes can be prevented and productivity can be improved, which is extremely preferable.

As described above, thicknesses of at least the first to fourth layers in the light emitting element of the present invention can be differentiated for each emission color. At this time, thicknesses of the layers between the layer in which electrons and holes are recombined and the reflective electrode are preferably differentiated for each emission color. If a layer including the composite material described in Embodiment Mode 1 is used for the layer which needs to be thickened, a drive voltage is not increased, which is preferable.

It is to be noted that this embodiment is explained using the light emitting element having the structure described in Embodiment Mode 4, but it can be appropriately combined with another embodiment mode.

Embodiment Mode 7

In this embodiment mode, a light emitting device having a light emitting element of the present invention will be explained.

A light emitting device having a light emitting element of the present invention in a pixel portion will be explained in this embodiment mode with reference to FIGS. 7A and 7B. It is to be noted that FIG. 7A is a top view showing the light emitting device and FIG. 7B is a cross-sectional view of FIG. 7A taken along line A-A' and B-B'. Reference numeral 601 indicated by dashed line denotes a driver circuit portion (a source side driver circuit); 602, a pixel portion; and 603, a driver circuit portion (a gate side driver circuit). Reference numeral 604 denotes a sealing substrate; 605, a sealant; and a portion surrounded by the sealant 605 is a space 607.

It is to be noted that a lead wiring 608 is a wiring for transmitting a signal to be inputted to the source side driver circuit 601 and the gate side driver circuit 603 and receives a video signal, a clock signal, a start signal, a reset signal, or the like from an FPC (flexible printed circuit) 609 that is an external input terminal. It is to be noted that only the FPC is shown here; however, the FPC may be provided with a printed wiring board (PWB). The light emitting device in this specification includes not only a light emitting device itself but also a light emitting device with an FPC or a PWB attached.

Subsequently, a cross-sectional structure will be explained with reference to FIG. 7B. The driver circuit portion and the pixel portion are formed over an element substrate 610. Here, the source side driver circuit 601 which is the driver circuit portion and one pixel in the pixel portion 602 are shown.

It is to be noted that a CMOS circuit which is a combination of an n-channel TFT 623 and a p-channel TFT 624 is formed as the source side driver circuit 601. A TFT for forming the driver circuit may be formed using various circuits such as a CMOS circuit, a PMOS circuit, or an NMOS circuit. A driver integration type in which a driver circuit is formed over a substrate is described in this embodiment mode, but it is not necessarily required and a driver circuit can be formed outside a substrate, not over the substrate.

The pixel portion 602 has a plurality of pixels, each of which includes a switching TFT 611, a current control TFT 612, and a first electrode 613 which is electrically connected to a drain of the current control TFT 612. It is to be noted that an insulator 614 is formed to cover an edge portion of the first electrode 613. Here, a positive type photosensitive acrylic resin film is used.

The insulator 614 is formed to have a curved surface having curvature at an upper edge portion or a lower edge portion thereof in order to make the coverage favorable. For example, in a case of using positive type photosensitive acrylic as a material of the insulator 614, the insulator 614 is preferably formed to have a curved surface with a curvature radius (0.2 µm to 3 µm) only at an upper edge portion. Either a negative type which becomes insoluble in an etchant by light irradiation or a positive type which becomes soluble in an etchant by light irradiation can be used as the insulator 614.

A layer 616 including a light emitting substance and a second electrode 617 are formed over the first electrode 613. Here, a material having a high work function is preferably used as a material used for the first electrode 613 which serves as an anode. For example, the first electrode 613 can be formed by using a stacked layer of a titanium nitride film and a film including aluminum as its main component; a three-layer structure of a titanium nitride film, a film including aluminum as its main component, and another titanium nitride film; or the like as well as a single-layer film such as an ITO film, an indium tin oxide film including silicon, an indium oxide film including zinc oxide of 2 to 20 wt %, a titanium nitride film, a chromium film, a tungsten film, a Zn film, or a Pt film. When the first electrode 613 has a stacked structure, it can have low resistance as a wiring and form a favorable ohmic contact. Further, the first electrode 613 can function as an anode.

In addition, the layer 616 including a light emitting substance is formed by various methods such as an evaporation method using an evaporation mask, an ink-jet method, and a spin coating method. The layer 616 including a light emitting substance has a layer including the composite material described in Embodiment Mode 1. Further, another material included in the layer 616 including a light emitting material may be a low molecular-based material, an intermediate molecular material (including an oligomer and a dendrimer), or a high molecular-based material. In addition, as a material used for the layer including a light emitting substance, a single layer or a stacked layer of an organic compound is generally used. However, the present invention also includes a structure in which an inorganic compound is used for part of a film made of the organic compound.

As a material used for the second electrode 617 which is formed over the layer 616 including a light emitting substance and serves as a cathode, a material having a low work function (Al, Ag, Li, Ca, an alloy or a compound thereof such as MgAg, MgIn, AlLi, CaF2, LiF, or calcium nitride) is preferably used. In a case where light generated in the layer 616 including a light emitting substance is transmitted through the second electrode 617, a stacked layer of a metal thin film with a thin thickness and a transparent conductive film (of ITO, indium oxide including 2 to 20 wt % of zinc oxide, indium tin oxide including silicon, zinc oxide (ZnO), or the like) is preferably used as the second electrode 617.

By attaching the sealing substrate 604 to the element substrate 610 with the sealant 605, a light emitting element 618 is provided in the space 607 surrounded by the element substrate 610, the sealing substrate 604, and the sealant 605. It is to be noted that the space 607 is filled with a filler, but there is also a case where the space 607 is filled with the sealant 605 as well as a case where the space 607 is filled with an inert gas (nitrogen, argon, or the like).

It is to be noted that an epoxy-based resin is preferably used as the sealant 605. The material desirably allows as little moisture and oxygen as possible to penetrate. As the sealing substrate 604, a plastic substrate made of FRP (Fiberglass-Reinforced Plastics), PVF (polyvinyl fluoride), Myler, polyester, acrylic, or the like can be used besides a glass substrate or a quartz substrate.

As described above, a light emitting device having a light emitting element of the present invention can be obtained.

Since the light emitting device of the present invention has a layer including the composite material described in Embodiment Mode 1, a drive voltage can be reduced and power consumption can be reduced.

In addition, the light emitting device of the present invention can suppress increase in a drive voltage even when the layer including the composite material is thickened. Therefore, a short circuit of the light emitting element can be prevented by thickening the layer including the composite material. In addition, improvement in external extraction efficiency of light can be achieved by optical design. Therefore, a reliable light emitting device with low power consumption can be obtained.

Figure 8:
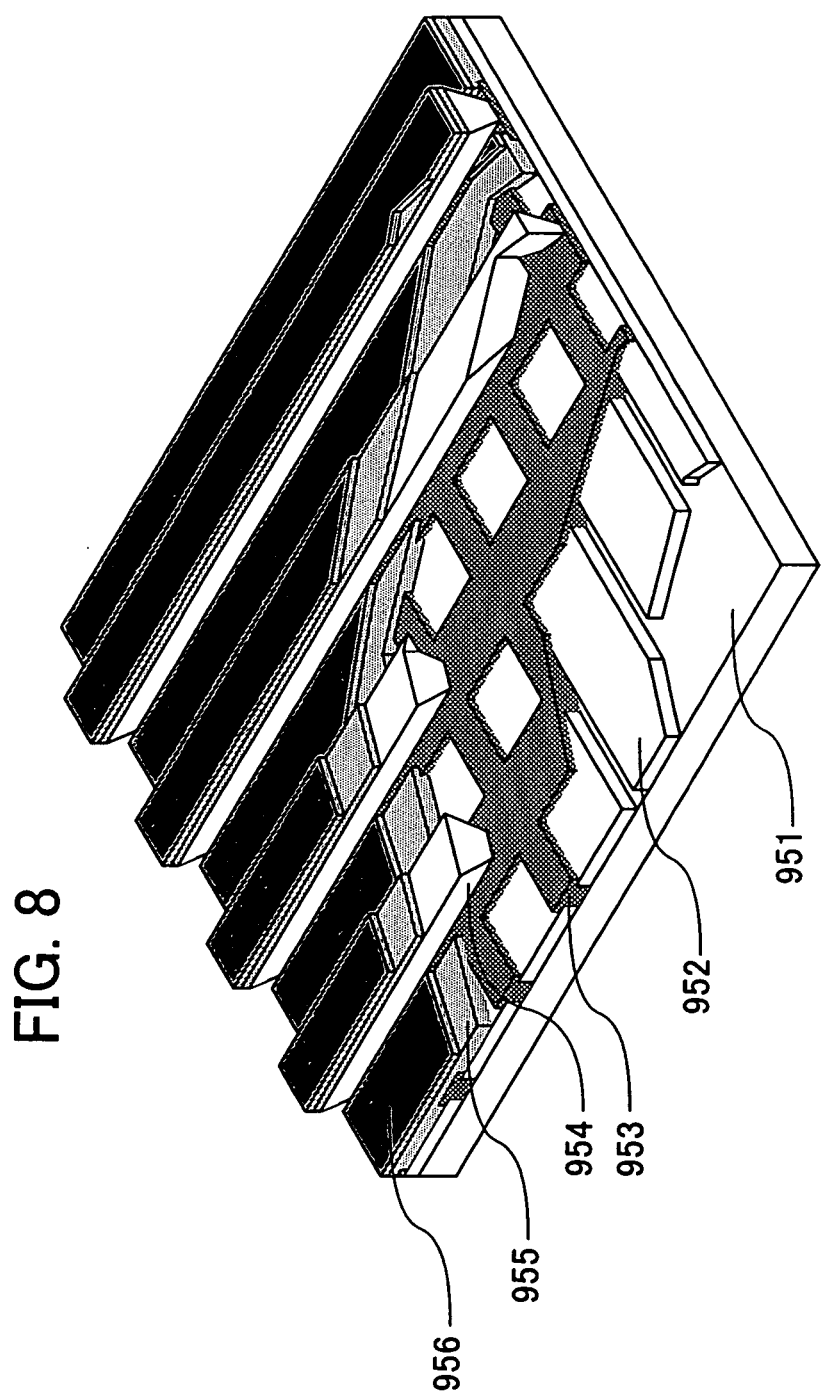
FIG. 8 is an explanatory view of a light emitting device of the present invention.

As described above, an active light emitting device in which driving of a light emitting element is controlled by a transistor is explained in this embodiment mode. However, a passive light emitting device in which the light emitting element is driven without particularly providing a driving element such as a transistor may also be employed. FIG. 8 shows a perspective view of a passive light emitting device which is manufactured by applying the present invention. In FIG. 8, a layer 955 including a light emitting substance is provided between an electrode 952 and an electrode 956 over a substrate 951. An edge portion of the electrode 952 is covered with an insulating layer 953. Then, a partition layer 954 is provided over the insulating layer 953. A side wall of the partition layer 954 slopes so that a distance between one side wall and the other side wall becomes narrow toward a substrate surface. In other words, a cross section of the partition layer 954 in the direction of a narrow side is trapezoidal, and a base (a side facing in the same direction as a plane direction of the insulating layer 953 and in contact with the insulating layer 953) is shorter than an upper side (a side facing in the same direction as the plane direction of the insulating layer 953 and not in contact with the insulating layer 953). By providing the partition layer 954 in this manner, a defect of the light emitting element due to static electricity or the like can be prevented. In addition, the passive light emitting device can also be driven with low power consumption when it includes the light emitting element of the present invention which operates at a low drive voltage.

Embodiment Mode 8

In this embodiment mode, an electronic device of the present invention including a light emitting device described in Embodiment Mode 7 in part thereof will be explained. The electronic device of the present invention includes a layer including a composite material described in Embodiment Mode 1 and has a display portion consuming low power. In addition, by thickening the layer including a composite material described in Embodiment Mode 1, an electronic device having a display portion with high reliability can also be provided, in which a short circuit thereof due to a fine foreign substance, impact from outside, or the like is suppressed.

As an electronic device manufactured using the light emitting device of the present invention, a video camera, a digital camera, a goggle type display, a navigation system, an audio reproducing device (car audio set, audio component set, or the like), a computer, a game machine, a portable information terminal (mobile computer, mobile phone, portable game machine, electronic book, or the like), and an image reproducing device provided with a recording medium (specifically, a device provided with a display device that can reproduce a recording medium and display the image such as a Digital Versatile Disc (DVD)), and the like are given. Specific examples of these electronic devices are shown in FIGS. 9A to 9D.

Figure 9A:
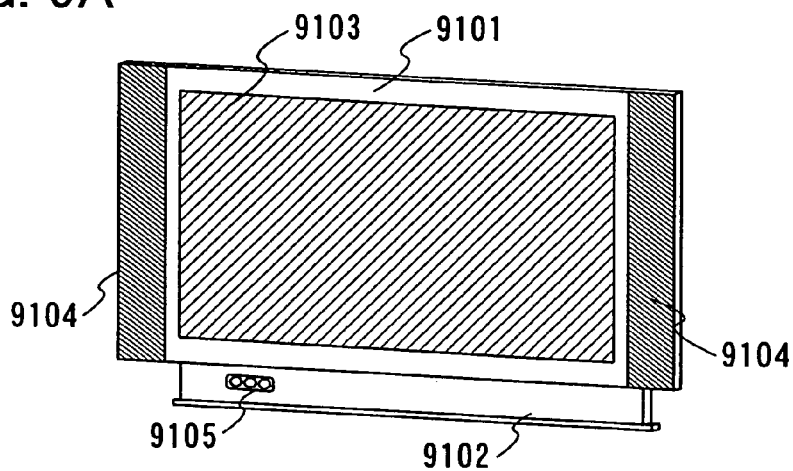
FIGS. 9A to 9D are explanatory views of electronic devices using a light emitting device of the present invention.

FIG. 9A shows a television device according to the present invention which includes a chassis 9101, a support 9102, a display portion 9103, a speaker portion 9104, a video input terminal 9105, and the like. In the television device, the display portion 9103 has light emitting elements, which are similar to those described in Embodiment Modes 2 to 6, arranged in matrix. One feature of the light emitting element is that luminous efficiency is high and a driving voltage is low. In addition, a short circuit thereof due to a fine foreign substance, impact from outside, or the like can be prevented. The display portion 9103 which includes the light emitting elements has a similar feature. Therefore, in the television device, image quality is hardly deteriorated and low power consumption is attained. With such a feature, a deterioration compensation function and the number of power source circuits can be significantly removed or reduced in the television device; therefore, a small size and lightweight of the chassis 9101 and the support 9102 can be attained. In the television device according to the present invention, low power consumption, high image quality, and a small size and lightweight are attained; therefore, a production which is suitable for living environment can be provided.

Figure 9B:
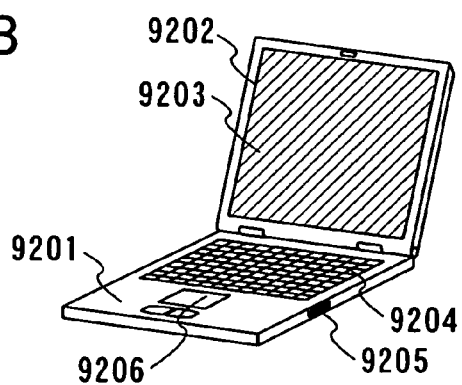

FIG. 9B shows a computer according to the present invention which includes a main body 9201, a chassis 9202, a display portion 9203, a keyboard 9204, an external connection port 9205, a pointing mouse 9206, and the like. In the computer, the display portion 9203 has light emitting elements, which are similar to those described in Embodiment Modes 2 to 6, arranged in matrix. Another feature of the light emitting element is that luminous efficiency is high and a driving voltage is low. In addition, a short circuit thereof due to a fine foreign substance, impact from outside, or the like can be prevented. The display portion 9203 which includes the light emitting elements has a similar feature. Therefore, in the computer, image quality is hardly deteriorated and lower power consumption is attained. With such a feature, a deterioration compensation function and the number of power source circuits can be significantly removed or reduced in the computer; therefore, a small size and lightweight of the main body 9201 and the chassis 9202 can be attained. In the computer according to the present invention, low power consumption, high image quality, and a small size and lightweight are attained; therefore, a production which is suitable for living environment can be provided. In addition, a portable computer with a display portion which can withstand impact from outside when being carried can be provided.

Figure 9C:
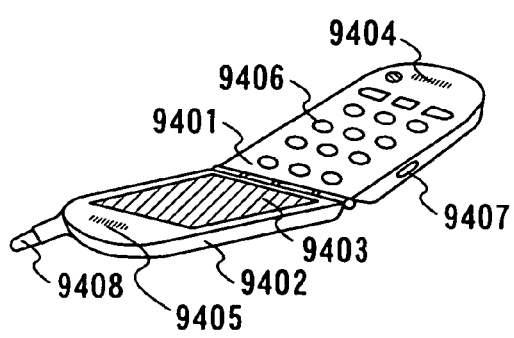

FIG. 9C shows a mobile phone according to the present invention which includes a main body 9401, a chassis 9402, a display portion 9403, an audio input portion 9404, an audio output portion 9405, an operation key 9406, an external connection port 9407, an antenna 9408, and the like. In the mobile phone, a display portion 9403 has light emitting elements, which are similar to those described in Embodiment Modes 2 to 6, arranged in matrix. Another feature of the light emitting element is that luminous efficiency is high and a driving voltage is low. In addition, a short circuit thereof due to a fine foreign substance, impact from outside, or the like can be prevented. The display portion 9403 which includes the light emitting elements has a similar feature. Therefore, in the mobile phone, image quality is hardly deteriorated and lower power consumption is attained. With such a feature, a deterioration compensation function and the number of power source circuits can be significantly removed or reduced in the mobile phone; therefore, a small size and lightweight of the main body 9401 and the chassis 9402 can be attained. In the mobile phone according to the present invention, low power consumption, high image quality, and a small size and lightweight are attained; therefore, a production which is suitable for carrying can be provided. In addition, a production with a display portion which can withstand impact when being carried can be provided.

Figure 9D:
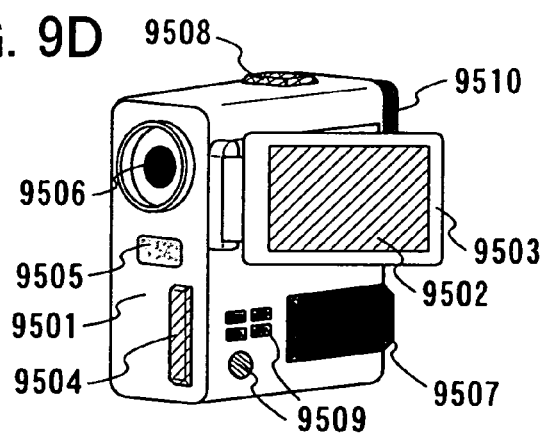

FIG. 9D shows a camera according to the present invention, which includes a main body 9501, a display portion 9502, a chassis 9503, an external connection port 9504, a remote control receiving portion 9505, an image receiving portion 9506, a battery 9507, an audio input portion 9508, an operation key 9509, an eye piece portion 9510, and the like. In the camera, the display portion 9502 has light emitting elements, which are similar to those described in Embodiment Modes 2 to 6, arranged in matrix. Another feature of the light emitting element is that luminous efficiency is high, a drive voltage is low, and a short circuit thereof due to a fine foreign substance, impact from outside, or the like can be prevented. The display portion 9502 which includes the light emitting elements has a similar feature. Therefore, in the camera, image quality is hardly deteriorated and lower power consumption can be attained. With such a feature, a deterioration compensation function and the number of power source circuits can be significantly removed or reduced in the camera; therefore, a small size and lightweight of the main body 9501 can be attained. In the camera according to the present invention, low power consumption, high image quality, and a small size and lightweight are attained; therefore, a production which is suitable for carrying can be provided. In addition, a production with a display portion which can withstand impact when being carried can be provided.

As described above, the applicable range of the light emitting device of the present invention is so wide that the light emitting device can be applied to electronic devices in various fields. By using the light emitting device of the present invention, electronic devices each having display portions consuming low power and having high reliability can be provided.

The light emitting device of the present invention has a light emitting element with high luminous efficiency, and can also be used as a lighting installation. One mode using the light emitting element of the present invention as the lighting installation will be explained with reference to FIG. 11.

Figure 11:
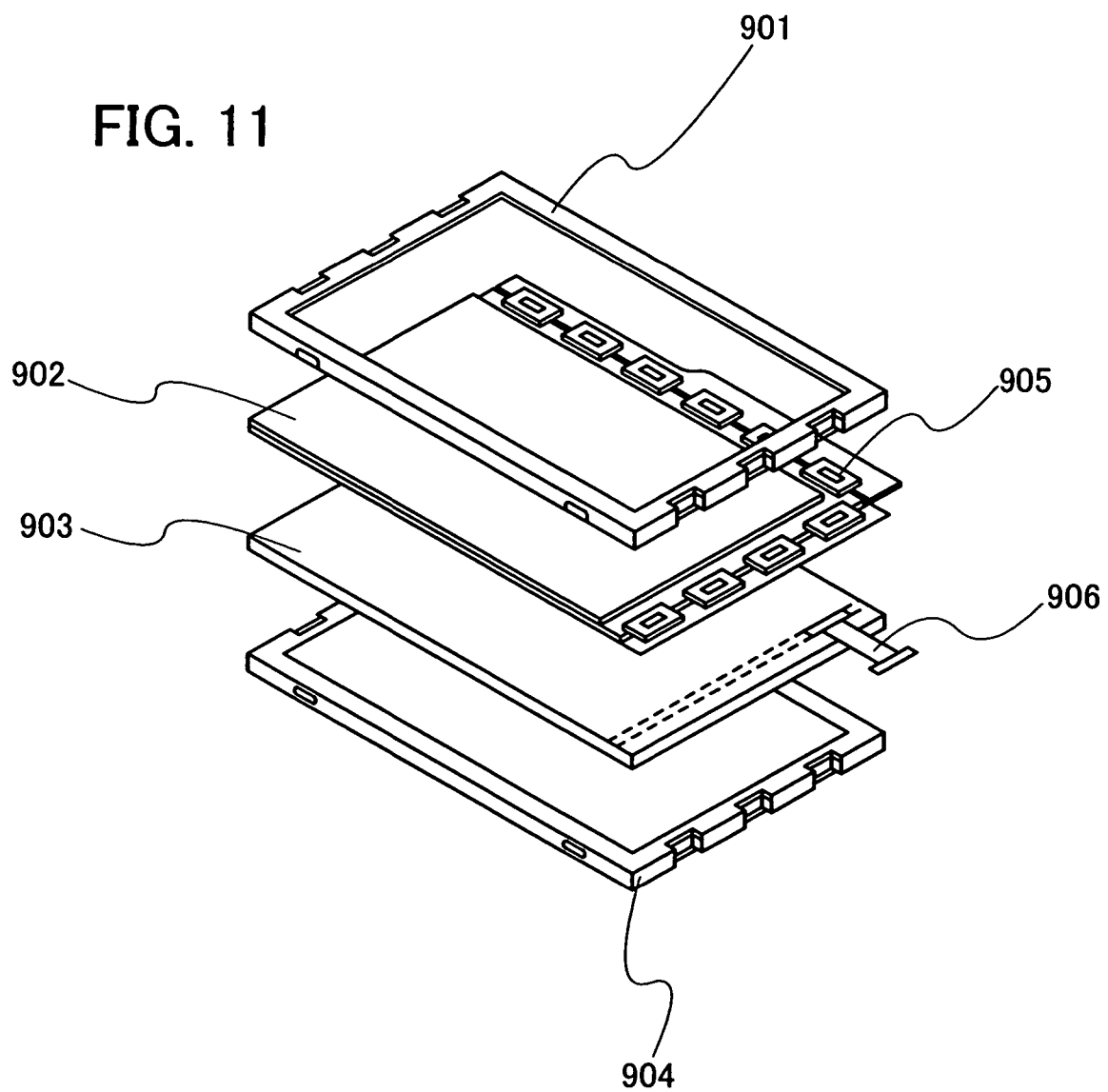
FIG. 11 is an explanatory view of an electronic device using a light emitting device of the present invention.

FIG. 11 shows an example of a liquid crystal display device using the light emitting device of the present invention as a backlight. The liquid crystal display device shown in FIG. 11 includes a housing 901, a liquid crystal layer 902, a backlight 903, and a housing 904, and the liquid crystal layer 902 is connected to a driver IC 905. The light emitting device of the present invention is used for the backlight 903, and current is supplied by a terminal 906.

By using the light emitting device of the present invention as the backlight of the liquid crystal display device, a backlight with reduced power consumption can be obtained. The light emitting device of the present invention is a plane emission type lighting installation, and can have a large area. Therefore, the backlight can have large area, and a liquid crystal display device having a large area can be obtained. Furthermore, the light emitting device has a thin shape and consumes low power; therefore, a thin shape and low power consumption of a display device can also be achieved.

Embodiment 1

In this embodiment, a measurement example of oxidation characteristics of an organic compound which can be used for a composite material of the present invention will be described. Oxidation characteristics were measured by a cyclic voltammetry (CV) measurement. Further, an electrochemical analyzer (#ALS model 600A, manufactured by BAS Inc.) was used for the measurement.

In relation to a solution used in the CV measurement, dehydrated dimethylformamide (DMF) (99.8%, catalog number; 22705-6, manufactured by Sigma-Aldrich Co.) was used as a solvent. Tetraperchlorate-n-butylammonium (n-Bu4NClO4) (catalog number; T0836, manufactured by Tokyo Kasei Kogyo Co., Ltd.), which was a supporting electrolyte, was dissolved in the solvent so as to have the concentration of 100 mmol/L. Also, an object to be measured was dissolved so as to have the concentration of 1 mmol/L. Further, a platinum electrode (a PTE platinum electrode, manufactured by BAS Inc.) was used as a working electrode. A platinum electrode (a VC-3 Pt counter electrode (5 cm), manufactured by BAS Inc.) was used as an auxiliary electrode. An Ag/Ag$^+$ electrode (an RE 5 nonaqueous reference electrode, manufactured by BAS Inc.) was used as a reference electrode. It is to be noted that the measurement was conducted at room temperature (20 to 25° C.).

(CV Measurement of a Standard Substance)

First, an oxidation-reduction potential of ferrocene (Fc) which was to be a standard substance was measured by the CV measurement. Ferrocene becomes a ferrocenium ion (Fc$^+$) by oxidation, and the ferrocenium ion returns to ferrocene reversibly by reducing ferrocenium ion. Therefore, the present invention uses an oxidation-reduction potential thereof "Fc/Fc$^+$" (defined as a midpoint potential of an oxidation peak potential and a reduction peak potential) as a standard value.

Figure 12:
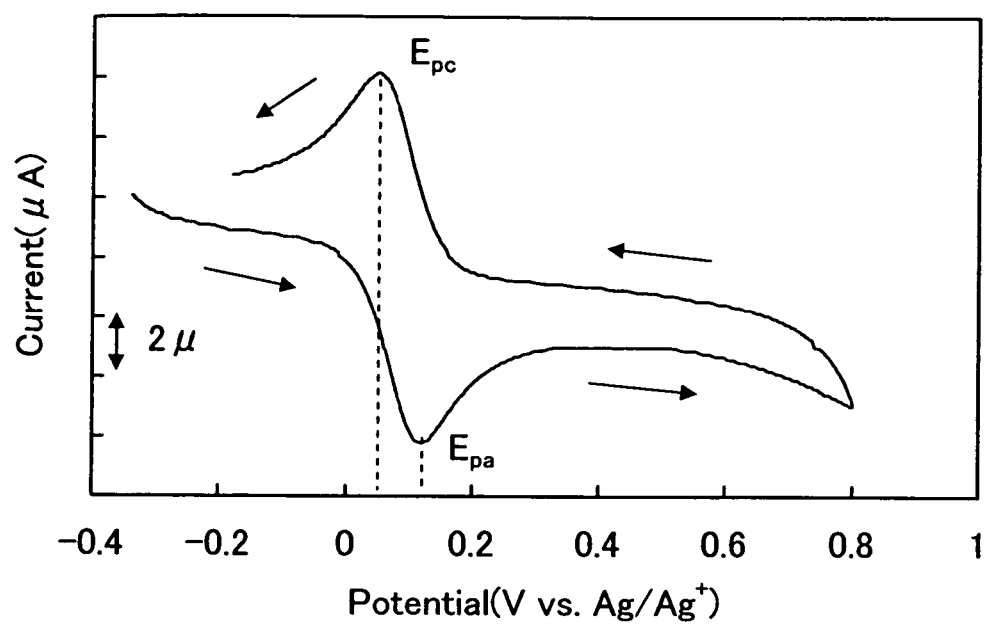
FIG. 12 is a view showing a result of CV measurement of ferrocene.

FIG. 12 shows a measurement result. As the measurement, a potential of a working electrode with respect to the reference electrode was changed from −0.34 V to 0.80 V, and then changed from 0.80 V to −0.34 V. It is to be noted that changing speed was set to 0.1 V/s. FIG. 12 shows that an oxidation peak potential (Epa) of ferrocene is 0.12 V and a reduction peak potential (Epc) of ferrocenium ion which is oxidant of ferrocene is 0.05 V. Therefore, it was revealed that an oxidation-reduction potential of ferrocene was (0.12+0.05)/2≈0.09 [V vs. Ag/Ag$^+$].

Measurement Example 1

A Case of NPB

Figure 13:
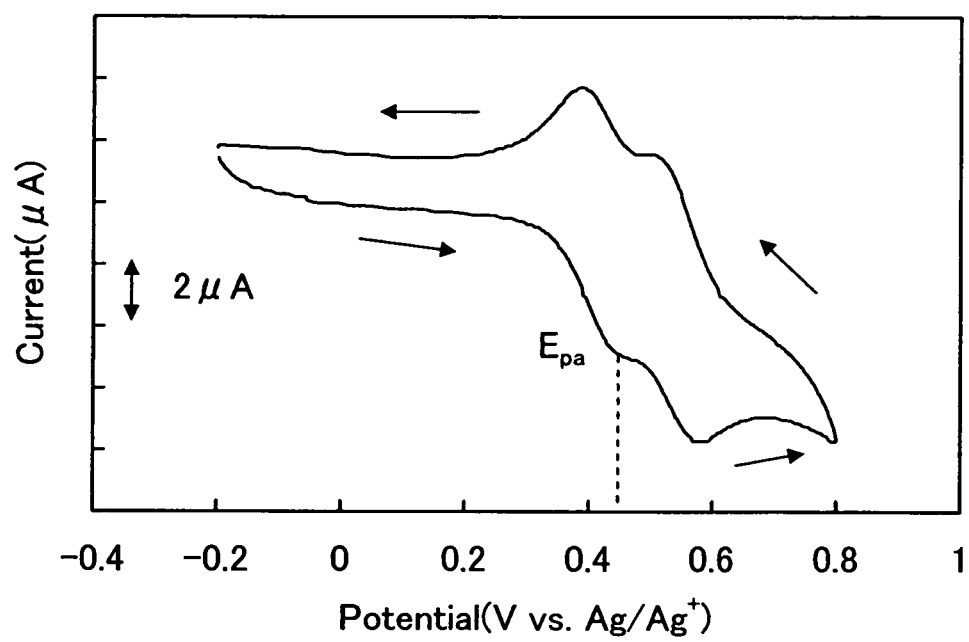
FIG. 13 is a view showing a result of CV measurement of NPB.

In this measurement example 1, an oxidation peak potential of NPB which can be used for a composite material of the present invention was measured by CV measurement. FIG. 13 shows a result thereof. As the measurement, a potential of a working electrode with respect to a reference electrode was changed from −0.20 V to 0.80 V, and then changed from 0.80 V to −0.20 V. It is to be noted that changing speed was set to 0.1 V/s. From FIG. 13, it was revealed that an oxidation peak potential (Epa) of NPB was 0.45 [V vs. Ag/Ag$^+$].

Therefore, provided that an oxidation-reduction potential of ferrocene (=0.09 [V vs. Ag/Ag$^+$]) which was measured in the above (the CV measurement of a standard substance) was set to a standard value (0 V), it was revealed that an oxidation peak potential of NPB was 0.36 [V vs. Fc/Fc$^+$].

Measurement Example 2

A Case of DNTPD

Figure 14:
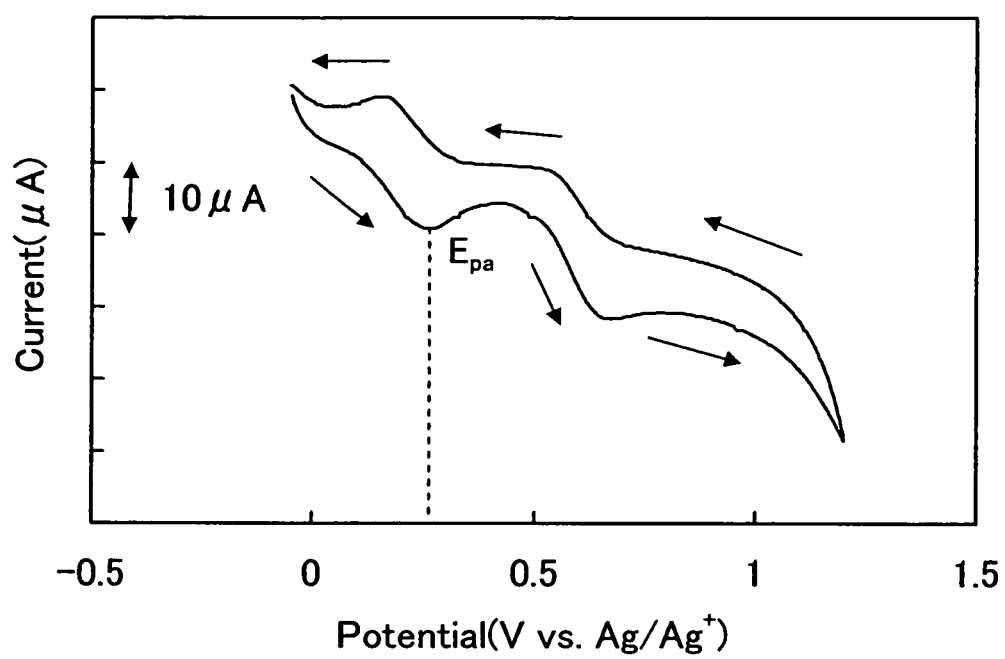
FIG. 14 is a view showing a result of CV measurement of DNTPD.

In this measurement example 2, an oxidation peak potential of DNTPD which can be used for a composite material of the present invention was measured by CV measurement. FIG. 14 shows a result thereof. As the measurement, a potential of a working electrode with respect to a reference electrode was changed from −0.05 V to 1.20 V, and then changed from 1.20 V to −0.05 V. It is to be noted that changing speed was set to 0.1 V/s. From FIG. 14, it was revealed that an oxidation peak potential (Epa) of DNTPD was 0.26 [V vs. Ag/Ag$^+$].

Therefore, provided that an oxidation-reduction potential of ferrocene (=0.09 [V vs. Ag/Ag$^+$]) which was measured in the above (the CV measurement of a standard substance) was set to a standard value (0 V), it was revealed that an oxidation peak potential of DNTPD was 0.17 [V vs. Fc/Fc$^+$].

Measurement Example 3

A Case of PCzPCA1

Figure 15:
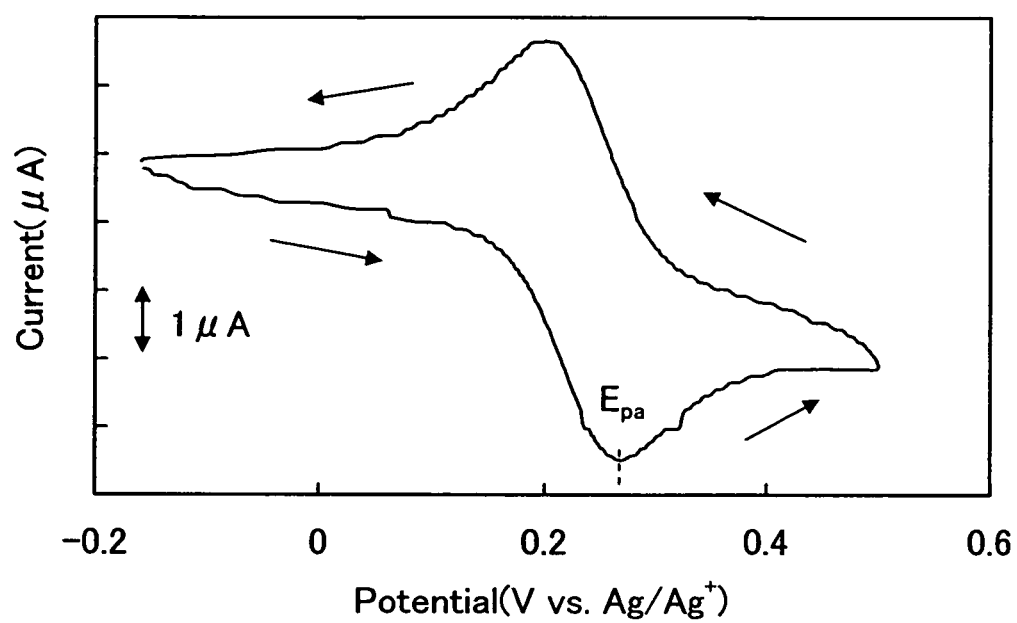
FIG. 15 is a view showing a result of CV measurement of PCzPCA1.

In this measurement example 3, an oxidation peak potential of PCzPCA1 which can be used for a composite material of the present invention was measured by CV measurement. FIG. 15 shows a result thereof. As the measurement, a potential of a working electrode with respect to a reference electrode was changed from −0.16 V to 0.50 V, and then changed from 0.50 V to −0.16 V. It is to be noted that changing speed was set to 0.1 V/s. From FIG. 15, it was revealed that an oxidation peak potential (Epa) of PCzPCA1 was 0.27 [V vs. Ag/Ag$^+$].

Therefore, provided that an oxidation-reduction potential of ferrocene (=0.09 [V vs. Ag/Ag$^+$]) which was measured in the above (the CV measurement of a standard substance) was set to a standard value (0 V), it was revealed that an oxidation peak potential of PCzPCA1 was 0.18 [V vs. Fc/Fc$^+$].

Measurement Example 4

A Case of PCzPCN1

Figure 16:
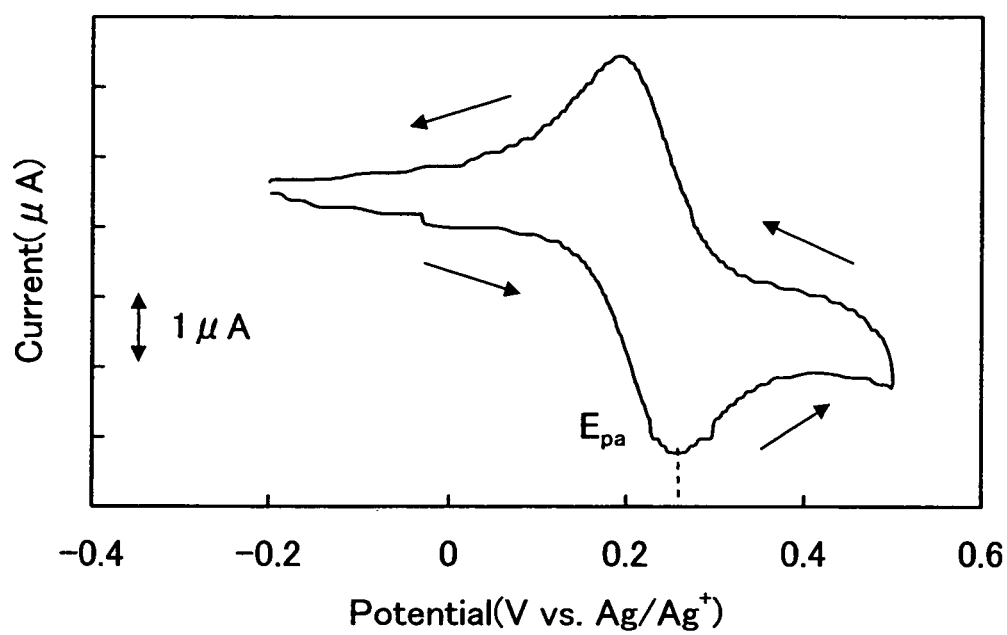
FIG. 16 is a view showing a result of CV measurement of PCzPCN1.

In this measurement example 4, an oxidation peak potential of PCzPCN1 which can be used for a composite material of the present invention was measured by CV measurement. FIG. 16 shows a result thereof. As the measurement, a potential of a working electrode with respect to a reference electrode was changed from −0.20 V to 0.50 V, and then changed from 0.50 V to −0.20 V. It is to be noted that changing speed was set to 0.1 V/s. From FIG. 16, it was revealed that an oxidation peak potential (Epa) of PCzPCN1 was 0.26 [V vs. Ag/Ag$^+$].

Therefore, provided that an oxidation-reduction potential of ferrocene (=0.09 [V vs. Ag/Ag$^+$]) which was measured in the above (the CV measurement of a standard substance) was set to a standard value (0 V), it was revealed that an oxidation peak potential of PCzPCN1 was 0.17 [V vs. Fc/Fc$^+$].

Measurement Example 5

A Case of CBP

Figure 17:
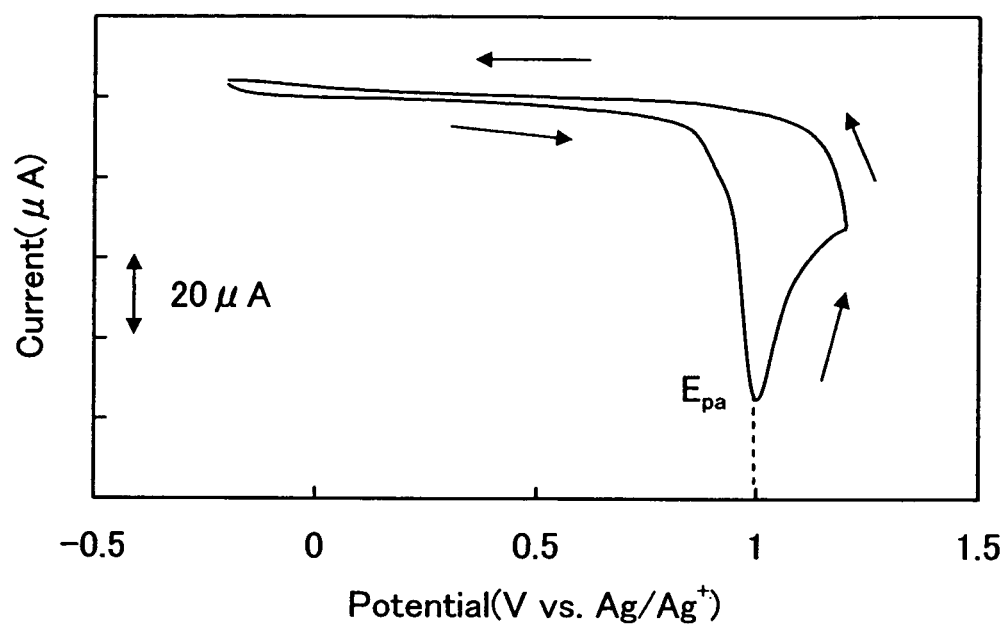
FIG. 17 is a view showing a result of CV measurement of CBP.

In this measurement example 5, an oxidation peak potential of CBP which can be used for a composite material of the present invention was measured by CV measurement. FIG. 17 shows a result thereof. As the measurement, a potential of a working electrode with respect to a reference electrode was changed from −0.20 V to 1.20 V, and then changed from 1.20 V to −0.20 V. It is to be noted that changing speed was set to 0.1 V/s. From FIG. 17, it was revealed that an oxidation peak potential (Epa) of CBP was 1.00 [V vs. Ag/Ag$^+$].

Therefore, provided that an oxidation-reduction potential of ferrocene (=0.09 [V vs. Ag/Ag$^+$]) which was measured in the above (the CV measurement of a standard substance) was set to a standard value (0 V), it was revealed that an oxidation peak potential of CBP was 0.91 [V vs. Fc/Fc$^+$].

Measurement Example 6

A Case of t-BuDNA

Figure 18:
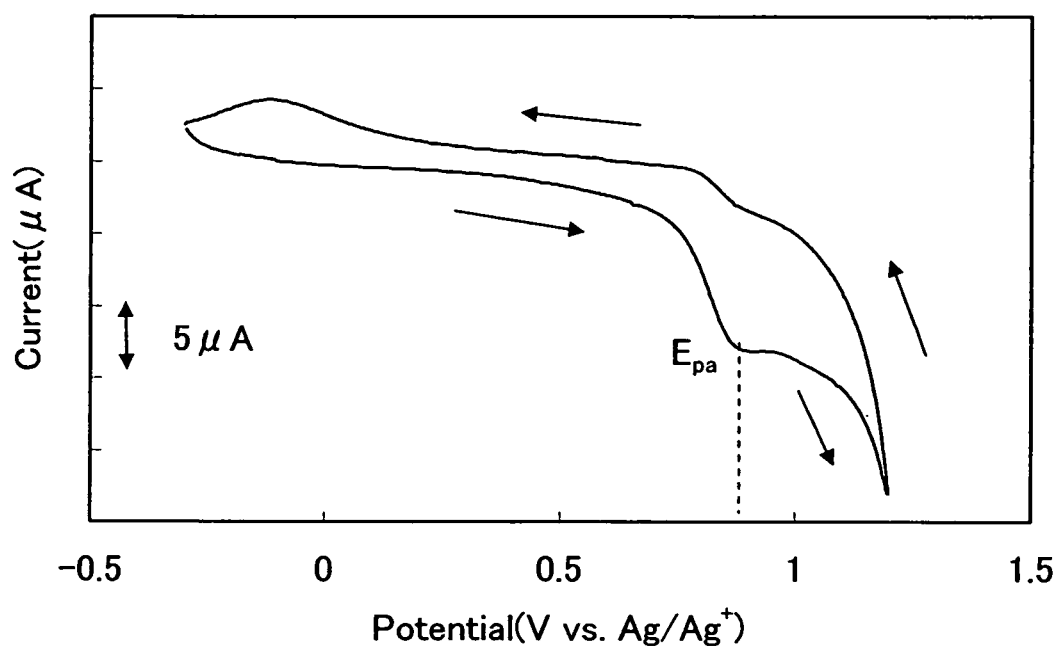
FIG. 18 is a view showing a result of CV measurement of t-BuDNA.

In this measurement example 6, an oxidation peak potential of t-BuDNA which can be used for a composite material of the present invention was measured by CV measurement. FIG. 18 shows a result thereof. As the measurement, a potential of a working electrode with respect to a reference electrode was changed from −0.30 V to 1.20 V, and then changed from 1.20 V to −0.30 V. It is to be noted that changing speed was set to 0.1 V/s. From FIG. 18, it was revealed that an oxidation peak potential (Epa) of t-BuDNA was 0.89 [V vs. Ag/Ag$^+$].

Therefore, provided that an oxidation-reduction potential of ferrocene (=0.09 [V vs. Ag/Ag$^+$]) which was measured in the above (the CV measurement of a standard substance) was set to a standard value (0 V), it was revealed that an oxidation peak potential of t-BuDNA was 0.80 [V vs. Fc/Fc$^+$].

Measurement Example 7

A Case of DPVBi

Figure 19:
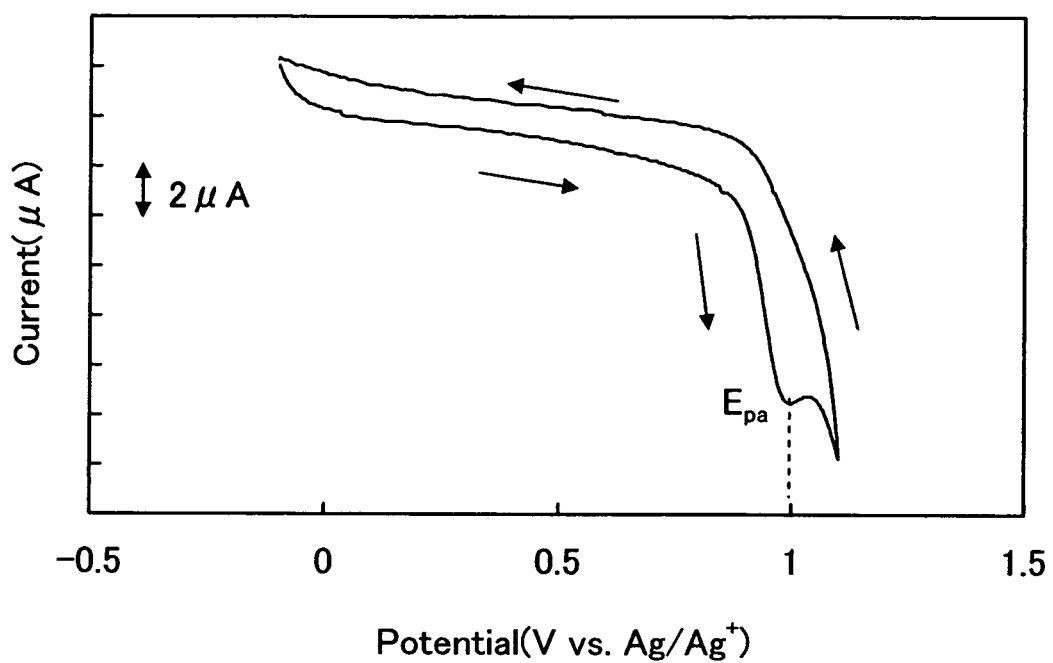
FIG. 19 is a view showing a result of CV measurement of DPVBi.

In this measurement example 7, an oxidation peak potential of DPVBi which can be used for a composite material of the present invention was measured by CV measurement. FIG. 19 shows a result thereof. As the measurement, a potential of a working electrode with respect to a reference electrode was changed from −0.10 V to 1.10 V, and then changed from 1.10 V to −0.10 V. It is to be noted that changing speed was set to 0.1 V/s. From FIG. 19, it was revealed that an oxidation peak potential (Epa) of DPVBi was 1.00 [V vs. Ag/Ag$^+$].

Therefore, provided that an oxidation-reduction potential of ferrocene (=0.09 [V vs. Ag/Ag$^+$]) which was measured in the above (the CV measurement of a standard substance) was set to a standard value (0 V), it was revealed that an oxidation peak potential of DPVBi was 0.91 [V vs. Fc/Fc$^+$].

Measurement Example 8

A Case of Alq

Figure 20:
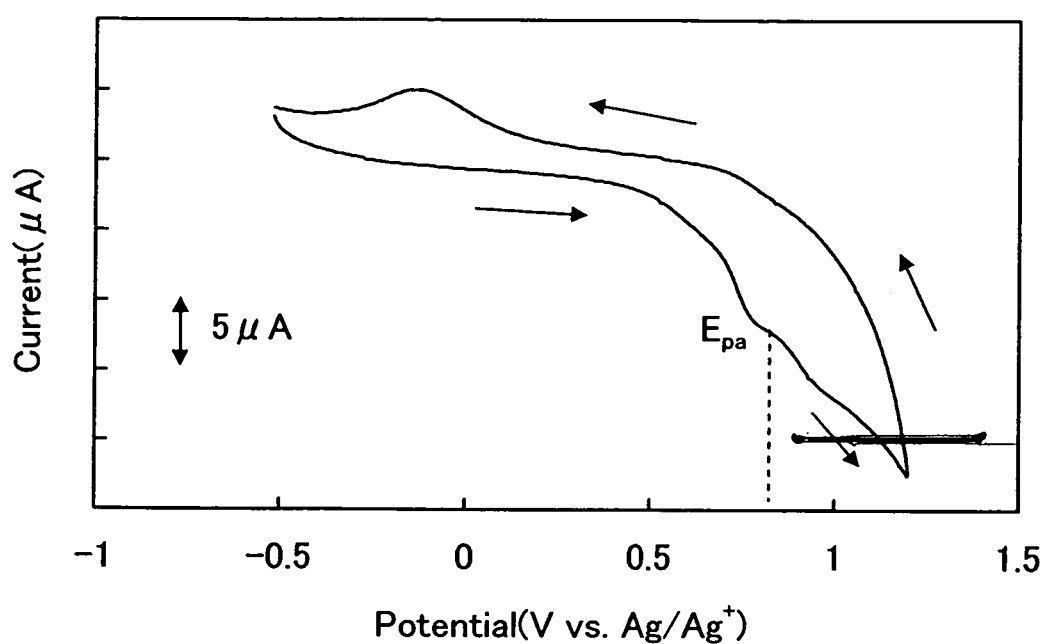
FIG. 20 is a view showing a result of CV measurement of Alq.

In this measurement example 8, an oxidation peak potential of Alq which can be used for a composite material of the present invention was measured by CV measurement. FIG. 20 shows a result thereof. As the measurement, a potential of a working electrode with respect to a reference electrode was changed from −0.52 V to 1.20 V, and then changed from 1.20 V to −0.52 V. It is to be noted that changing speed was set to 0.1 V/s. From FIG. 20, it was revealed that an oxidation peak potential (Epa) of Alq was 0.82 [V vs. Ag/Ag$^+$].

Therefore, provided that an oxidation-reduction potential of ferrocene (=0.09 [V vs. Ag/Ag$^+$]) which was measured in the above (the CV measurement of a standard substance) was set to a standard value (0 V), it was revealed that an oxidation peak potential of Alq was 0.73 [V vs. Fc/Fc$^+$].

Comparative Measurement Example 1

A Case of BCP

Figure 21:
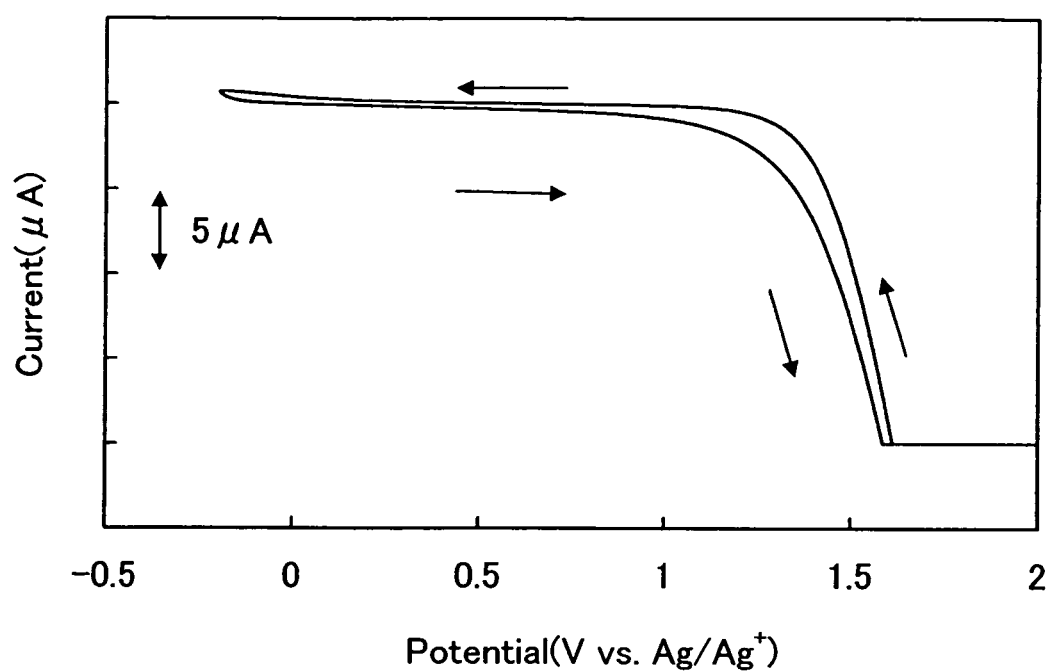
FIG. 21 is a view showing a result of CV measurement of BCP.

In this comparative measurement example 1, an oxidation peak potential of BCP which cannot be used for a composite material of the present invention was measured by CV measurement. FIG. 21 shows a result thereof. As the measurement, a potential of a working electrode with respect to a reference electrode was changed from −0.20 V to 2.00 V, and then changed from 2.00 V to −0.20 V. It is to be noted that changing speed was set to 0.1 V/s. From FIG. 21, although the amount of current exceeds the higher limit of measurement range between 1.60 V and 2.00 V, an oxidation peak potential of BCP was not observed at least between −0.20 and 1.60 [V vs. Ag/Ag$^+$].

Therefore, provided that an oxidation-reduction potential of ferrocene (=0.09 [V vs. Ag/Ag$^+$]) which was measured in the above (the CV measurement of a standard substance) was set to a standard value (0 V), it was revealed that an oxidation peak potential of BCP did not exist between −0.29 V and 1.51 [V vs. Fc/Fc$^+$].

Comparative Measurement Example 2; a Case of OXD-7

Figure 22:
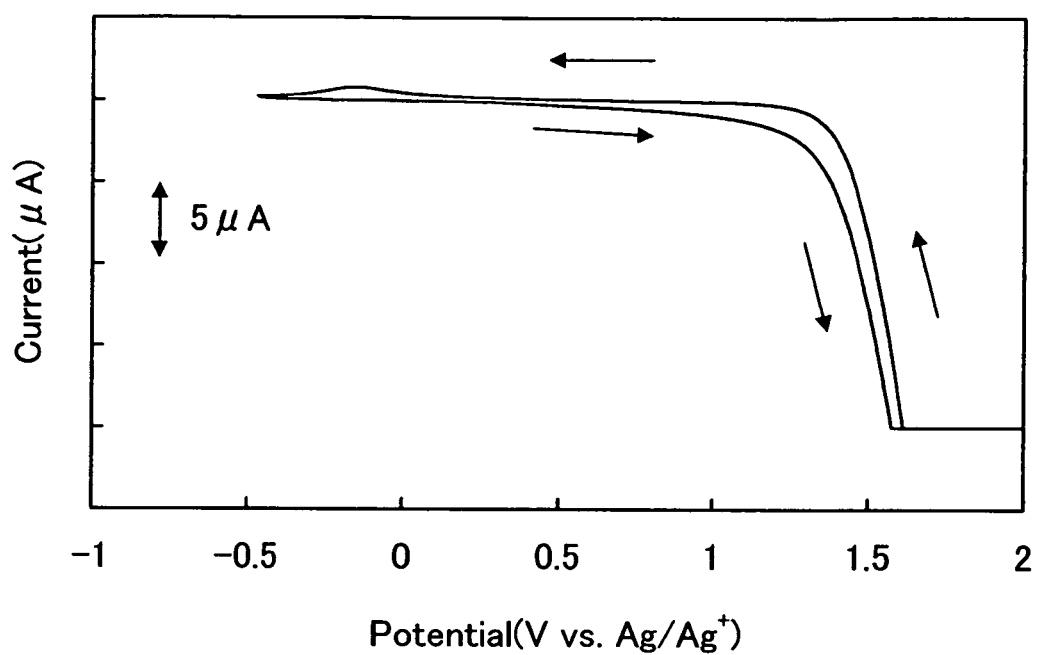
FIG. 22 is a view showing a result of CV measurement of OXD-7.

In this comparative measurement example 2, an oxidation peak potential of OXD-7 which cannot be used for a composite material of the present invention was measured by CV measurement. FIG. 22 shows a result thereof. As the measurement, a potential of a working electrode with respect to a reference electrode was changed from −0.47 V to 2.00 V, and then changed from 2.00 V to −0.47 V. It is to be noted that changing speed was set to 0.1 V/s. From FIG. 22, although the amount of current exceeds the higher limit of measurement range between 1.60 V and 2.00 V, an oxidation peak potential of OXD-7 was not observed at least between −0.47 and 1.60 [V vs. Ag/Ag$^+$].

Therefore, provided that an oxidation-reduction potential of ferrocene (=0.09 [V vs. Ag/Ag$^+$]) which was measured in the above (the CV measurement of a standard substance) was set to a standard value (0 V), it was revealed that an oxidation peak potential of OXD-7 did not exist between −0.56 V and 1.51 [V vs. Fc/Fc$^+$].

Comparative Measurement Example 3; a Case of TPBi

Figure 23:
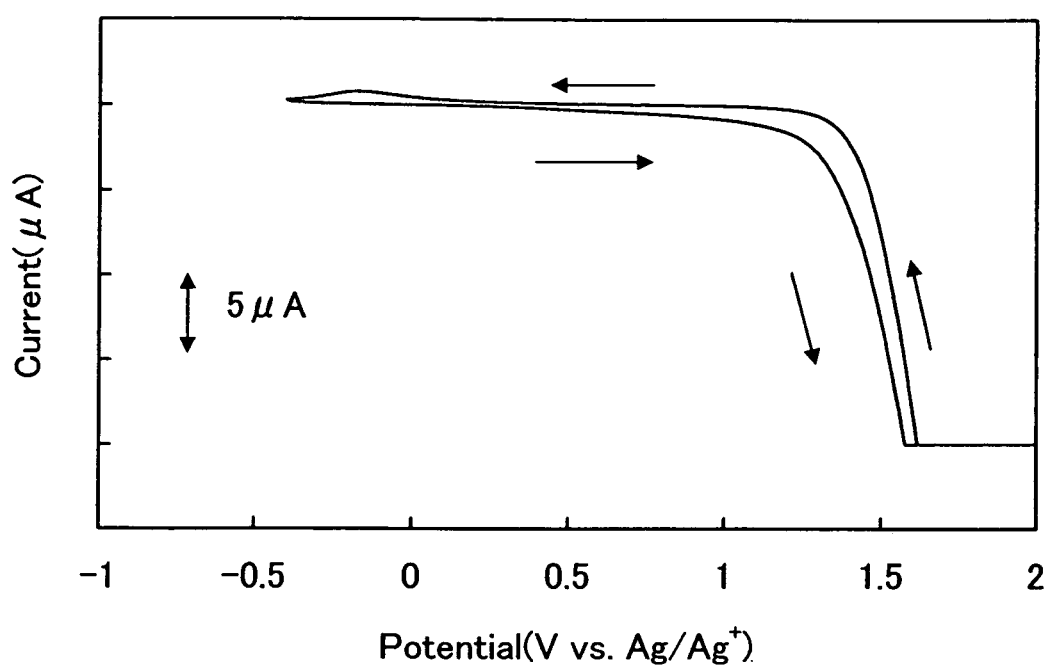
FIG. 23 is a view showing a result of CV measurement of TPBi.

In this comparative measurement example 3, an oxidation peak potential of TPBi which cannot be used for a composite material of the present invention was measured by CV measurement. FIG. 23 shows a result thereof. As the measurement, a potential of a working electrode with respect to a reference electrode was changed from −0.40 V to 2.00 V, and then changed from 2.00 V to −0.40 V. It is to be noted that changing speed was set to 0.1 V/s. From FIG. 23, although the amount of current exceeds the higher limit of measurement range between 1.60 V and 2.00 V, an oxidation peak potential of TPBi was not observed at least between −0.40 and 1.60 [V vs. Ag/Ag$^+$].

Therefore, provided that an oxidation-reduction potential of ferrocene (=0.09 [V vs. Ag/Ag$^+$]) which was measured in the above (the CV measurement of a standard substance) was set to a standard value (0 V), it was revealed that an oxidation peak potential of TPBi did not exist between −0.49 V and 1.51 [V vs. Fc/Fc$^+$].

The above-described results are summarized in Table 1. As shown in Table 1, an organic compound which can be used for the composite material of the present invention has an oxidation peak potential (vs. Ag/Ag$^+$) in dimethylformamide (DMF) at room temperature within the range of 0 to 1.5 V and has an oxidation peak potential (vs. Fc/Fc$^+$) in dimethylformamide (DMF) at room temperature within the range of 0 to 1.5 V. On the other hand, as for an organic compound which cannot be used for the composite material of the present invention, it is revealed that an oxidation peak potential is not observed within the range described above.

TABLE 1

| | organic compound | $E_{pa}$ [V vs. Ag/Ag$^+$] | $E_{pa}$ [V vs. Fc/Fc$^+$] |
|---|---|---|---|
| Measurement example 1 | NPB | 0.45 | 0.36 |
| Measurement example 2 | DNTPD | 0.26 | 0.17 |
| Measurement example 3 | PCzPCA1 | 0.27 | 0.18 |
| Measurement example 4 | PCzPCN1 | 0.26 | 0.17 |
| Measurement example 5 | CBP | 1.00 | 0.91 |
| Measurement example 6 | t-BuDNA | 0.89 | 0.80 |
| Measurement example 7 | DPVBi | 1.00 | 0.91 |
| Measurement example 8 | Alq | 0.82 | 0.73 |
| Comparative measurement example 1 | BCP | — | — |
| Comparative measurement example 2 | OXD-7 | — | — |
| Comparative measurement example 3 | TBPi | — | — |

"—" indicates that oxidation peak potential was not observed.

Next, a light emitting element was manufactured using an organic compound which was measured in Embodiment 1 and characteristics thereof were evaluated. The result will be shown in embodiment below.

Embodiment 2

In this embodiment, a light emitting element using a composite material of the present invention will be specifically described. Moreover, an effect of the present invention will be explained with a comparative example.
(Light Emitting Element 1)

First, indium tin oxide including silicon oxide was formed over a glass substrate by a sputtering method to form a first electrode. A thickness thereof was set to 110 nm and an electrode area was set to 2 mm×2 mm.

Next, the substrate provided with the first electrode was fixed to a substrate holder provided in a vacuum evaporation system so that a surface over which the first electrode was formed was placed downward. Then, after the vacuum evaporation system was exhausted to reduce the pressure to approximately 10$^{-4}$ Pa, NPB, molybdenum oxide (VI), and rubrene were co-evaporated over the first electrode to form a layer including a composite material of the present invention. A thickness thereof was set to 120 nm and a weight ratio of NPB, molybdenum oxide (VI), and rubrene was adjusted to be 2:0.75:0.04. The co-evaporation method indicates an evaporation method by which evaporation is concurrently conducted from a plurality of evaporation sources in one treatment chamber. Although rubrene is added in this embodiment, rubrene is not indispensable, and almost the same characteristics can be obtained using only NPB and molybdenum oxide (VI).

Next, NPB was formed to have a thickness of 10 nm by an evaporation method using resistance heating to form a hole transporting layer.

Further, a light emitting layer having a thickness of 37.5 nm was formed over the hole transporting layer by co-evaporation of Alq and coumarin 6. Here, a weight ratio of Alq and coumarin 6 was adjusted to be 1:0.01 (=Alq:coumarin 6). Accordingly, coumarin 6 is to be dispersed in a layer made of Alq.

Thereafter, Alq was formed to have a thickness of 37.5 nm over the light emitting layer by an evaporation method using resistance heating to form an electron transporting layer.

Further, calcium fluoride was formed to have a thickness of 1 nm over the electron transporting layer by an evaporation method using resistance heating to form an electron injecting layer.

Lastly, aluminum was formed to have a thickness of 200 nm over the electron injecting layer by an evaporation method using resistance heating to form a second electrode, and accordingly, a light emitting element 1 of the present invention was manufactured.
(Comparative Light Emitting Element 1)

First, indium tin oxide including silicon oxide was formed over a glass substrate by a sputtering method to form a first electrode. A thickness thereof was set to 110 nm and an electrode area was set to 2 mm×2 mm.

Next, the substrate provided with the first electrode was fixed to a substrate holder provided in a vacuum evaporation system so that a surface over which the first electrode was formed was placed downward. Thereafter, only NPB was formed to have a thickness of 60 nm by an evaporation method using resistance heating.

Further, a light emitting layer having a thickness of 37.5 nm was formed over the NPB by co-evaporation of Alq and coumarin 6. Here, a weight ratio of Alq and coumarin 6 was adjusted to be 1:0.01 (=Alq:coumarin 6). Accordingly, coumarin 6 is to be dispersed in a layer made of Alq.

Thereafter, Alq was formed to have a thickness of 37.5 nm over the light emitting layer by an evaporation method using resistance heating to form an electron transporting layer.

Further, calcium fluoride was formed to have a thickness of 1 nm over the electron transporting layer by an evaporation method using resistance heating to form an electron injecting layer.

Lastly, aluminum was formed to have a thickness of 200 nm over the electron injecting layer by an evaporation method using resistance heating to form a second electrode, and accordingly, a comparative light emitting element 1 was manufactured.

Figure 24:
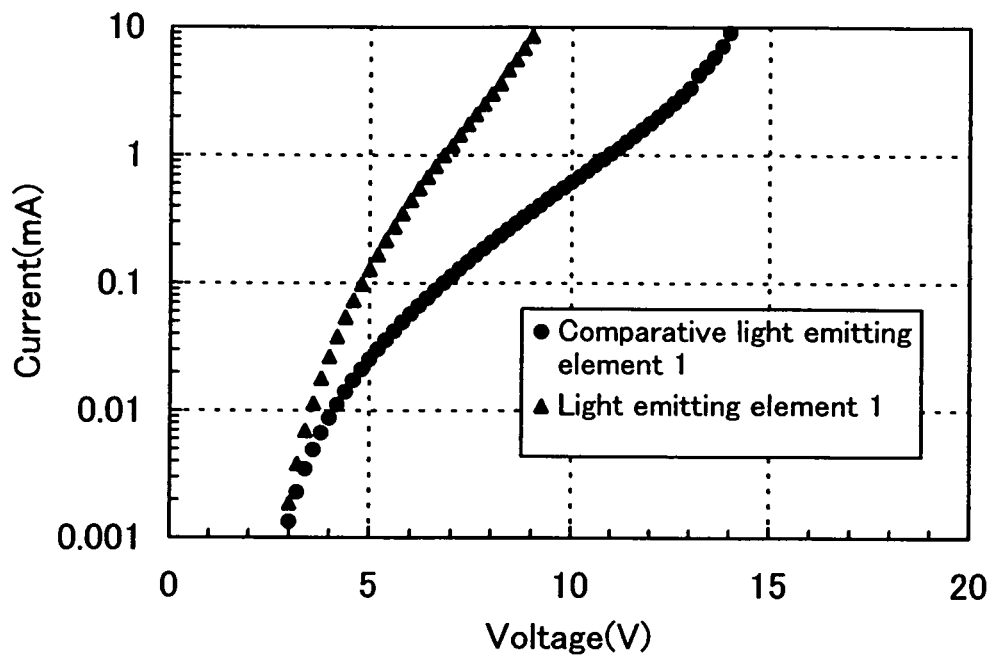
FIG. 24 is a view showing current-voltage characteristics of a light emitting element of the present invention and a comparative light emitting element.
Figure 25:
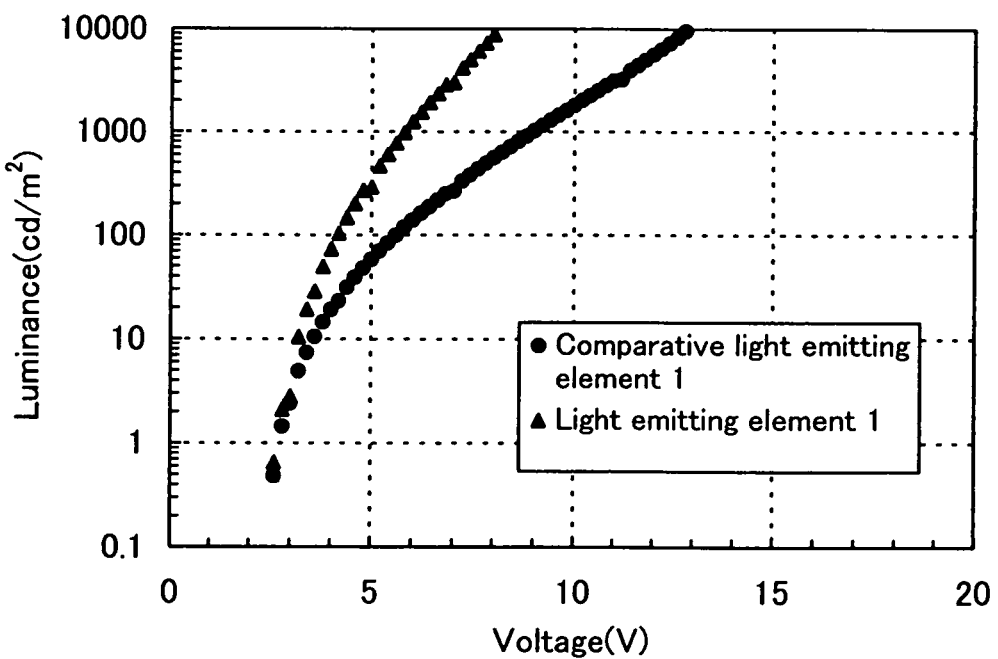
FIG. 25 is a view showing luminance-voltage characteristics of a light emitting element of the present invention and a comparative light emitting element.

FIG. 24 shows current-voltage characteristics of the light emitting element 1 of the present invention and the comparative light emitting element 1. Further, FIG. 25 shows luminance-voltage characteristics. In the light emitting element 1 of the present invention, a voltage necessary to obtain luminance of 990 $cd/m^2$ was 5.8 V, and a current flowing at the time was 0.351 mA (current density was 8.78 $mA/cm^2$). In addition, current efficiency at this time was 11 cd/A, and power efficiency was 6.1 lm/W. On the other hand, in the comparative light emitting element 1, a voltage necessary to obtain luminance of 1000 $cd/m^2$ was 9.0 V, and a current flowing at the time was 0.363 mA (current density was 9.07 $mA/cm^2$). In addition, current efficiency at this time was 11 cd/A, and power efficiency was 3.9 lm/W.

Therefore, in a case where the light emitting element is made to emit light at luminance of approximately 1000 $cd/m^2$, it is revealed that both of a drive voltage and power consumption are reduced in the light emitting element 1 of the present invention using the composite material of the present invention compared with the comparative light emitting element 1 in which a layer using only an organic compound is formed as a layer which is in contact with an electrode.

From the above results, it is revealed that a drive voltage can be reduced by using the composite material of the present invention for the light emitting element. In addition, it is revealed that power consumption can be reduced.

Embodiment 3

In this embodiment, a light emitting element using a composite material of the present invention will be specifically described. Moreover, an effect of the present invention will be explained with a comparative example.
(Light Emitting Element 2)

First, indium tin oxide including silicon oxide was formed over a glass substrate by a sputtering method to form a first electrode. A thickness thereof was set to 110 nm and an electrode area was set to 2 mm×2 mm.

Next, the substrate provided with the first electrode was fixed to a substrate holder provided in a vacuum evaporation system so that a surface over which the first electrode was formed was placed downward. Then, after the vacuum evaporation system was exhausted to reduce the pressure to approximately $10^{-4}$ Pa, DNTPD, molybdenum oxide (VI), and rubrene were co-evaporated over the first electrode to form a layer including a composite material of the present invention. A thickness thereof was set to 120 nm and a weight ratio of DNTPD, molybdenum oxide (VI), and rubrene was adjusted to be 1:0.5:0.02. The co-evaporation method indicates an evaporation method by which evaporation is concurrently conducted from a plurality of evaporation sources in one treatment chamber. Although rubrene is added in this embodiment, rubrene is not indispensable, and almost the same characteristics can be obtained using only NPB and molybdenum oxide (VI).

Next, NPB was formed to have a thickness of 10 nm by an evaporation method using resistance heating to form a hole transporting layer.

Further, a light emitting layer having a thickness of 37.5 nm was formed over the hole transporting layer by co-evaporation of Alq and coumarin 6. Here, a weight ratio of Alq and coumarin 6 was adjusted to be 1:0.01 (=Alq:coumarin 6). Accordingly, coumarin 6 is to be dispersed in a layer made of Alq.

Thereafter, Alq was formed to have a thickness of 37.5 nm over the light emitting layer by an evaporation method using resistance heating to form an electron transporting layer.

Further, calcium fluoride was formed to have a thickness of 1 nm over the electron transporting layer by an evaporation method using resistance heating to form an electron injecting layer.

Lastly, aluminum was formed to have a thickness of 200 nm over the electron injecting layer by an evaporation method using resistance heating to form a second electrode, and accordingly, a light emitting element 2 of the present invention was manufactured.
(Comparative Light Emitting Element 2)

First, indium tin oxide including silicon oxide was formed over a glass substrate by a sputtering method to form a first electrode. A thickness thereof was set to 110 nm and an electrode area was set to 2 mm×2 mm.

Next, the substrate provided with the first electrode was fixed to a substrate holder provided in a vacuum evaporation system so that a surface over which the first electrode was formed was placed downward. Thereafter, DNTPD was formed to have a thickness of 50 nm by an evaporation method using resistance heating.

Subsequently, NPB was formed to have a thickness of 10 nm over the DNTPD by an evaporation method using resistance heating.

Further, a light emitting layer having a thickness of 37.5 nm was formed over the NPB by co-evaporation of Alq and coumarin 6. Here, a weight ratio of Alq and coumarin 6 was adjusted to be 1:0.01 (=Alq:coumarin 6). Accordingly, coumarin 6 is to be dispersed in a layer made of Alq.

Thereafter, Alq was formed to have a thickness of 37.5 nm over the light emitting layer by an evaporation method using resistance heating to form an electron transporting layer.

Further, calcium fluoride was formed to have a thickness of 1 nm over the electron transporting layer by an evaporation method using resistance heating to form an electron injecting layer.

Lastly, aluminum was formed to have a thickness of 200 nm over the electron injecting layer by an evaporation method using resistance heating to form a second electrode, and accordingly, a comparative light emitting element 2 was manufactured.

Figure 26:
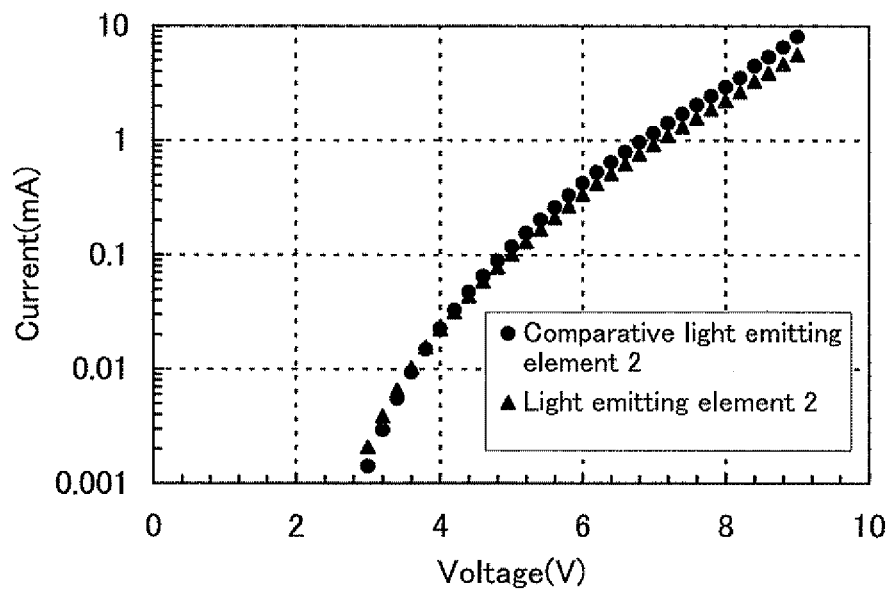
FIG. 26 is a view showing current-voltage characteristics of a light emitting element of the present invention and a comparative light emitting element.
Figure 27:
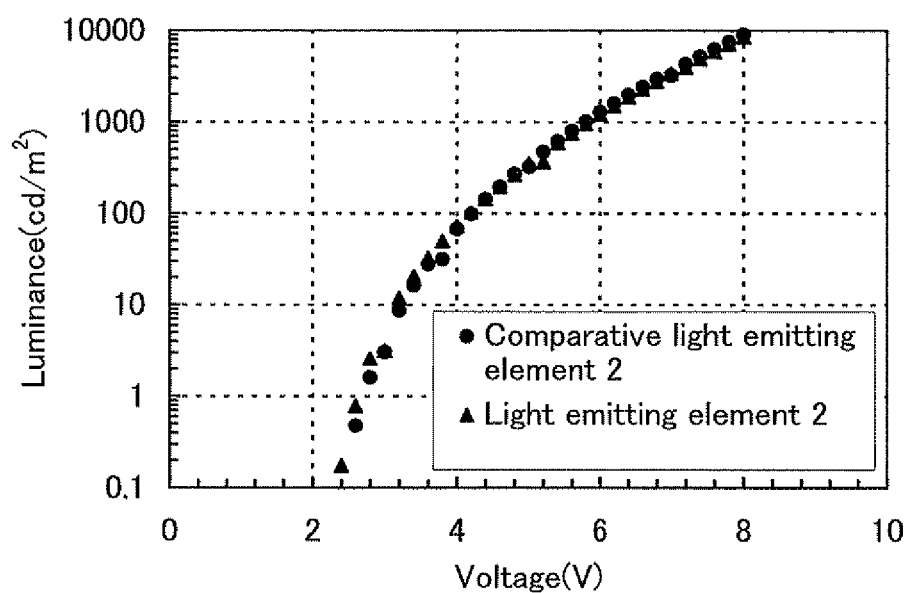
FIG. 27 is a view showing luminance-voltage characteristics of a light emitting element of the present invention and a comparative light emitting element.

FIG. 26 shows current-voltage characteristics of the light emitting element 2 of the present invention and the comparative light emitting element 2. Further, FIG. 27 shows luminance-voltage characteristics. According to FIGS. 26 and 27, in the light emitting element 2 of the present invention, a voltage necessary to obtain luminance of 950 $cd/m^2$ was 5.8 V, and a current flowing at the time was 0.267 mA (current density was 6.66 $mA/cm^2$). In addition, current efficiency at this time was 14 cd/A, and power efficiency was 7.7 lm/W. On the other hand, in the comparative light emitting element 2, a voltage necessary to obtain luminance of 1000 $cd/m^2$ was 5.8 V, and a current flowing at the time was 0.331 mA (current density was 8.27 $mA/cm^2$). In addition, current efficiency at this time was 12 cd/A, and power efficiency was 6.6 lm/W.

Therefore, in a case where the light emitting element is made to emit light at luminance of approximately 1000 $cd/m^2$, it is revealed that power consumption is lowered in the light emitting element 2 of the present invention using the composite material of the present invention as a result of improving current efficiency compared with the comparative light emitting element 2 in which a layer using only an organic compound was formed, though a drive voltage was almost the same as the comparative light emitting element 2.

From the above results, it is revealed that power consumption can be lowered by using the composite material of the present invention for the light emitting element.

Embodiment 4

In this embodiment, a light emitting element using a composite material of the present invention will be specifically described. Moreover, an effect of the present invention will be explained with a comparative example.
(Light Emitting Element 3)
First, indium tin oxide including silicon oxide was formed over a glass substrate by a sputtering method to form a first electrode. A thickness thereof was set 15 to 110 nm and an electrode area was set to 2 mm×2 mm.

Next, the substrate provided with the first electrode was fixed to a substrate holder provided in a vacuum evaporation system so that a surface over which the first electrode was formed was placed downward. Then, after the vacuum evaporation system was exhausted to reduce the pressure to approximately $10^{-4}$ Pa, PCzPCA1 and molybdenum oxide (VI) were co-evaporated over the first electrode to form a layer including a composite material of the present invention. A thickness thereof was set to 120 nm and a weight ratio of PCzPCA1 and molybdenum oxide (VI) was adjusted to be 1:0.5. The co-evaporation method indicates an evaporation method by which evaporation is concurrently conducted from a plurality of evaporation sources in one treatment chamber.

Next, NPB was formed to have a thickness of 10 nm by an evaporation method using resistance heating to form a hole transporting layer.

Further, a light emitting layer having a thickness of 37.5 nm was formed over the hole transporting layer by co-evaporation of Alq and coumarin 6. Here, a weight ratio of Alq and coumarin 6 was adjusted to be 1:0.01 (=Alq:coumarin 6). Accordingly, coumarin 6 is to be dispersed in a layer made of Alq.

Thereafter, Alq was formed to have a thickness of 37.5 nm over the light emitting layer by an evaporation method using resistance heating to form an electron transporting layer.

Further, calcium fluoride was formed to have a thickness of 1 nm over the electron transporting layer by an evaporation method using resistance heating to form an electron injecting layer.

Lastly, aluminum was formed to have a thickness of 200 nm over the electron injecting layer by an evaporation method using resistance heating to form a second electrode, and accordingly, a light emitting element 3 of the present invention was manufactured.
(Comparative Light Emitting Element 3)
First, indium tin oxide including silicon oxide was formed over a glass substrate by a sputtering method to form a first electrode. A thickness thereof was set to 110 nm and an electrode area was set to 2 mm×2 mm.

Next, the substrate provided with the first electrode was fixed to a substrate holder provided in a vacuum evaporation system so that a surface over which the first electrode was formed was placed downward. Thereafter, PCzPCA1 was formed to have a thickness of 50 nm by an evaporation method using resistance heating.

Subsequently, NPB was formed to have a thickness of 10 nm over the PCzPCA1 by an evaporation method using resistance heating.

Further, a light emitting layer having a thickness of 37.5 nm was formed over the NPB by co-evaporation of Alq and coumarin 6. Here, a weight ratio of Alq and coumarin 6 was adjusted to be 1:0.01 (=Alq:coumarin 6). Accordingly, coumarin 6 is to be dispersed in a layer made of Alq.

Thereafter, Alq was formed to have a thickness of 37.5 nm over the light emitting layer by an evaporation method using resistance heating to form an electron transporting layer.

Further, calcium fluoride was formed to have a thickness of 1 nm over the electron transporting layer by an evaporation method using resistance heating to form an electron injecting layer.

Lastly, aluminum was formed to have a thickness of 200 nm over the electron injecting layer by an evaporation method using resistance heating to form a second electrode, and accordingly, a comparative light emitting element 3 was manufactured.

Figure 28:
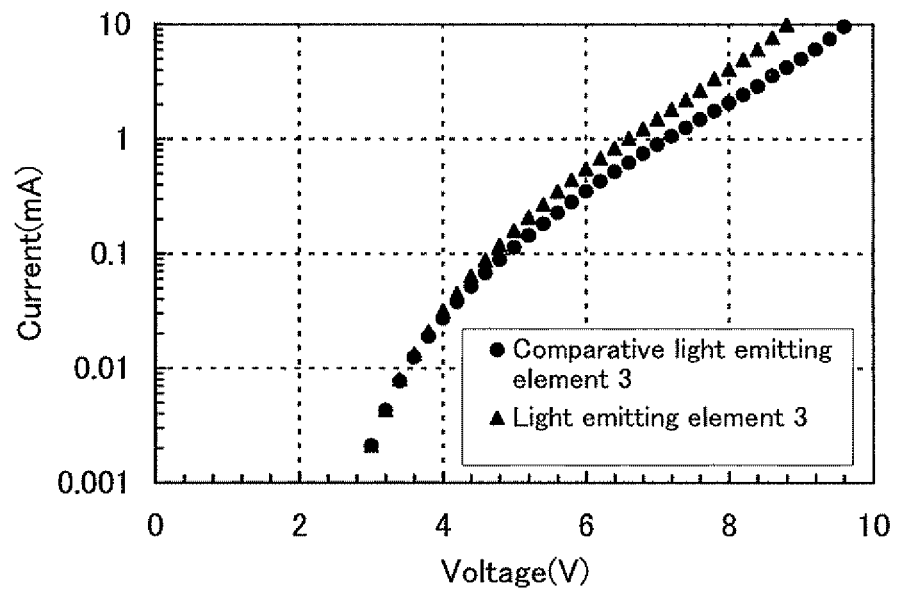
FIG. 28 is a view showing current-voltage characteristics of a light emitting element of the present invention and a comparative light emitting element.
Figure 29:
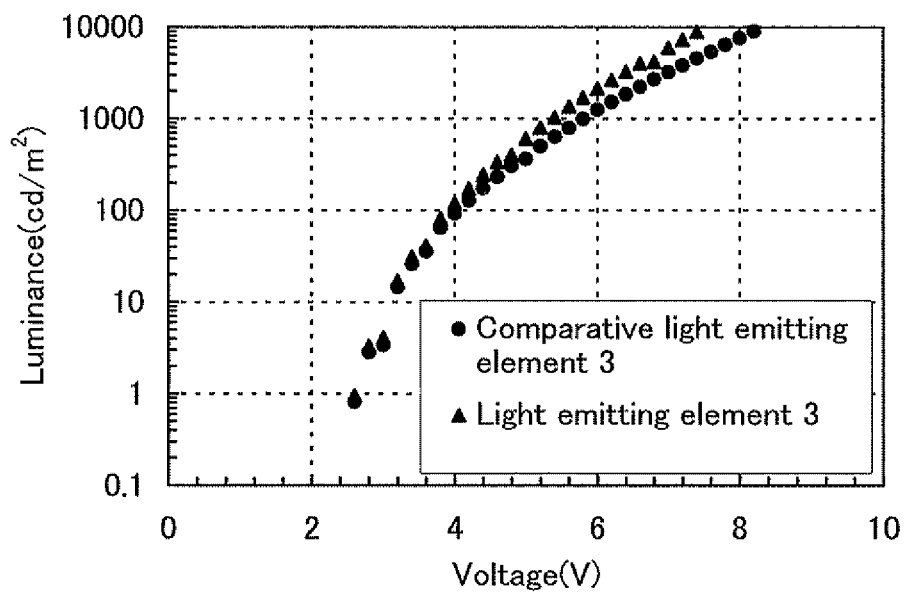
FIG. 29 is a view showing luminance-voltage characteristics of a light emitting element of the present invention and a comparative light emitting element.

FIG. 28 shows current-voltage characteristics of the light emitting element 3 of the present invention and the comparative light emitting element 3. Further, FIG. 29 shows luminance-voltage characteristics. According to FIGS. 28 and 29, in the light emitting element 3 of the present invention, a voltage necessary to obtain luminance of 1000 cd/m$^2$ was 5.4 V, and a current flowing at the time was 0.269 mA (current density was 6.73 mA/cm$^2$). In addition, current efficiency at this time was 15 cd/A, and power efficiency was 8.9 lm/W. On the other hand, in the comparative light emitting element 3, a voltage necessary to obtain luminance of 1000 cd/m$^2$ was 5.8 V, and a current flowing at the time was 0.282 mA (current density was 7.1 mA/cm$^2$). In addition, current efficiency at this time was 14 cd/A, and power efficiency was 7.6 lm/W.

Therefore, in a case where the light emitting element is made to emit light at luminance of approximately 1000 cd/m$^2$, it is revealed that both of a drive voltage and power consumption are reduced in the light emitting element 3 of the present invention using the composite material of the present invention compared with the comparative light emitting element 3 in which a layer using only an organic compound is formed as a layer which is in contact with an electrode.

From the above results, it is revealed that a drive voltage can be reduced by using the composite material of the present invention for the light emitting element. In addition, it is revealed that power consumption can be reduced.

Embodiment 5

In this embodiment, a light emitting element using a composite material of the present invention will be specifically described. Moreover, an effect of the present invention will be explained with a comparative example.
(Light Emitting Element 4)
First, indium tin oxide including silicon oxide was formed over a glass substrate by a sputtering method to form a first electrode. A thickness thereof was set 20 to 110 nm and an electrode area was set to 2 mm×2 mm.

Next, the substrate provided with the first electrode was fixed to a substrate holder provided in a vacuum evaporation system so that a surface over which the first electrode was formed was placed downward. Then, after the vacuum evaporation system was exhausted to reduce the pressure to approximately $10^{-4}$ Pa, PCzPCN1 and molybdenum oxide (VI) were co-evaporated over the first electrode to form a layer including a composite material of the present invention. A thickness thereof was set to 120 nm and a weight ratio of PCzPCN1 and molybdenum oxide (VI) was adjusted to be 1:0.5. The co-evaporation method indicates an evaporation method by which evaporation is concurrently conducted from a plurality of evaporation sources in one treatment chamber.

Next, NPB was formed to have a thickness of 10 nm by an evaporation method using resistance heating to form a hole transporting layer.

Further, a light emitting layer having a thickness of 37.5 nm was formed over the hole transporting layer by co-evaporation of Alq and coumarin 6. Here, a weight ratio of Alq and coumarin 6 was adjusted to be 1:0.01 (=Alq:coumarin 6). Accordingly, coumarin 6 is to be dispersed in a layer made of Alq.

Thereafter, Alq was formed to have a thickness of 37.5 nm over the light emitting layer by an evaporation method using resistance heating to form an electron transporting layer.

Further, calcium fluoride was formed to have a thickness of 1 nm over the electron transporting layer by an evaporation method using resistance heating to form an electron injecting layer.

Lastly, aluminum was formed to have a thickness of 200 nm over the electron injecting layer by an evaporation method using resistance heating to form a second electrode, and accordingly, a light emitting element 4 of the present invention was manufactured.

(Comparative Light Emitting Element 4)

First, indium tin oxide including silicon oxide was formed over a glass substrate by a sputtering method to form a first electrode. A thickness thereof was set to 110 nm and an electrode area was set to 2 mm×2 mm.

Next, the substrate provided with the first electrode was fixed to a substrate holder provided in a vacuum evaporation system so that a surface over which the first electrode was formed was placed downward. Thereafter, PCzPCN1 was formed to have a thickness of 50 nm by an evaporation method using resistance heating.

Subsequently, NPB was formed to have a thickness of 10 nm over the PCzPCN1 by an evaporation method using resistance heating.

Further, a light emitting layer having a thickness of 37.5 nm was formed over the NPB by co-evaporation of Alq and coumarin 6. Here, a weight ratio of Alq and coumarin 6 was adjusted to be 1:0.01 (=Alq:coumarin 6). Accordingly, coumarin 6 is to be dispersed in a layer made of Alq.

Thereafter, Alq was formed to have a thickness of 37.5 nm over the light emitting layer by an evaporation method using resistance heating to form an electron transporting layer.

Further, calcium fluoride was formed to have a thickness of 1 nm over the electron transporting layer by an evaporation method using resistance heating to form an electron injecting layer.

Lastly, aluminum was formed to have a thickness of 200 nm over the electron injecting layer by an evaporation method using resistance heating to form a second electrode, and accordingly, a comparative light emitting element 4 was manufactured.

Figure 30:
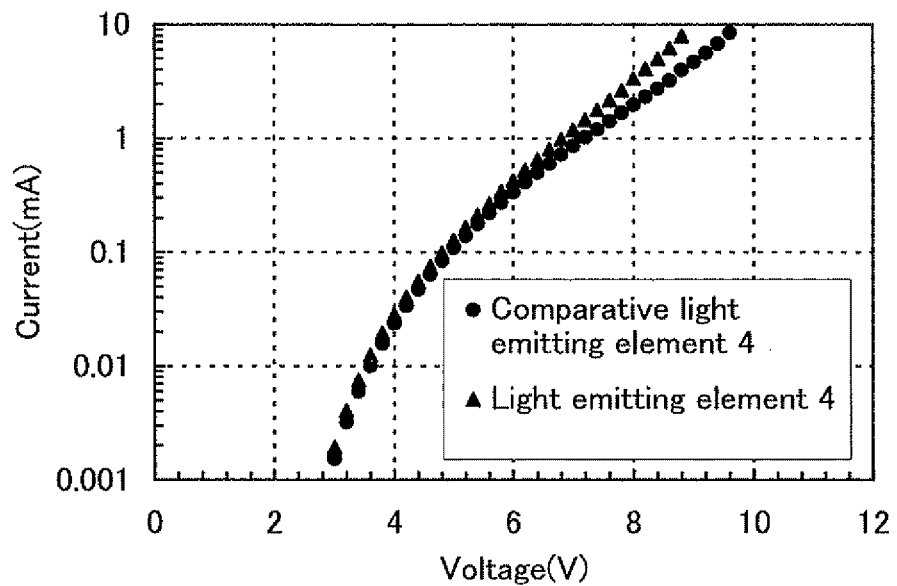
FIG. 30 is a view showing current-voltage characteristics of a light emitting element of the present invention and a comparative light emitting element.
Figure 31:
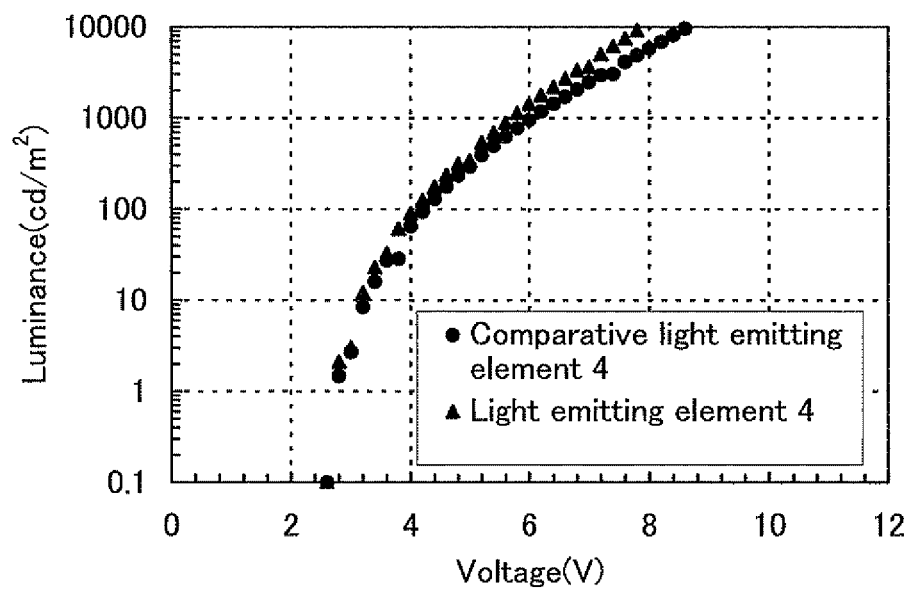
FIG. 31 is a view showing luminance-voltage characteristics of a light emitting element of the present invention and a comparative light emitting element.

FIG. 30 shows current-voltage characteristics of the light emitting element 4 of the present invention and the comparative light emitting element 4. Further, FIG. 31 shows luminance-voltage characteristics. According to FIGS. 30 and 31, in the light emitting element 4 of the present invention, a voltage necessary to obtain luminance of 890 cd/m$^2$ was 5.6 V, and a current flowing at the time was 0.267 mA (current density was 6.67 mA/cm$^2$). In addition, current efficiency at this time was 13 cd/A, and power efficiency was 7.5 lm/W. On the other hand, in the comparative light emitting element 4, a voltage necessary to obtain luminance of 950 cd/m$^2$ was 6.0 V, and a current flowing at the time was 0.336 mA (current density was 8.40 mA/cm$^2$). In addition, current efficiency at this time was 11 cd/A, and power efficiency was 5.9 lm/W.

Therefore, in a case where the light emitting element is made to emit light at luminance of approximately 1000 cd/m$^2$, it is revealed that both of a drive voltage and power consumption are reduced in the light emitting element 4 of the present invention using the composite material of the present invention compared with the comparative light emitting element 4 in which a layer using only an organic compound is formed as a layer which is in contact with an electrode.

From the above results, it is revealed that a drive voltage can be reduced by using the composite material of the present invention for the light emitting element. In addition, it is revealed that power consumption can be reduced.

Embodiment 6

In this embodiment, a light emitting element using a composite material of the present invention will be specifically described. Moreover, an effect of the present invention will be explained with a comparative example.

(Light Emitting Element 5)

First, indium tin oxide including silicon oxide was formed over a glass substrate by a sputtering method to form a first electrode. A thickness thereof was set to 110 nm and an electrode area was set to 2 mm×2 mm.

Next, the substrate provided with the first electrode was fixed to a substrate holder provided in a vacuum evaporation system so that a surface over which the first electrode was formed was placed downward. Then, after the vacuum evaporation system was exhausted to reduce the pressure to approximately $10^{-4}$ Pa, CBP and molybdenum oxide (VI) were co-evaporated over the first electrode to form a layer including a composite material of the present invention. A thickness thereof was set to 120 nm and a weight ratio of CBP and molybdenum oxide (VI) was adjusted to be 1:0.5. The co-evaporation method indicates an evaporation method by which evaporation is concurrently conducted from a plurality of evaporation sources in one treatment chamber.

Next, NPB was formed to have a thickness of 10 nm by an evaporation method using resistance heating to form a hole transporting layer.

Further, a light emitting layer having a thickness of 37.5 nm was formed over the hole transporting layer by co-evaporation of Alq and coumarin 6. Here, a weight ratio of Alq and coumarin 6 was adjusted to be 1:0.01 (=Alq:coumarin 6). Accordingly, coumarin 6 is to be dispersed in a layer made of Alq.

Thereafter, Alq was formed to have a thickness of 37.5 nm over the light emitting layer by an evaporation method using resistance heating to form an electron transporting layer.

Further, calcium fluoride was formed to have a thickness of 1 nm over the electron transporting layer by an evaporation method using resistance heating to form an electron injecting layer.

Lastly, aluminum was formed to have a thickness of 200 nm over the electron injecting layer by an evaporation method using resistance heating to form a second electrode, and accordingly, a light emitting element 5 of the present invention was manufactured.

(Comparative Light Emitting Element 5)

First, indium tin oxide including silicon oxide was formed over a glass substrate by a sputtering method to form a first electrode. A thickness thereof was set to 110 nm and an electrode area was set to 2 mm×2 mm.

Next, the substrate provided with the first electrode was fixed to a substrate holder provided in a vacuum evaporation system so that a surface over which the first electrode was formed was placed downward. Thereafter, CBP was formed to have a thickness of 50 nm by an evaporation method using resistance heating.

Subsequently, NPB was formed to have a thickness of 10 nm over the CBP by an evaporation method using resistance heating.

Further, a light emitting layer having a thickness of 37.5 nm was formed over the NPB by co-evaporation of Alq and coumarin 6. Here, a weight ratio of Alq and coumarin 6 was adjusted to be 1:0.01 (=Alq:coumarin 6). Accordingly, coumarin 6 is to be dispersed in a layer made of Alq.

Thereafter, Alq was formed to have a thickness of 37.5 nm over the light emitting layer by an evaporation method using resistance heating to form an electron transporting layer.

Further, calcium fluoride was formed to have a thickness of 1 nm over the electron transporting layer by an evaporation method using resistance heating to form an electron injecting layer.

Lastly, aluminum was formed to have a thickness of 200 nm over the electron injecting layer by an evaporation method using resistance heating to form a second electrode, and accordingly, a comparative light emitting element 5 was manufactured.

Figure 32:
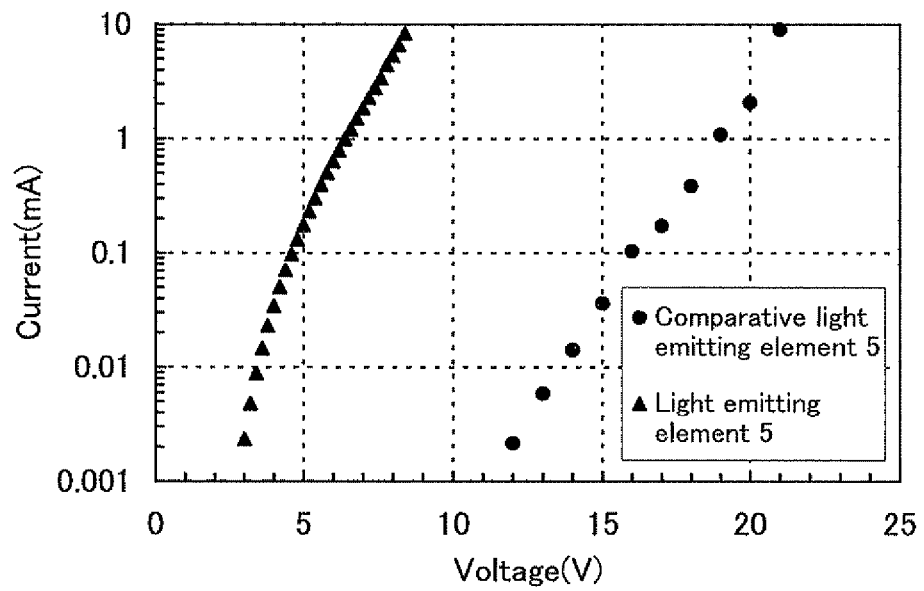
FIG. 32 is a view showing current-voltage characteristics of a light emitting element of the present invention and a comparative light emitting element.
Figure 33:
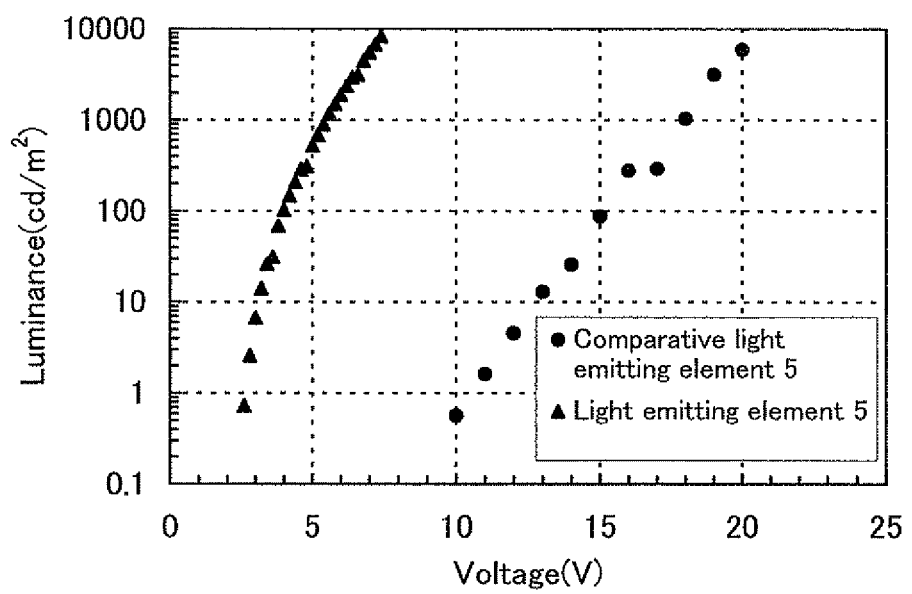
FIG. 33 is a view showing luminance-voltage characteristics of a light emitting element of the present invention and a comparative light emitting element.

FIG. 32 shows current-voltage characteristics of the light emitting element 5 of the present invention and the comparative light emitting element 5. Further, FIG. 33 shows luminance-voltage characteristics. According to FIGS. 32 and 33, in the light emitting element 5 of the present invention, a voltage necessary to obtain luminance of 890 cd/m$^2$ was 5.4 V, and a current flowing at the time was 0.301 mA (current density was 7.52 mA/cm$^2$). In addition, current efficiency at this time was 12 cd/A, and power efficiency was 6.9 lm/W. On the other hand, in the comparative light emitting element 5, a voltage necessary to obtain luminance of 1000 cd/m$^2$ was 18 V, and a current flowing at the time was 0.386 mA (current density was 9.65 mA/cm$^2$). In addition, current efficiency at this time was 11 cd/A, and power efficiency was 1.9 lm/W.

Therefore, in a case where the light emitting element is made to emit light at luminance of approximately 1000 cd/m$^2$, it is revealed that both of a drive voltage and power consumption are reduced in the light emitting element 5 of the present invention using the composite material of the present invention compared with the comparative light emitting element 5 in which a layer using only an organic compound is formed as a layer which is in contact with an electrode.

From the above results, it is revealed that a drive voltage can be reduced by using the composite material of the present invention for the light emitting element. In addition, it is revealed that power consumption can be reduced.

Embodiment 7

In this embodiment, a light emitting element using a composite material of the present invention will be specifically described. Moreover, an effect of the present invention will be explained with a comparative example.
(Light Emitting Element 6)

First, indium tin oxide including silicon oxide was formed over a glass substrate by a sputtering method to form a first electrode. A thickness thereof was set to 110 nm and an electrode area was set to 2 mm×2 mm.

Next, the substrate provided with the first electrode was fixed to a substrate holder provided in a vacuum evaporation system so that a surface over which the first electrode was formed was placed downward. Then, after the vacuum evaporation system was exhausted to reduce the pressure to approximately 10$^{-4}$ Pa, t-BuDNA and molybdenum oxide (VI) were co-evaporated over the first electrode to form a layer including a composite material of the present invention. A thickness thereof was set to 120 nm and a weight ratio of t-BuDNA and molybdenum oxide (VI) was adjusted to be 1:0.5. The co-evaporation method indicates an evaporation method by which evaporation is concurrently conducted from a plurality of evaporation sources in one treatment chamber.

Next, NPB was formed to have a thickness of 10 nm by an evaporation method using resistance heating to form a hole transporting layer.

Further, a light emitting layer having a thickness of 37.5 nm was formed over the hole transporting layer by co-evaporation of Alq and coumarin 6. Here, a weight ratio of Alq and coumarin 6 was adjusted to be 1:0.01 (=Alq:coumarin 6). Accordingly, coumarin 6 is to be dispersed in a layer made of Alq.

Thereafter, Alq was formed to have a thickness of 37.5 nm over the light emitting layer by an evaporation method using resistance heating to form an electron transporting layer.

Further, calcium fluoride was formed to have a thickness of 1 nm over the electron transporting layer by an evaporation method using resistance heating to form an electron injecting layer.

Lastly, aluminum was formed to have a thickness of 200 nm over the electron injecting layer by an evaporation method using resistance heating to form a second electrode, and accordingly, a light emitting element 6 of the present invention was manufactured.
(Comparative Light Emitting Element 6)

First, indium tin oxide including silicon oxide was formed over a glass substrate by a sputtering method to form a first electrode. A thickness thereof was set to 110 nm and an electrode area was set to 2 mm×2 mm.

Next, the substrate provided with the first electrode was fixed to a substrate holder provided in a vacuum evaporation system so that a surface over which the first electrode was formed was placed downward. Thereafter, t-BuDNA was formed to have a thickness of 50 nm by an evaporation method using resistance heating.

Subsequently, NPB was formed to have a thickness of 10 nm over the t-BuDNA by an evaporation method using resistance heating.

Further, a light emitting layer having a thickness of 37.5 nm was formed over the NPB by co-evaporation of Alq and coumarin 6. Here, a weight ratio of Alq and coumarin 6 was adjusted to be 1:0.01 (=Alq:coumarin 6). Accordingly, coumarin 6 is to be dispersed in a layer made of Alq.

Thereafter, Alq was formed to have a thickness of 37.5 nm over the light emitting layer by an evaporation method using resistance heating to form an electron transporting layer.

Further, calcium fluoride was formed to have a thickness of 1 nm over the electron transporting layer by an evaporation method using resistance heating to form an electron injecting layer.

Lastly, aluminum was formed to have a thickness of 200 nm over the electron injecting layer by an evaporation method using resistance heating to form a second electrode, and accordingly, a comparative light emitting element 6 was manufactured.

Figure 34:
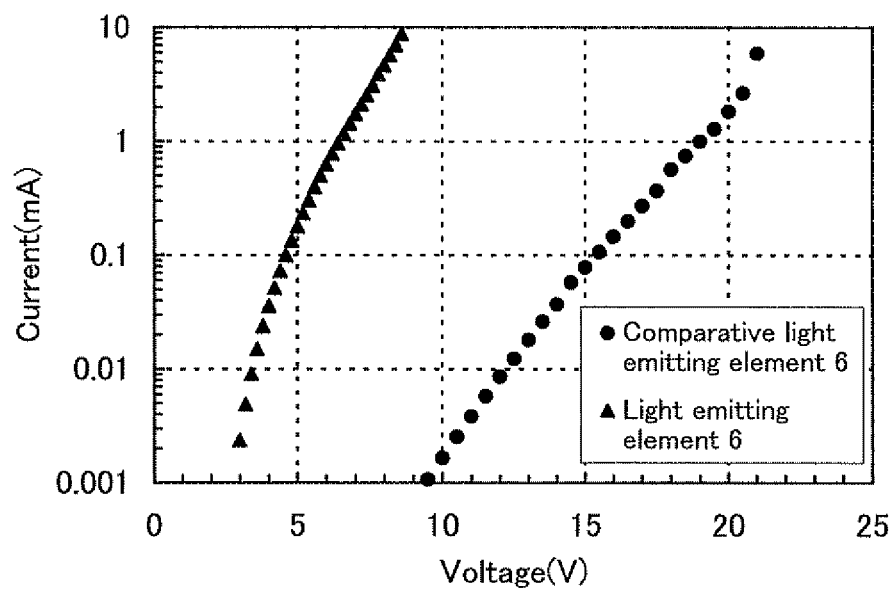
FIG. 34 is a view showing current-voltage characteristics of a light emitting element of the present invention and a comparative light emitting element.
Figure 35:
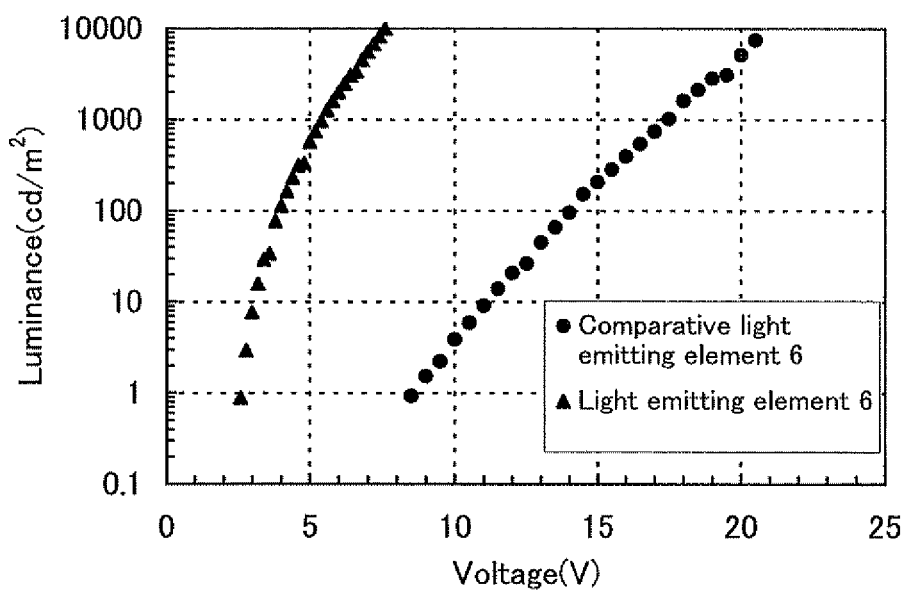
FIG. 35 is a view showing luminance-voltage characteristics of a light emitting element of the present invention and a comparative light emitting element.

FIG. 34 shows current-voltage characteristics of the light emitting element 6 of the present invention and the comparative light emitting element 6. Further, FIG. 35 shows luminance-voltage characteristics. According to FIGS. 34 and 35, in the light emitting element 6 of the present invention, a voltage necessary to obtain luminance of 970 cd/m$^2$ was 5.4 V, and a current flowing at the time was 0.304 mA (current density was 7.59 mA/cm$^2$). In addition, current efficiency at this time was 13 cd/A, and power efficiency was 7.4 lm/W. On the other hand, in the comparative light emitting element 6, a voltage necessary to obtain luminance of 1000 cd/m$^2$ was 17.5 V, and a current flowing at the time was 0.369 mA (current density was 9.22 mA/cm$^2$). In addition, current efficiency at this time was 11 cd/A, and power efficiency was 2.0 lm/W.

Therefore, in a case where the light emitting element is made to emit light at luminance of approximately 1000 cd/m$^2$, it is revealed that both of a drive voltage and power consumption are reduced in the light emitting element 6 of the present invention using the composite material of the present invention compared with the comparative light emitting element 6 in which a layer using only an organic compound is formed as a layer which is in contact with an electrode.

From the above results, it is revealed that a drive voltage can be reduced by using the composite material of the present invention for the light emitting element. In addition, it is revealed that power consumption can be reduced.

Embodiment 8

In this embodiment, a light emitting element using a composite material of the present invention will be specifically described. Moreover, an effect of the present invention will be explained with a comparative example.
(Light Emitting Element 7)

First, indium tin oxide including silicon oxide was formed over a glass substrate by a sputtering method to form a first electrode. A thickness thereof was set to 110 nm and an electrode area was set to 2 mm×2 mm.

Next, the substrate provided with the first electrode was fixed to a substrate holder provided in a vacuum evaporation system so that a surface over which the first electrode was formed was placed downward. Then, after the vacuum evaporation system was exhausted to reduce the pressure to approximately 10$^{-4}$ Pa, DPVBi and molybdenum oxide (VI) were co-evaporated over the first electrode to form a layer including a composite material of the present invention. A thickness thereof was set to 120 nm and a weight ratio of DPVBi and molybdenum oxide (VI) was adjusted to be 1:0.5. The co-evaporation method indicates an evaporation method by which evaporation is concurrently conducted from a plurality of evaporation sources in one treatment chamber.

Next, NPB was formed to have a thickness of 10 nm by an evaporation method using resistance heating to form a hole transporting layer.

Further, a light emitting layer having a thickness of 37.5 nm was formed over the hole transporting layer by co-evaporation of Alq and coumarin 6. Here, a weight ratio of Alq and coumarin 6 was adjusted to be 1:0.01 (=Alq:coumarin 6). Accordingly, coumarin 6 is to be dispersed in a layer made of Alq.

Thereafter, Alq was formed to have a thickness of 37.5 nm over the light emitting layer by an evaporation method using resistance heating to form an electron transporting layer.

Further, calcium fluoride was formed to have a thickness of 1 nm over the electron transporting layer by an evaporation method using resistance heating to form an electron injecting layer.

Lastly, aluminum was formed to have a thickness of 200 nm over the electron injecting layer by an evaporation method using resistance heating to form a second electrode, and accordingly, a light emitting element 7 of the present invention was manufactured.

(Comparative Light Emitting Element 7)

First, indium tin oxide including silicon oxide was formed over a glass substrate by a sputtering method to form a first electrode. A thickness thereof was set to 110 nm and an electrode area was set to 2 mm×2 mm.

Next, the substrate provided with the first electrode was fixed to a substrate holder provided in a vacuum evaporation system so that a surface over which the first electrode was formed was placed downward. Thereafter, DPVBi was formed to have a thickness of 50 nm by an evaporation method using resistance heating.

Subsequently, NPB was formed to have a thickness of 10 nm over the DPVBi by an evaporation method using resistance heating.

Further, a light emitting layer having a thickness of 37.5 nm was formed over the NPB by co-evaporation of Alq and coumarin 6. Here, a weight ratio of Alq and coumarin 6 was adjusted to be 1:0.01 (=Alq:coumarin 6). Accordingly, coumarin 6 is to be dispersed in a layer made of Alq.

Thereafter, Alq was formed to have a thickness of 37.5 nm over the light emitting layer by an evaporation method using resistance heating to form an electron transporting layer.

Further, calcium fluoride was formed to have a thickness of 1 nm over the electron transporting layer by an evaporation method using resistance heating to form an electron injecting layer.

Lastly, aluminum was formed to have a thickness of 200 nm over the electron injecting layer by an evaporation method using resistance heating to form a second electrode, and accordingly, a comparative light emitting element 7 was manufactured.

Figure 36:
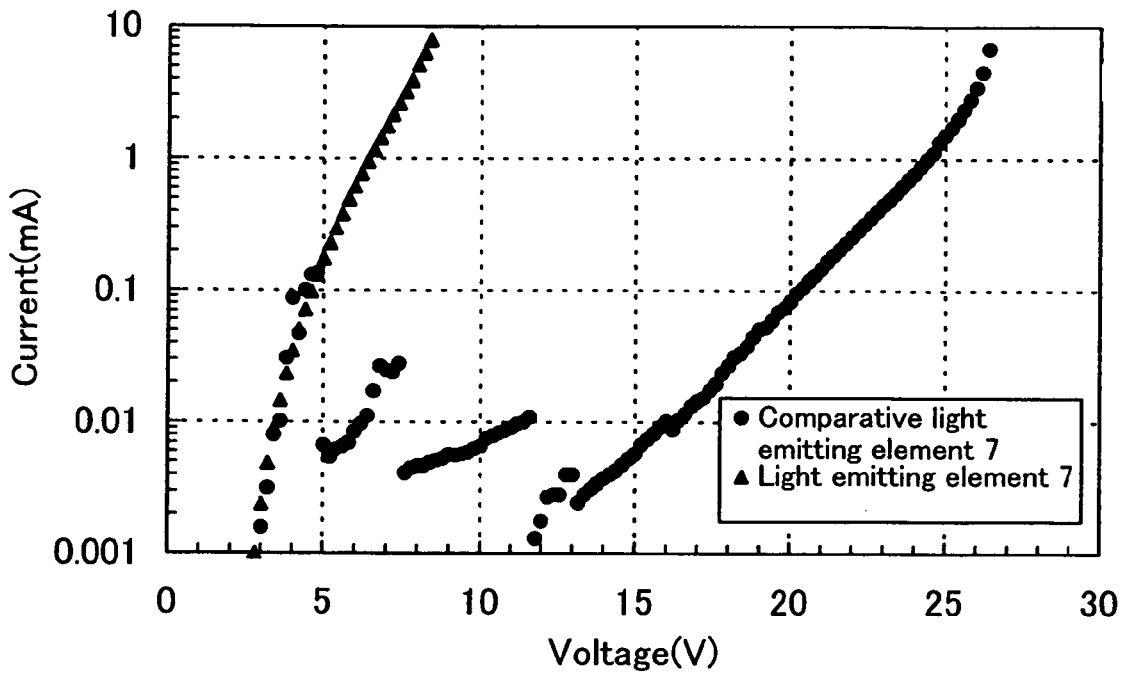
FIG. 36 is a view showing current-voltage characteristics of a light emitting element of the present invention and a comparative light emitting element.
Figure 37:
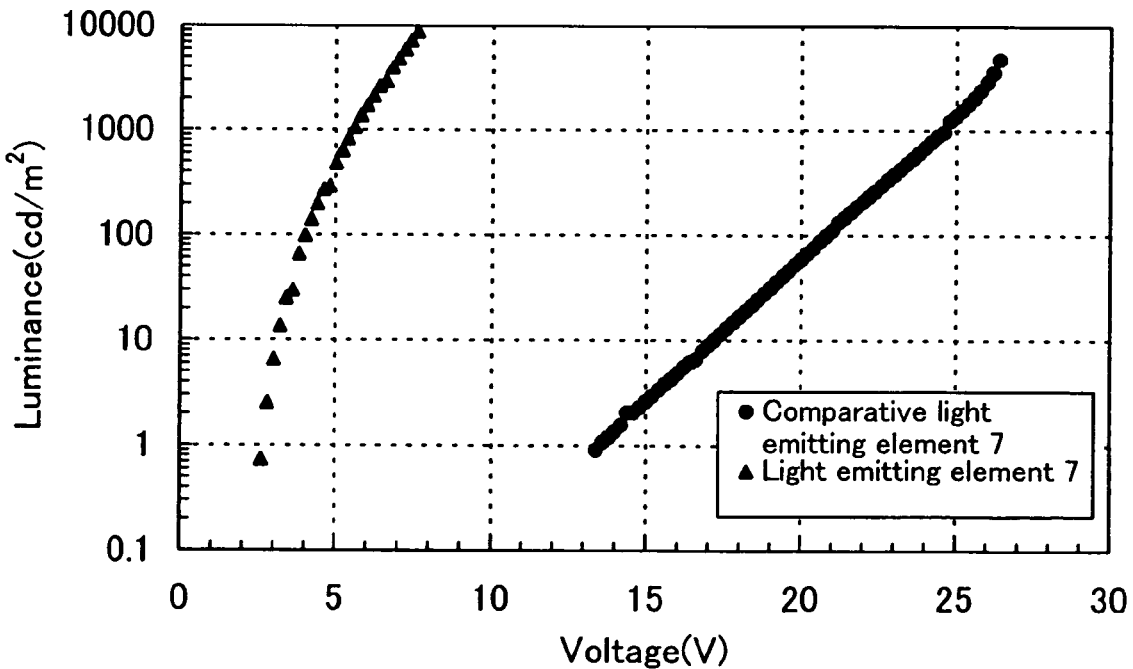
FIG. 37 is a view showing luminance-voltage characteristics of a light emitting element of the present invention and a comparative light emitting element.

FIG. 36 shows current-voltage characteristics of the light emitting element 7 of the present invention and the comparative light emitting element 7. Further, FIG. 37 shows luminance-voltage characteristics. According to FIGS. 36 and 37, in the light emitting element 7 of the present invention, a voltage necessary to obtain luminance of 1100 cd/m$^2$ was 5.6 V, and a current flowing at the time was 0.381 mA (current density was 9.53 mA/cm$^2$). In addition, current efficiency at this time was 11 cd/A, and power efficiency was 6.3 lm/W. On the other hand, in the comparative light emitting element 7, a voltage necessary to obtain luminance of 960 cd/m$^2$ was 24.6 V, and a current flowing at the time was 1.11 mA (current density was 27.8 mA/cm$^2$). In addition, current efficiency at this time was 3.5 cd/A, and power efficiency was 0.44 lm/W.

Therefore, in a case where the light emitting element is made to emit light at luminance of approximately 1000 cd/m$^2$, it is revealed that both of a drive voltage and power consumption are reduced in the light emitting element 7 of the present invention using the composite material of the present invention compared with the comparative light emitting element 7 in which a layer using only an organic compound is formed as a layer which is in contact with an electrode.

From the above results, it is revealed that a drive voltage can be reduced by using the composite material of the present invention for the light emitting element. In addition, it is revealed that power consumption can be reduced.

Embodiment 9

In this embodiment, a light emitting element using a composite material of the present invention will be specifically described.
(Light Emitting Element 8)

First, indium tin oxide including silicon oxide was formed over a glass substrate by a sputtering method to form a first electrode. A thickness thereof was set to 110 nm and an electrode area was set to 2 mm×2 mm.

Next, the substrate provided with the first electrode was fixed to a substrate holder provided in a vacuum evaporation system so that a surface over which the first electrode was formed was placed downward. Then, after the vacuum evaporation system was exhausted to reduce the pressure to approximately $10^{-4}$ Pa, Alq and molybdenum oxide (VI) were co-evaporated over the first electrode to form a layer including a composite material of the present invention. A thickness thereof was set to 50 nm and a weight ratio of Alq and molybdenum oxide (VI) was adjusted to be 1:0.5. The co-evaporation method indicates an evaporation method by which evaporation is concurrently conducted from a plurality of evaporation sources in one treatment chamber.

Next, NPB was formed to have a thickness of 10 nm by an evaporation method using resistance heating to form a hole transporting layer.

Further, a light emitting layer having a thickness of 40 nm was formed over the hole transporting layer by co-evaporation of Alq and coumarin 6. Here, a weight ratio of Alq and coumarin 6 was adjusted to be 1:0.01 (=Alq:coumarin 6). Accordingly, coumarin 6 is to be dispersed in a layer made of Alq.

Thereafter, Alq was formed to have a thickness of 10 nm over the light emitting layer by an evaporation method using resistance heating to form an electron transporting layer.

Further, an electron injecting layer having a thickness of 30 nm is formed over the electron transporting layer by co-evaporation of Alq and lithium. Here, a weight ratio of Alq and lithium was adjusted to be 1:0.01 (=Alq:lithium). Accordingly, lithium is to be dispersed in a layer made of Alq.

Lastly, aluminum was formed to have a thickness of 200 nm over the electron injecting layer by an evaporation method using resistance heating to form a second electrode, and accordingly, a light emitting element 8 of the present invention was manufactured.

Figure 38:
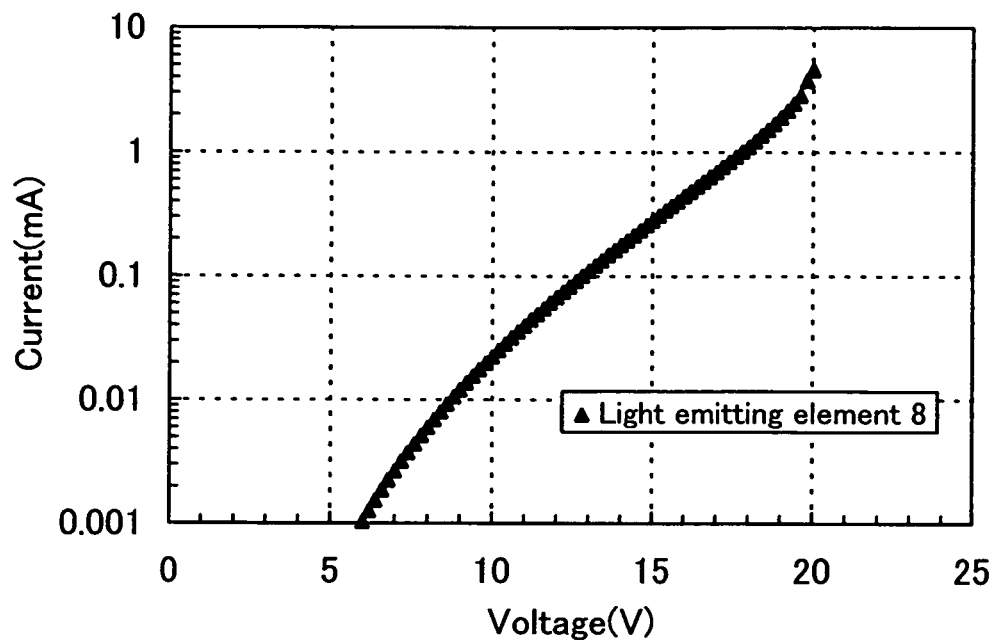
FIG. 38 is a view showing current-voltage characteristics of a light emitting element of the present invention.
Figure 39:
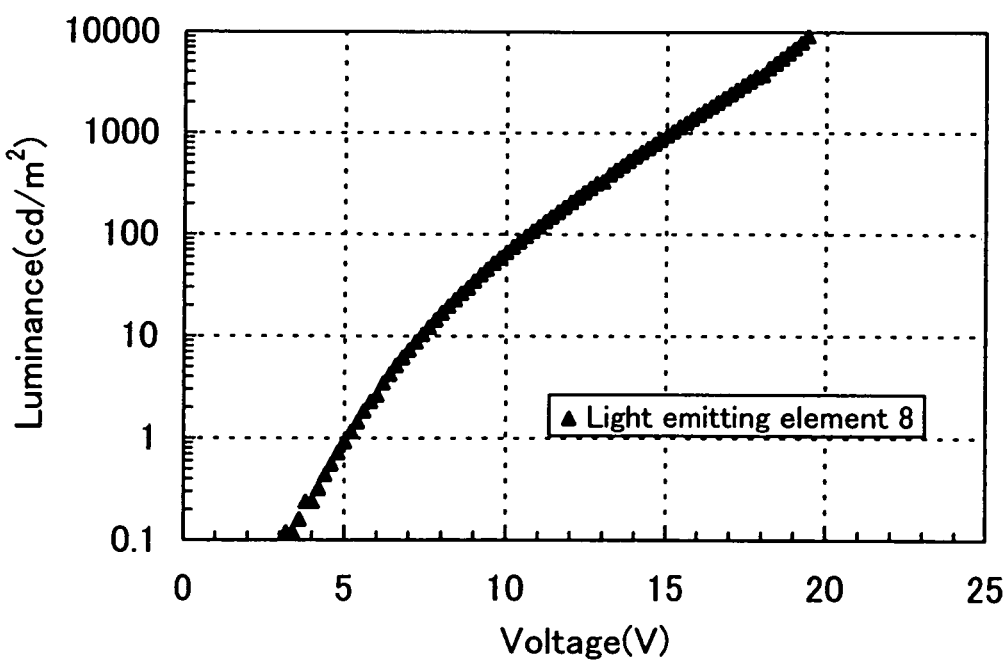
FIG. 39 is a view showing luminance-voltage characteristics of a light emitting element of the present invention.

FIG. 38 shows current-voltage characteristics of the light emitting element 8 of the present invention. Further, FIG. 39 shows luminance-voltage characteristics. According to FIGS. 38 and 39, in the light emitting element 8 of the present invention, a voltage at which light emission of 1 cd/m$^2$ or more is obtained was 5.2 V, and a voltage at which light emission of 0.1 cd/m$^2$ or more is obtained was 3.2 V.

When attention is focused on a light emission start voltage (voltage at which light emission of 0.1 cd/m$^2$ or more is obtained), the light emitting element 8 is by no means inferior to the light emitting elements 1 to 7 described above (light emission start voltage is 2.4 V to 2.6 V). Accordingly, it was revealed that the compound in which an oxidation peak potential as described in the measurement example in Embodiment 1 was observed could be used for the composite material of the present invention even if the compound is a compound having an electron transporting property such as Alq. In addition, it was revealed that a light emitting element can be operated sufficiently using the composite material.

(Comparative Light Emitting Element 11)

First, indium tin oxide including silicon oxide was formed over a glass substrate by a sputtering method to form a first electrode. A thickness thereof was set to 110 nm and an electrode area was set to 2 mm×2 mm.

Next, the substrate provided with the first electrode was fixed to a substrate holder provided in a vacuum evaporation system so that a surface over which the first electrode was formed was placed downward. Then, after the vacuum evaporation system was exhausted to reduce the pressure to approximately $10^{-4}$ Pa, BCP and molybdenum oxide (VI) were co-evaporated over the first electrode to form a layer including a composite material of the present invention. A thickness thereof was set to 50 nm and a weight ratio of BCP and molybdenum oxide (VI) was adjusted to be 1:0.5. The co-evaporation method indicates an evaporation method by which evaporation is concurrently conducted from a plurality of evaporation sources in one treatment chamber.

Next, NPB was formed to have a thickness of 10 nm by an evaporation method using resistance heating to form a hole transporting layer.

Further, a light emitting layer having a thickness of 40 nm was formed over the hole transporting layer by co-evaporation of Alq and coumarin 6. Here, a weight ratio of Alq and coumarin 6 was adjusted to be 1:0.01 (=Alq:coumarin 6). Accordingly, coumarin 6 is to be dispersed in a layer made of Alq.

Thereafter, Alq was formed to have a thickness of 10 nm over the light emitting layer by an evaporation method using resistance heating to form an electron transporting layer.

Further, an electron injecting layer having a thickness of 30 nm is formed over the electron transporting layer by co-evaporation of Alq and lithium. Here, a weight ratio of Alq and lithium was adjusted to be 1:0.01 (=Alq:lithium). Accordingly, lithium is to be dispersed in a layer made of Alq.

Lastly, aluminum was formed to have a thickness of 200 nm over the electron injecting layer by an evaporation method using resistance heating to form a second electrode, and accordingly, a comparative light emitting element 11 was manufactured.

Figure 40:
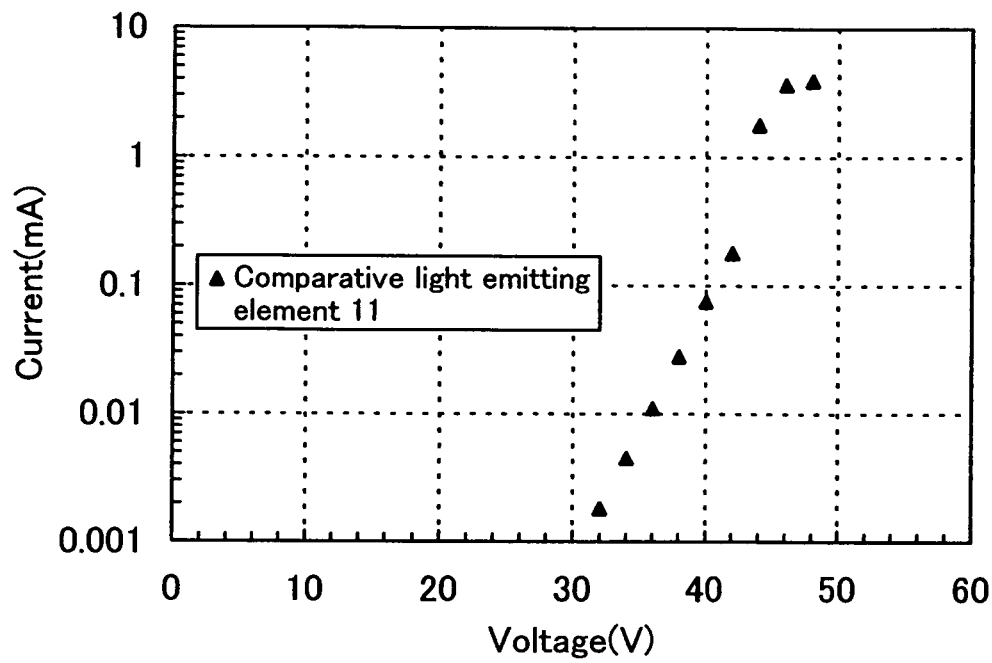
FIG. 40 is a view showing current-voltage characteristics of a comparative light emitting element.
Figure 41:
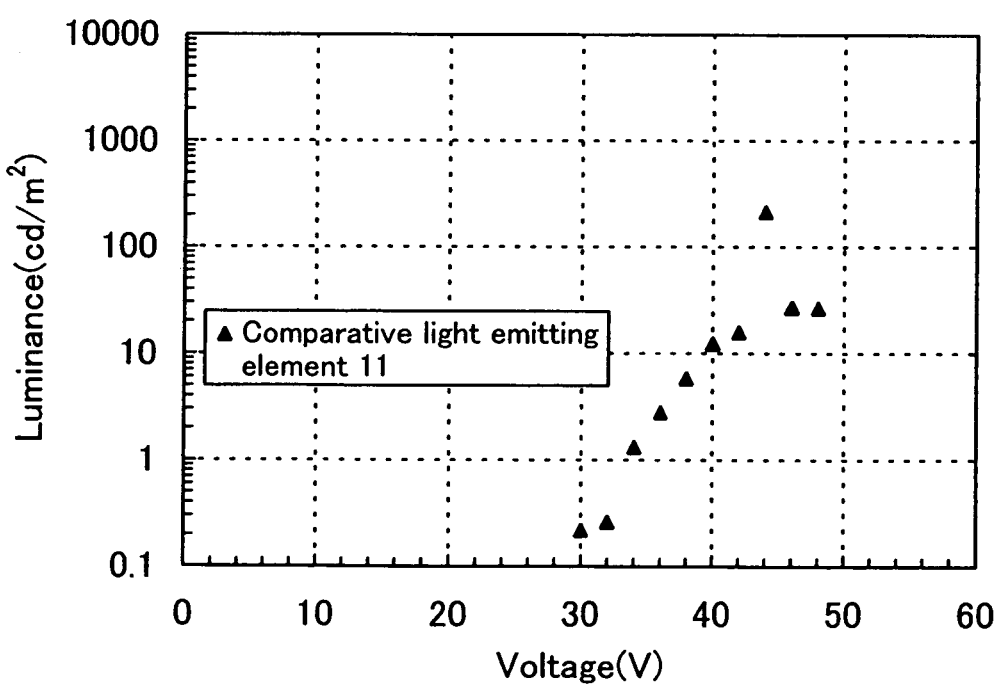
FIG. 41 is a view showing luminance-voltage characteristics of a comparative light emitting element.

FIG. 40 shows current-voltage characteristics of the comparative light emitting element 11. Further, FIG. 41 shows luminance-voltage characteristics. According to FIGS. 40 and 41, it is revealed that high voltage is necessary for the comparative light emitting element to obtain light emission at fixed luminance. Specifically, in the comparative light emitting element 11, a voltage at which light emission of 1 cd/m$^2$ or more is obtained was 34 V, and a voltage at which light emission of 0.1 cd/m$^2$ or more is obtained (light emission start voltage) was 30 V.

As described above, it was revealed that a compound in which an oxidation peak potential as described in the comparative measurement example in Embodiment 1 was not observed was difficult to be used for the composite material of the present invention. In addition, it was revealed that a light emitting element was difficult to be operated sufficiently using the composite material.

(Comparative Light Emitting Element 12)

First, indium tin oxide including silicon oxide was formed over a glass substrate by a sputtering method to form a first electrode. A thickness thereof was set to 110 nm and an electrode area was set to 2 mm×2 mm.

Next, the substrate provided with the first electrode was fixed to a substrate holder provided in a vacuum evaporation system so that a surface over which the first electrode was formed was placed downward. Then, after the vacuum evaporation system was exhausted to reduce the pressure to approximately $10^{-4}$ Pa, OXD-7 and molybdenum oxide (VI) were co-evaporated over the first electrode to form a layer including a composite material of the present invention. A thickness thereof was set to 50 nm and a weight ratio of OXD-7 and molybdenum oxide (VI) was adjusted to be 1:0.5. The co-evaporation method indicates an evaporation method by which evaporation is concurrently conducted from a plurality of evaporation sources in one treatment chamber.

Next, NPB was formed to have a thickness of 10 nm by an evaporation method using resistance heating to form a hole transporting layer.

Further, a light emitting layer having a thickness of 40 nm was formed over the hole transporting layer by co-evaporation of Alq and coumarin 6. Here, a weight ratio of Alq and coumarin 6 was adjusted to be 1:0.01 (=Alq:coumarin 6). Accordingly, coumarin 6 is to be dispersed in a layer made of Alq.

Thereafter, Alq was formed to have a thickness of 10 nm over the light emitting layer by an evaporation method using resistance heating to form an electron transporting layer.

Further, an electron injecting layer having a thickness of 30 nm is formed over the electron transporting layer by co-evaporation of Alq and lithium. Here, a weight ratio of Alq and lithium was adjusted to be 1:0.01 (=Alq:lithium). Accordingly, lithium is to be dispersed in a layer made of Alq.

Lastly, aluminum was formed to have a thickness of 200 nm over the electron injecting layer by an evaporation method using resistance heating to form a second electrode, and accordingly, a comparative light emitting element 11 was manufactured.

Figure 42:
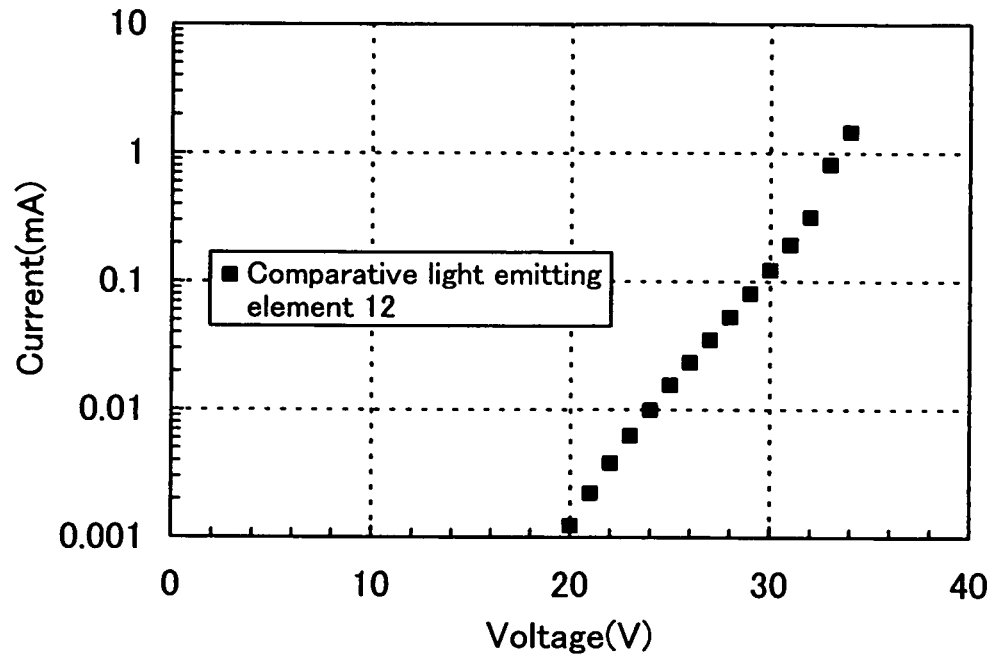
FIG. 42 is a view showing current-voltage characteristics of a comparative light emitting element.
Figure 43:
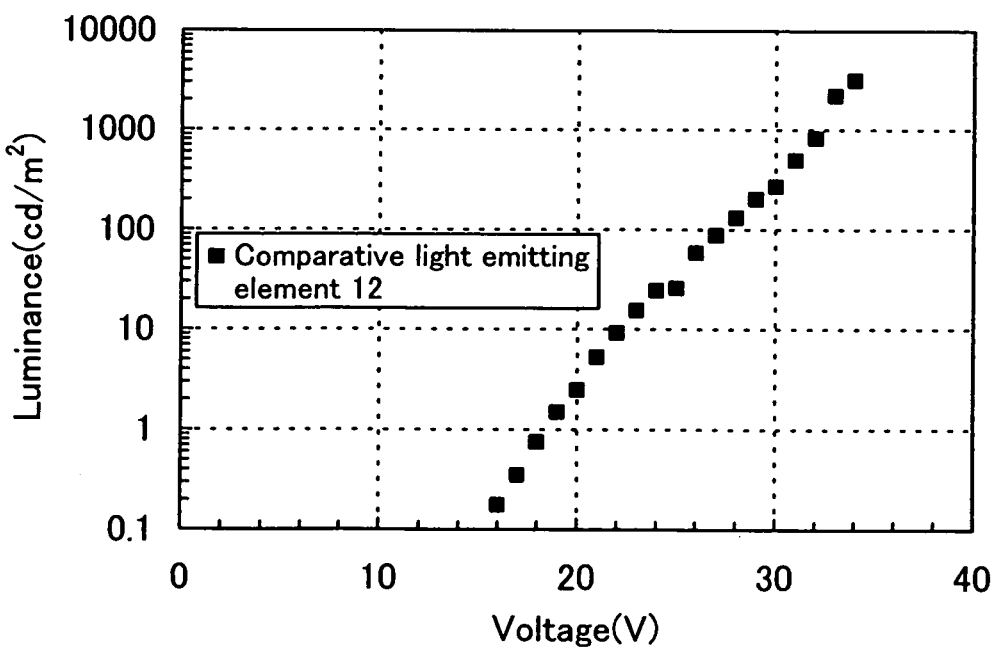
FIG. 43 is a view showing luminance-voltage characteristics of a comparative light emitting element.

FIG. 42 shows current-voltage characteristics of the comparative light emitting element 12. Further, FIG. 43 shows luminance-voltage characteristics. According to FIGS. 42 and 43, it is revealed that high voltage is necessary for the comparative light emitting element to obtain light emission at fixed luminance. Specifically, in the comparative light emitting element 12, a voltage at which light emission of 1 cd/m$^2$ or more is obtained was 19 V, and a voltage at which light emission of 0.1 cd/m$^2$ or more is obtained (light emission start voltage) was 16 V.

As described above, it was revealed that a compound in which an oxidation peak potential as described in the comparative measurement example in Embodiment 1 was not observed was difficult to be used for the composite material of the present invention. In addition, it was revealed that a light emitting element was difficult to be operated sufficiently using the composite material.

(Comparative Light Emitting Element 13)

First, indium tin oxide including silicon oxide was formed over a glass substrate by a sputtering method to form a first electrode. A thickness thereof was set to 110 nm and an electrode area was set to 2 mm×2 mm.

Next, the substrate provided with the first electrode was fixed to a substrate holder provided in a vacuum evaporation system so that a surface over which the first electrode was formed was placed downward. Then, after the vacuum evaporation system was exhausted to reduce the pressure to approximately 10$^{-4}$ Pa, TPBi and molybdenum oxide (VI) were co-evaporated over the first electrode to form a layer including a composite material of the present invention. A thickness thereof was set to 50 nm and a weight ratio of TPBi and molybdenum oxide (VI) was adjusted to be 1:0.5. The co-evaporation method indicates an evaporation method by which evaporation is concurrently conducted from a plurality of evaporation sources in one treatment chamber.

Next, NPB was formed to have a thickness of 10 nm by an evaporation method using resistance heating to form a hole transporting layer.

Further, a light emitting layer having a thickness of 40 nm was formed over the hole transporting layer by co-evaporation of Alq and coumarin 6. Here, a weight ratio of Alq and coumarin 6 was adjusted to be 1:0.01 (=Alq:coumarin 6). Accordingly, coumarin 6 is to be dispersed in a layer made of Alq.

Thereafter, Alq was formed to have a thickness of 10 nm over the light emitting layer by an evaporation method using resistance heating to form an electron transporting layer.

Further, an electron injecting layer having a thickness of 30 nm is formed over the electron transporting layer by co-evaporation of Alq and lithium. Here, a weight ratio of Alq and lithium was adjusted to be 1:0.01 (=Alq:lithium). Accordingly, lithium is to be dispersed in a layer made of Alq.

Lastly, aluminum was formed to have a thickness of 200 nm over the electron injecting layer by an evaporation method using resistance heating to form a second electrode, and accordingly, a comparative light emitting element 13 was manufactured.

Figure 44:
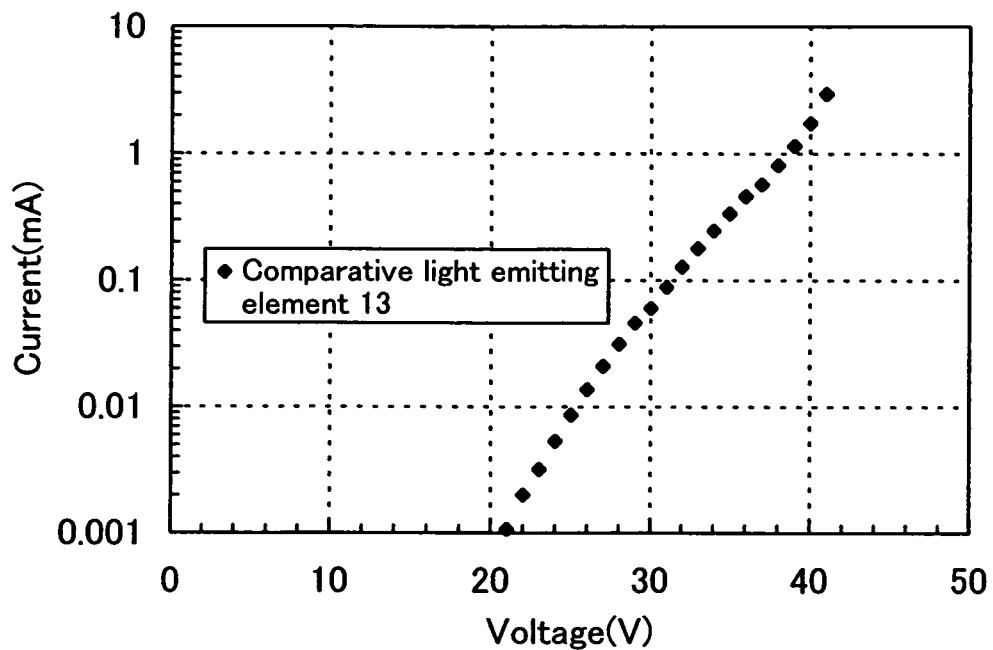
FIG. 44 is a view showing current-voltage characteristics of a comparative light emitting element.
Figure 45:
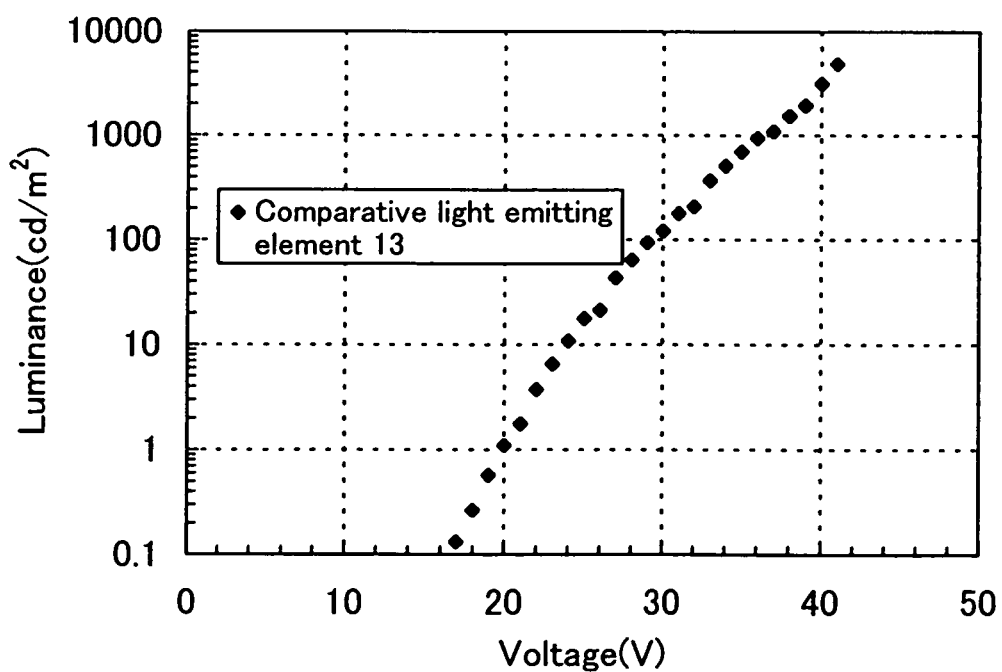
FIG. 45 is a view showing luminance-voltage characteristics of a comparative light emitting element.

FIG. 44 shows current-voltage characteristics of the comparative light emitting element 13. Further, FIG. 45 shows luminance-voltage characteristics. According to FIGS. 44 and 45, it is revealed that high voltage is necessary for the comparative light emitting element to obtain light emission at fixed luminance. Specifically, in the comparative light emitting element 11, a voltage at which light emission of 1 cd/m$^2$ or more is obtained was 20 V, and a voltage at which light emission of 0.1 cd/m$^2$ or more is obtained (light emission start voltage) was 17 V.

As described above, it was revealed that a compound in which an oxidation peak potential as described in the comparative measurement example in Embodiment 1 was not observed was difficult to be used for the composite material of the present invention. In addition, it was revealed that a light emitting element was difficult to be operated sufficiently using the composite material.

Embodiment 10

In this embodiment, a light emitting element using a composite material of the present invention will be specifically described.

(Light Emitting Element 21)

First, indium tin oxide including silicon oxide was formed over a glass substrate by a sputtering method to form a first electrode. A thickness thereof was set to 110 nm and an electrode area was set to 2 mm×2 mm.

Next, the substrate provided with the first electrode was fixed to a substrate holder provided in a vacuum evaporation system so that a surface over which the first electrode was formed was placed downward. Then, after the vacuum evaporation system was exhausted to reduce the pressure to approximately 10$^{-4}$ Pa, DNTPD and molybdenum oxide (VI) were co-evaporated over the first electrode to form a layer including a composite material of the present invention. A thickness thereof was set to 50 nm and a weight ratio of DNTPD and molybdenum oxide (VI) was adjusted to be 1:0.5. The co-evaporation method indicates an evaporation method by which evaporation is concurrently conducted from a plurality of evaporation sources in one treatment chamber.

Next, NPB was formed to have a thickness of 10 nm by an evaporation method using resistance heating to form a hole transporting layer.

Further, a light emitting layer having a thickness of 40 nm was formed over the hole transporting layer by co-evaporation of Alq and coumarin 6. Here, a weight ratio of Alq and coumarin 6 was adjusted to be 1:0.01 (=Alq:coumarin 6). Accordingly, coumarin 6 is to be dispersed in a layer made of Alq.

Thereafter, Alq was formed to have a thickness of 10 nm over the light emitting layer by an evaporation method using resistance heating to form an electron transporting layer.

Further, an electron injecting layer having a thickness of 30 nm is formed over the electron transporting layer by co-evaporation of Alq and lithium. Here, a weight ratio of Alq and lithium was adjusted to be 1:0.01 (=Alq:lithium). Accordingly, lithium is to be dispersed in a layer made of Alq.

Lastly, aluminum was formed to have a thickness of 200 nm over the electron injecting layer by an evaporation method using resistance heating to form a second electrode. The light emitting element manufactured in this embodiment is to be a light emitting element 21 of the present invention.

Figure 46:
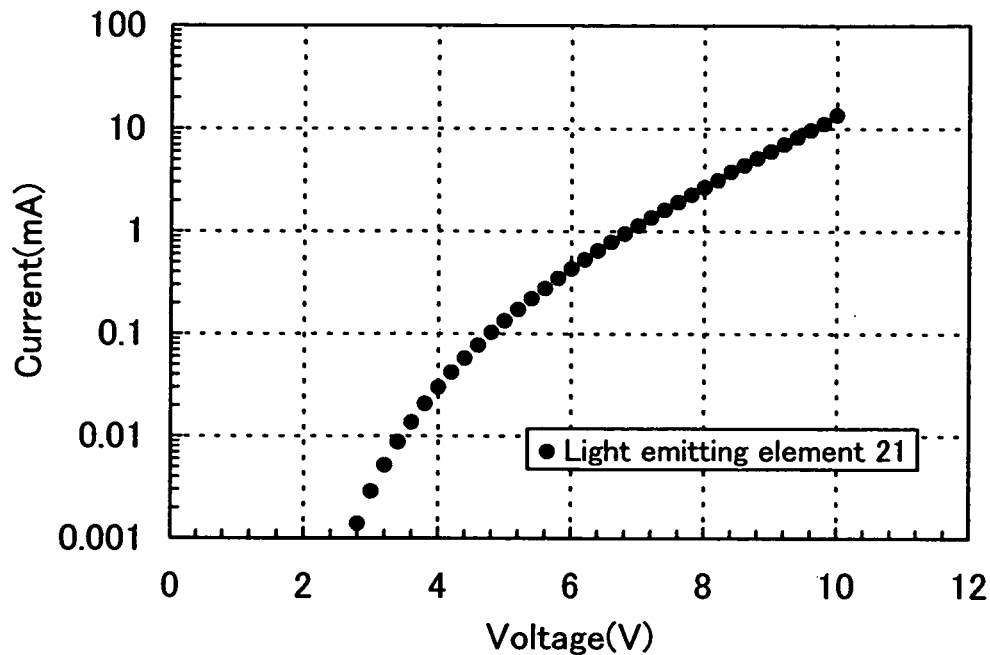
FIG. 46 is a view showing current-voltage characteristics of a light emitting element of the present invention.
Figure 47:
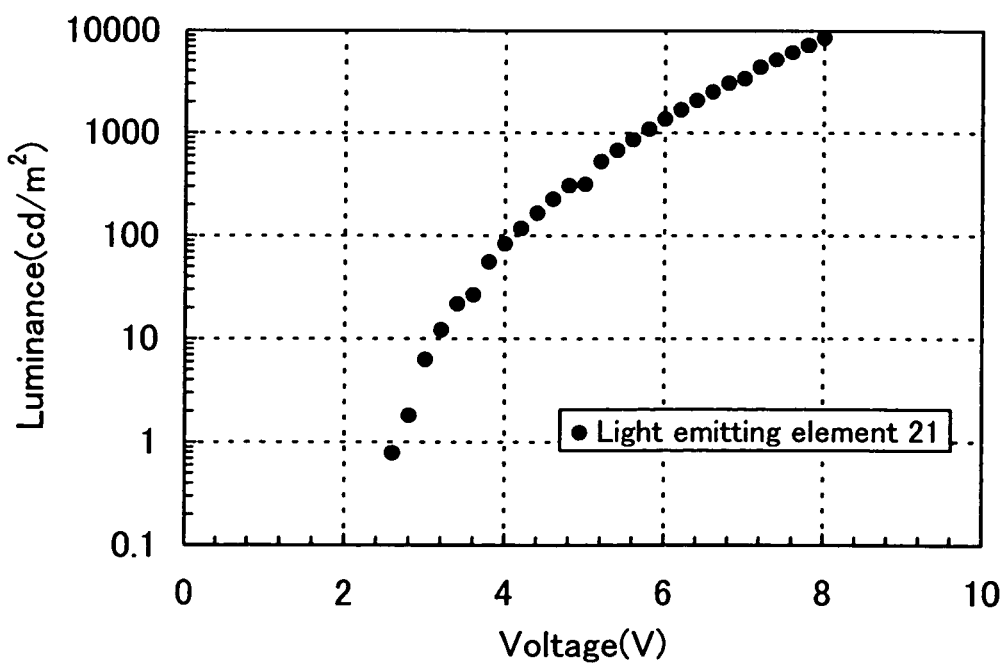
FIG. 47 is a view showing luminance-voltage characteristics of a light emitting element of the present invention.

FIG. 46 shows current-voltage characteristics of the comparative light emitting element 21. Further, FIG. 47 shows luminance-voltage characteristics. According to FIGS. 46 and 47, in the light emitting element 21 of the present invention, a voltage necessary to obtain luminance of 1100 cd/m$^2$ was 5.8 V, and current flowing at the time was 0.346 mA (current density was 8.66 mA/cm$^2$). In addition, current efficiency at this time was 13 cd/A, and power efficiency was 6.8 lm/W.

Thus, it is revealed that low voltage driving and low current driving can be obtained by applying the composite material of the present invention to a light emitting element.

Embodiment 11

In this embodiment, a light emitting element using a composite material of the present invention will be specifically described.
(Light Emitting Element 22)

First, indium tin oxide including silicon oxide was formed over a glass substrate by a sputtering method to form a first electrode. A thickness thereof was set to 110 nm and an electrode area was set to 2 mm×2 mm.

Next, the substrate provided with the first electrode was fixed to a substrate holder provided in a vacuum evaporation system so that a surface over which the first electrode was formed was placed downward. Then, after the vacuum evaporation system was exhausted to reduce the pressure to approximately 10$^{-4}$ Pa, PCzPCA1 and molybdenum oxide (VI) were co-evaporated over the first electrode to form a layer including a composite material of the present invention. A thickness thereof was set to 50 nm and a weight ratio of PCzPCA1 and molybdenum oxide (VI) was adjusted to be 1:0.5. The co-evaporation method indicates an evaporation method by which evaporation is concurrently conducted from a plurality of evaporation sources in one treatment chamber.

Next, NPB was formed to have a thickness of 10 nm by an evaporation method using resistance heating to form a hole transporting layer.

Further, a light emitting layer having a thickness of 40 nm was formed over the hole transporting layer by co-evaporation of Alq and coumarin 6. Here, a weight ratio of Alq and coumarin 6 was adjusted to be 1:0.01 (=Alq:coumarin 6). Accordingly, coumarin 6 is to be dispersed in a layer made of Alq.

Thereafter, Alq was formed to have a thickness of 10 nm over the light emitting layer by an evaporation method using resistance heating to form an electron transporting layer.

Further, an electron injecting layer having a thickness of 30 nm is formed over the electron transporting layer by co-evaporation of Alq and lithium. Here, a weight ratio of Alq and lithium was adjusted to be 1:0.01 (=Alq:lithium). Accordingly, lithium is to be dispersed in a layer made of Alq.

Lastly, aluminum was formed to have a thickness of 200 nm over the electron injecting layer by an evaporation method using resistance heating to form a second electrode. The light emitting element manufactured in this Embodiment is to be a light emitting element 22 of the present invention.

Figure 48:
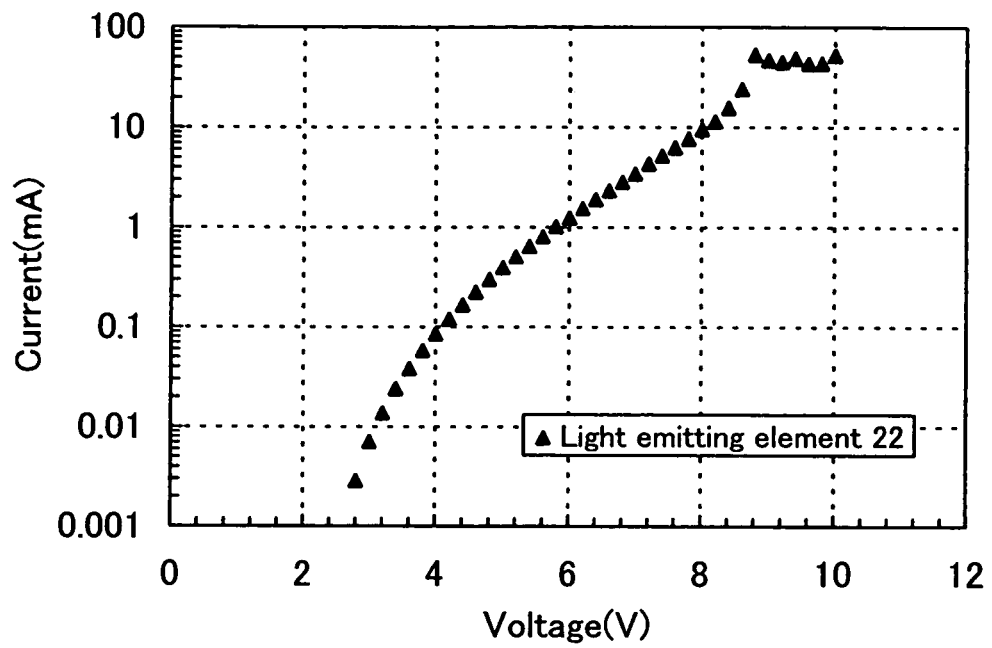
FIG. 48 is a view showing current-voltage characteristics of a light emitting element of the present invention.
Figure 49:
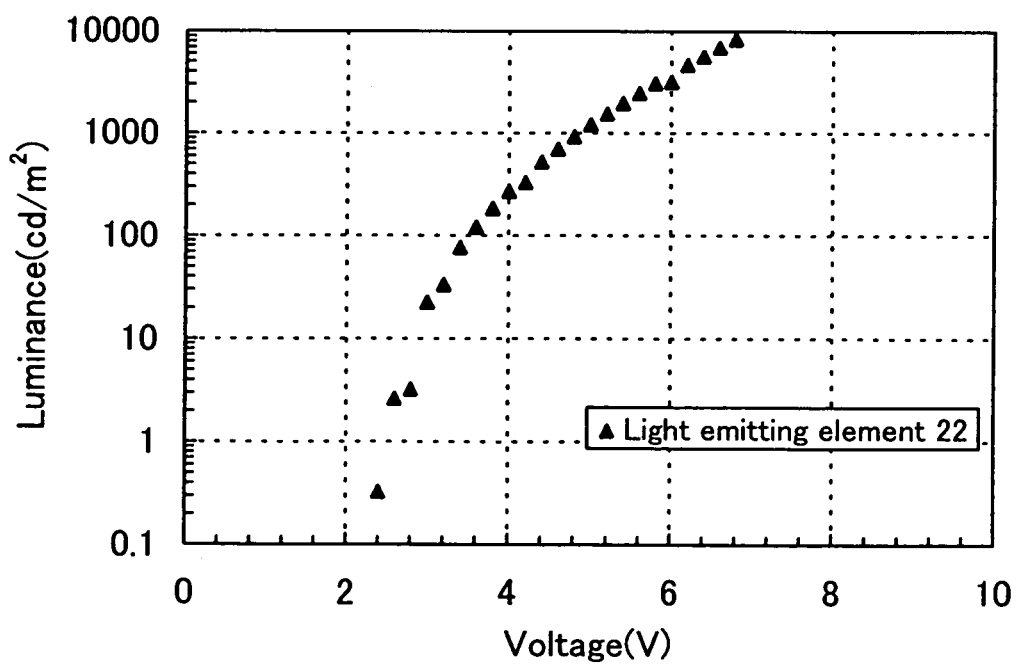
FIG. 49 is a view showing luminance-voltage characteristics of a light emitting element of the present invention.

FIG. 48 shows current-voltage characteristics of the light emitting element 22 of the present invention. Further, FIG. 49 shows luminance-voltage characteristics. According to FIGS. 48 and 49, in the light emitting element 22 of the present invention, a voltage necessary to obtain luminance of 1200 cd/m$^2$ was 5.0 V, and a current flowing at the time was 0.396 mA (current density was 9.90 mA/cm$^2$). In addition, current efficiency at this time was 12 cd/A, and power efficiency was 7.7 lm/W.

Thus, it is revealed that low voltage driving and low current driving can be obtained by applying the composite material of the present invention to a light emitting element.

Embodiment 12

In this embodiment, a light emitting element using a composite material of the present invention will be specifically described.
(Light Emitting Element 23)

First, indium tin oxide including silicon oxide was formed over a glass substrate by a sputtering method to form a first electrode. A thickness thereof was set to 110 nm and an electrode area was set to 2 mm×2 mm.

Next, the substrate provided with the first electrode was fixed to a substrate holder provided in a vacuum evaporation system so that a surface over which the first electrode was formed was placed downward. Then, after the vacuum evaporation system was exhausted to reduce the pressure to approximately 10$^{-4}$ Pa, PCzPCN1 and molybdenum oxide (VI) were co-evaporated over the first electrode to form a layer including a composite material of the present invention. A thickness thereof was set to 50 nm and a weight ratio of PCzPCN1 and molybdenum oxide (VI) was adjusted to be 1:0.5. The co-evaporation method indicates an evaporation method by which evaporation is concurrently conducted from a plurality of evaporation sources in one treatment chamber.

Next, NPB was formed to have a thickness of 10 nm by an evaporation method using resistance heating to form a hole transporting layer.

Further, a light emitting layer having a thickness of 40 nm was formed over the hole transporting layer by co-evaporation of Alq and coumarin 6. Here, a weight ratio of Alq and coumarin 6 was adjusted to be 1:0.01 (=Alq:coumarin 6). Accordingly, coumarin 6 is to be dispersed in a layer made of Alq.

Thereafter, Alq was formed to have a thickness of 10 nm over the light emitting layer by an evaporation method using resistance heating to form an electron transporting layer.

Further, an electron injecting layer having a thickness of 30 nm is formed over the electron transporting layer by co-evaporation of Alq and lithium. Here, a weight ratio of Alq and lithium was adjusted to be 1:0.01 (=Alq:lithium). Accordingly, lithium is to be dispersed in a layer made of Alq.

Lastly, aluminum was formed to have a thickness of 200 nm over the electron injecting layer by an evaporation method using resistance heating to form a second electrode. The light emitting element manufactured in this embodiment is to be a light emitting element 23 of the present invention.

Figure 50:
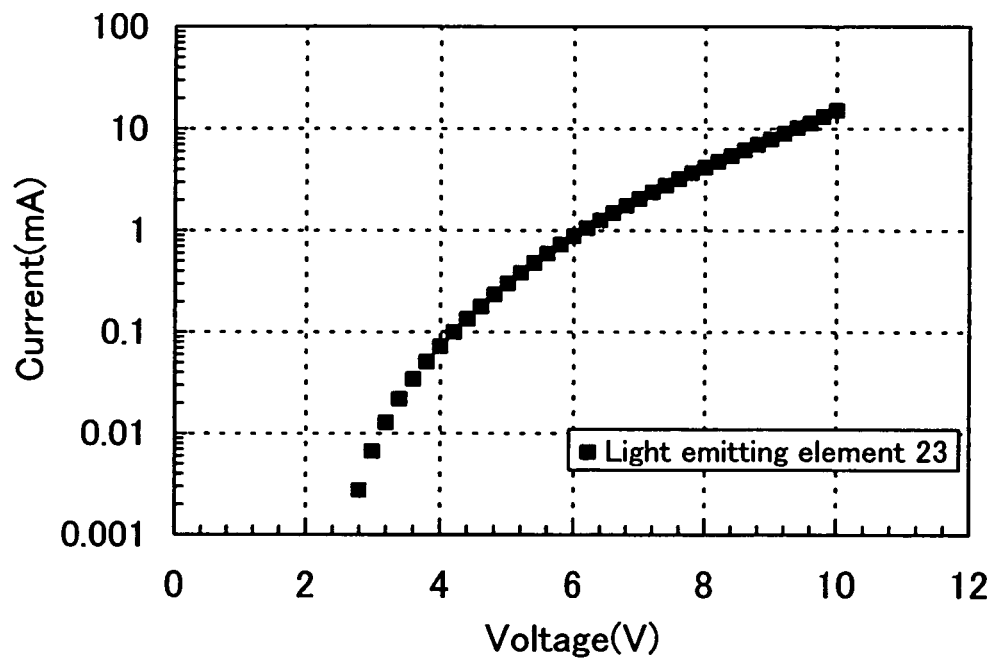
FIG. 50 is a view showing current-voltage characteristics of a light emitting element of the present invention.
Figure 51:
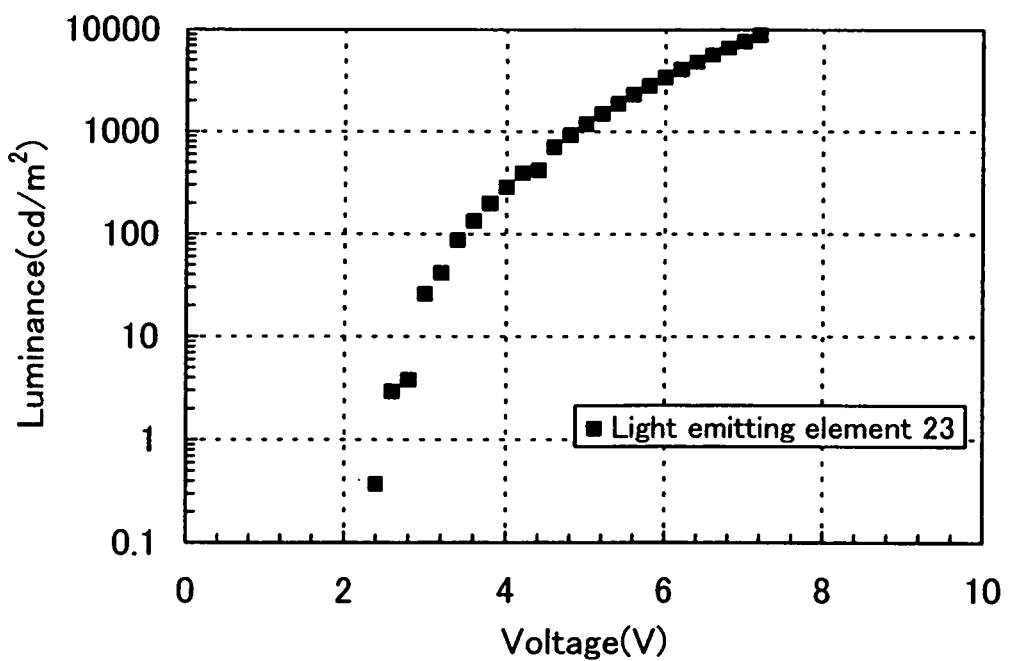
FIG. 51 is a view showing luminance-voltage characteristics of a light emitting element of the present invention.

FIG. 50 shows current-voltage characteristics of the light emitting element 23 of the present invention. Further, FIG. 51 shows luminance-voltage characteristics. According to FIGS. 50 and 51, in the light emitting element 23 of the present invention, a voltage necessary to obtain luminance of 1200 cd/m$^2$ was 5.0 V, and a current flowing at the time was 0.300 mA (current density was 7.51 mA/cm$^2$). In addition, current efficiency at this time was 16 cd/A, and power efficiency was 9.9 lm/W.

Thus, it is revealed that low voltage driving and low current driving can be obtained by applying the composite material of the present invention to a light emitting element.

Embodiment 13

In this embodiment, a light emitting element using a composite material of the present invention will be specifically described.

(Light Emitting Element 24)

First, indium tin oxide including silicon oxide was formed over a glass substrate by a sputtering method to form a first electrode. A thickness thereof was set to 110 nm and an electrode area was set to 2 mm×2 mm.

Next, the substrate provided with the first electrode was fixed to a substrate holder provided in a vacuum evaporation system so that a surface over which the first electrode was formed was placed downward. Next, copper phthalocyanine (CuPc) was formed to have a thickness of 20 nm by an evaporation method using resistance heating.

Next, NPB was formed to have a thickness of 40 nm by an evaporation method using resistance heating to form a hole transporting layer.

Further, a light emitting layer having a thickness of 40 nm was formed over the hole transporting layer by co-evaporation of Alq and coumarin 6. Here, a weight ratio of Alq and coumarin 6 was adjusted to be 1:0.003 (=Alq:coumarin 6). Accordingly, coumarin 6 is to be dispersed in a layer made of Alq.

Thereafter, Alq was formed to have a thickness of 10 nm over the light emitting layer by an evaporation method using resistance heating to form an electron transporting layer.

Further, an electron injecting layer having a thickness of 10 nm is formed over the electron transporting layer by co-evaporation of Alq and lithium. Here, a weight ratio of Alq and lithium was adjusted to be 1:0.01 (=Alq:lithium). Accordingly, lithium is to be dispersed in a layer made of Alq.

Next, NPB and molybdenum oxide (VI) were co-evaporated to form a layer including a composite material of the present invention. A weight ratio of NPB and molybdenum oxide (VI) was adjusted to be 1:0.5.

After forming a layer including a light emitting substance, which is formed by laminating the hole injecting layer, the hole transporting layer, the light emitting layer, the electron transporting layer, the electron injecting layer, and the layer including the composite material of the present invention, a second electrode is formed by a sputtering method or an evaporation method. In this embodiment, aluminum is formed to have a thickness of 200 nm over the layer including the composite material of the present invention by an evaporation method using resistance heating, thereby forming the second electrode. The light emitting element manufactured in this embodiment is to be a light emitting element 24 of the present invention.

Figure 52:
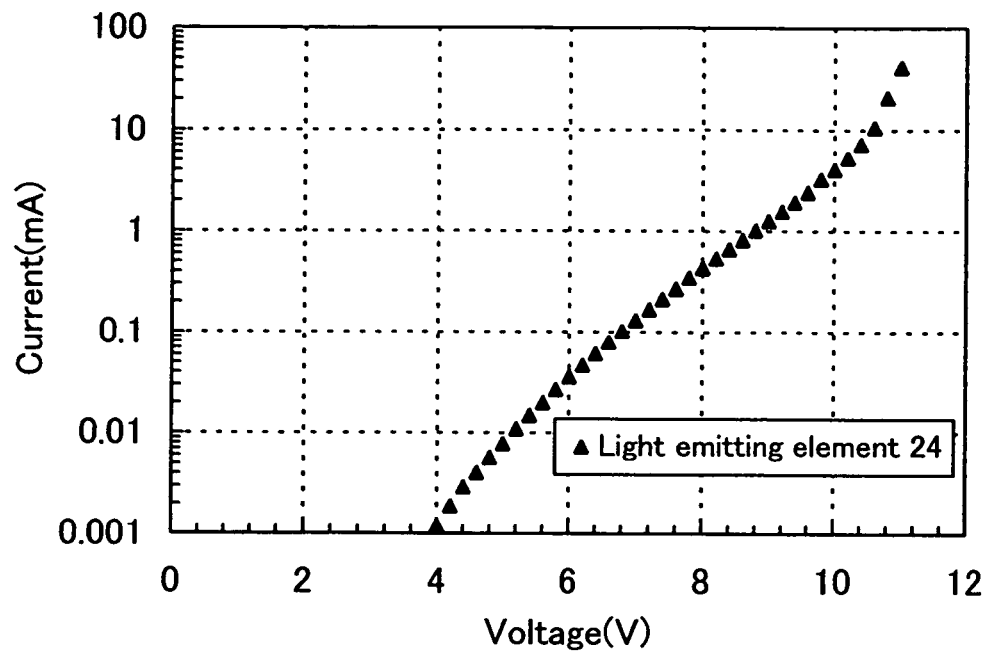
FIG. 52 is a view showing current-voltage characteristics of a light emitting element of the present invention.
Figure 53:
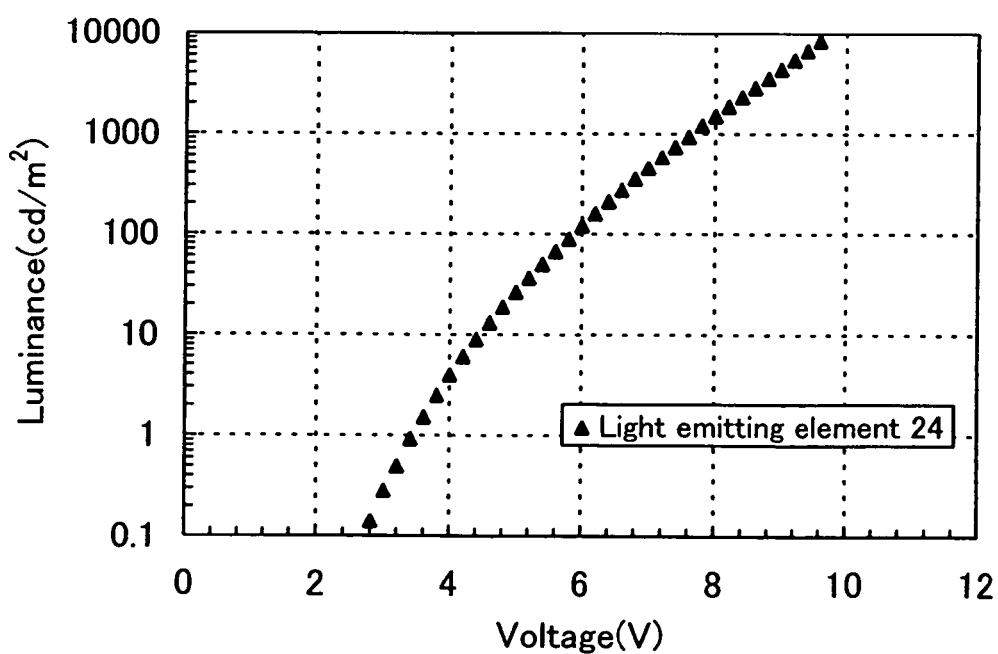
FIG. 53 is a view showing luminance-voltage characteristics of a light emitting element of the present invention.

FIG. 52 shows current-voltage characteristics of the light emitting element 24 of the present invention. Further, FIG. 53 shows luminance-voltage characteristics. According to FIGS. 52 and 53, it is revealed that the light emitting element provided with the layer including the composite material of the present invention to be in contact with an electrode serving as a cathode serves as a light emitting element. Specifically, in the light emitting element 24 of the present invention, a voltage necessary to obtain luminance of 1200 cd/m$^2$ was 7.8 V, and a current flowing at the time was 0.346 mA (current density was 8.66 mA/cm$^2$). In addition, current efficiency at this time was 14 cd/A, and power efficiency was 5.6 lm/W.

Thus, it is revealed that low voltage driving and low current driving can be obtained by applying the composite material of the present invention to a light emitting element.

Embodiment 14

In this embodiment, a light emitting element using a composite material of the present invention will be specifically described.

(Light Emitting Element 25)

First, indium tin oxide including silicon oxide was formed over a glass substrate by a sputtering method to form a first electrode. A thickness thereof was set to 110 nm and an electrode area was set to 2 mm×2 mm.

Next, the substrate provided with the first electrode was fixed to a substrate holder provided in a vacuum evaporation system so that a surface over which the first electrode was formed was placed downward. Then, after the vacuum evaporation system was exhausted to reduce the pressure to approximately 10$^{-4}$ Pa, NPB and molybdenum oxide (VI) were co-evaporated over the first electrode to form a layer including a composite material of the present invention. A thickness thereof was set to 50 nm and a weight ratio of NPB and molybdenum oxide (VI) was adjusted to be 4:1. The co-evaporation method indicates an evaporation method by which evaporation is concurrently conducted from a plurality of evaporation sources in one treatment chamber.

Next, NPB was formed to have a thickness of 10 nm by an evaporation method using resistance heating to form a hole transporting layer.

Further, a light emitting layer having a thickness of 40 nm was formed over the hole transporting layer by co-evaporation of Alq and coumarin 6. Here, a weight ratio of Alq and coumarin 6 was adjusted to be 1:0.01 (=Alq:coumarin 6). Accordingly, coumarin 6 is to be dispersed in a layer made of Alq.

Thereafter, Alq was formed to have a thickness of 10 nm over the light emitting layer by an evaporation method using resistance heating to form an electron transporting layer.

Further, an electron injecting layer having a thickness of 10 nm is formed over the electron transporting layer by co-evaporation of Alq and lithium. Here, a weight ratio of Alq and lithium was adjusted to be 1:0.01 (=Alq:lithium). Accordingly, lithium is to be dispersed in a layer made of Alq.

Next, NPB and molybdenum oxide (VI) were co-evaporated to form a layer including a composite material of the present invention having a thickness of 10 nm. A weight ratio of NPB and molybdenum oxide (VI) was adjusted to be 4:1.

After forming a layer including a light emitting substance, which is formed by laminating the layer including the composite material of the present invention, the hole transporting layer, the light emitting layer, the electron transporting layer, the electron injecting layer, and the layer including the composite material of the present invention, a second electrode is formed by a sputtering method or an evaporation method. In this embodiment, aluminum is formed to have a thickness of 200 nm over the layer including the composite material of the present invention by an evaporation method using resistance heating, thereby forming the second electrode. The light emitting element manufactured in this embodiment is to be a light emitting element 25 of the present invention.

Figure 54:
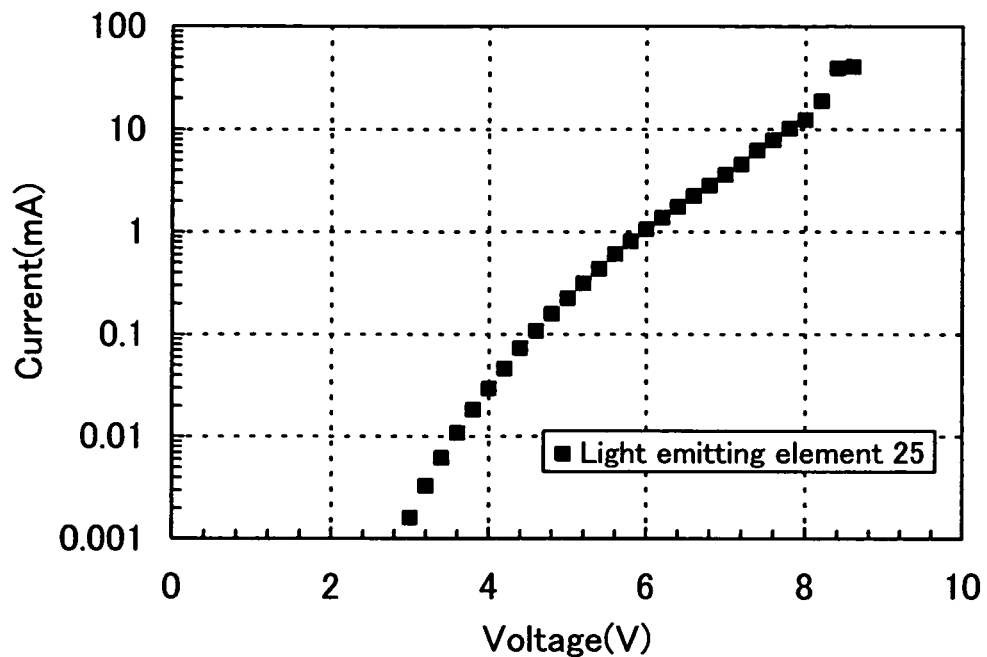
FIG. 54 is a view showing current-voltage characteristics of a light emitting element of the present invention.
Figure 55:
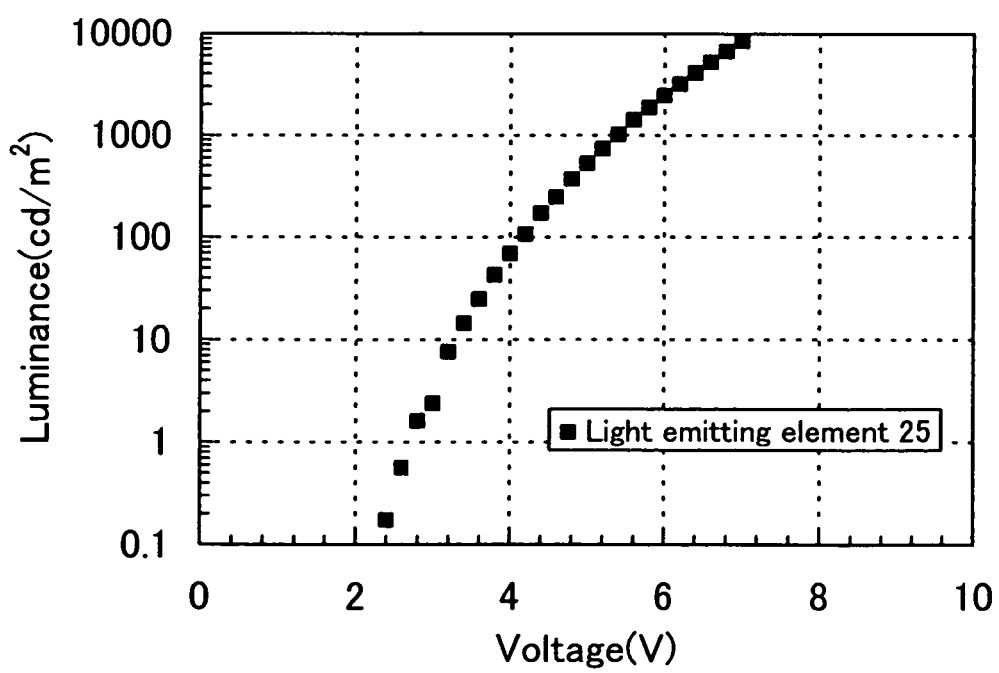
FIG. 55 is a view showing luminance-voltage characteristics of a light emitting element of the present invention.

FIG. 54 shows current-voltage characteristics of the light emitting element 25 of the present invention. Further, FIG. 55 shows luminance-voltage characteristics. According to FIGS. 54 and 55, it is revealed that the light emitting element provided with the layers including the composite material of the present invention to be in contact with both electrodes, respectively, of the light emitting element serves as a light emitting element. Specifically, in the light emitting element 25 of the present invention, a voltage necessary to obtain luminance of 1000 cd/m$^2$ was 5.4 V, and a current flowing at the time was 0.435 mA (current density was 10.9 mA/cm$^2$). In addition, current efficiency at this time was 9.3 cd/A, and power efficiency was 5.41 lm/W.

Thus, it is revealed that low voltage driving and low current driving can be obtained by applying the composite material of the present invention to a light emitting element.

Embodiment 15

In this embodiment, a light emitting element using a composite material of the present invention will be specifically described.

(Light Emitting Element 26)

First, indium tin oxide including silicon oxide was formed over a glass substrate by a sputtering method to form a first electrode. A thickness thereof was set to 110 nm and an electrode area was set to 2 mm×2 mm.

Next, the substrate provided with the first electrode was fixed to a substrate holder provided in a vacuum evaporation system so that a surface over which the first electrode was formed was placed downward. Then, after the vacuum evaporation system was exhausted to reduce the pressure to approximately 10$^{-4}$ Pa, DNTPD and molybdenum oxide (VI) were co-evaporated over the first electrode to form a layer including a composite material of the present invention. A thickness thereof was set to 50 nm and a weight ratio of DNTPD and molybdenum oxide (VI) was adjusted to be 1:0.5. The co-evaporation method indicates an evaporation method by which evaporation is concurrently conducted from a plurality of evaporation sources in one treatment chamber.

Next, NPB was formed to have a thickness of 10 nm by an evaporation method using resistance heating to form a hole transporting layer.

Further, a light emitting layer having a thickness of 40 nm was formed over the hole transporting layer by co-evaporation of Alq and coumarin 6. Here, a weight ratio of Alq and coumarin 6 was adjusted to be 1:0.01 (=Alq:coumarin 6). Accordingly, coumarin 6 is to be dispersed in a layer made of Alq.

Thereafter, Alq was formed to have a thickness of 10 nm over the light emitting layer by an evaporation method using resistance heating to form an electron transporting layer.

Further, an electron injecting layer having a thickness of 10 nm is formed over the electron transporting layer by co-evaporation of Alq and lithium. Here, a weight ratio of Alq and lithium was adjusted to be 1:0.01 (=Alq:lithium). Accordingly, lithium is to be dispersed in a layer made of Alq.

Next, DNTPD and molybdenum oxide (VI) were co-evaporated to form a layer including a composite material of the present invention having a thickness of 20 nm. A weight ratio of DNTPD and molybdenum oxide (VI) was adjusted to be 1:0.5.

After forming a layer including a light emitting substance, which is formed by laminating the layer including the composite material of the present invention, the hole transporting layer, the light emitting layer, the electron transporting layer, the electron injecting layer, and the layer including the composite material of the present invention, a second electrode is formed by a sputtering method or an evaporation method. In this embodiment, aluminum is formed to have a thickness of 200 nm over the layer including the composite material of the present invention by an evaporation method using resistance heating, thereby forming the second electrode. The light emitting element manufactured in this embodiment is to be a light emitting element 26 of the present invention.

Figure 56:
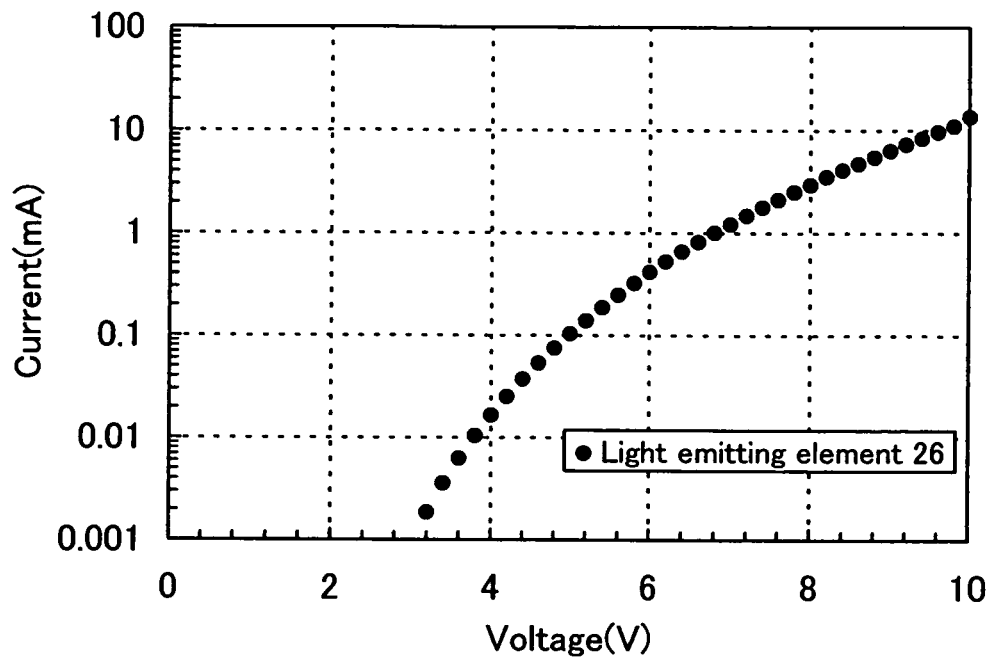
FIG. 56 is a view showing current-voltage characteristics of a light emitting element of the present invention.
Figure 57:
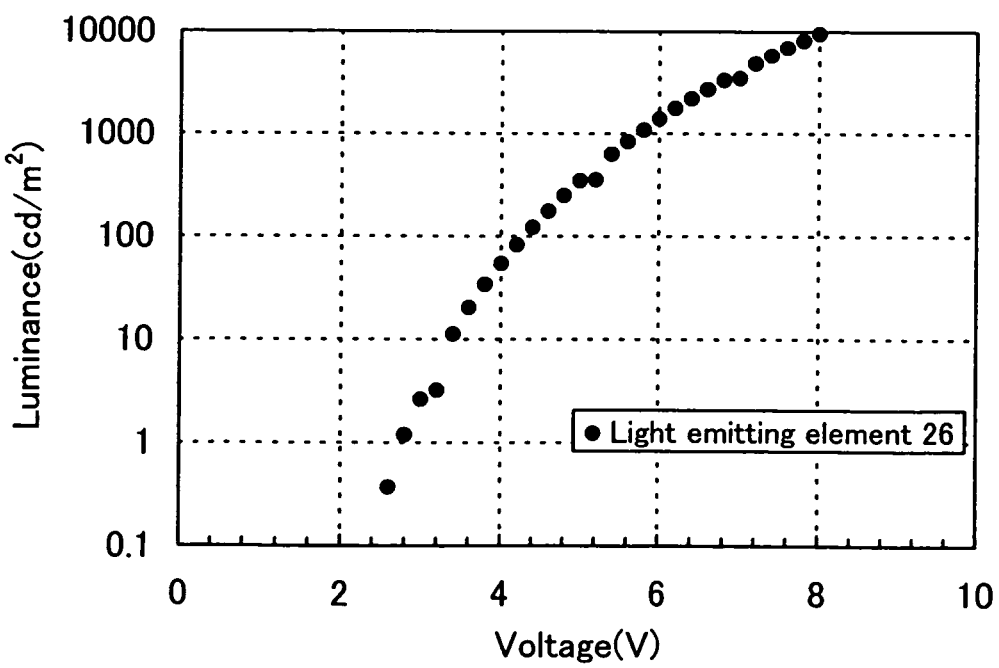
FIG. 57 is a view showing luminance-voltage characteristics of a light emitting element of the present invention.

FIG. 56 shows current-voltage characteristics of the light emitting element 26 of the present invention. Further, FIG. 57 shows luminance-voltage characteristics. According to FIGS. 56 and 57, it is revealed that the light emitting element provided with the layers including the composite material of the present invention to be in contact with both electrodes, respectively, of the light emitting element serves as a light emitting element. Specifically, in the light emitting element 26 of the present invention, a voltage necessary to obtain luminance of 1100 cd/m$^2$ was 5.8 V, and a current flowing at the time was 0.322 mA (current density was 8.05 mA/cm$^2$). In addition, current efficiency at this time was 13 cd/A, and power efficiency was 7.31 lm/W.

Thus, it is revealed that low voltage driving and low current driving can be obtained by applying the composite material of the present invention to a light emitting element.

Embodiment 16

In this embodiment, a light emitting element using a composite material of the present invention will be specifically described.

(Light Emitting Element 27)

First, indium tin oxide including silicon oxide was formed over a glass substrate by a sputtering method to form a first electrode. A thickness thereof was set to 110 nm and an electrode area was set to 2 mm×2 mm.

Next, the substrate provided with the first electrode was fixed to a substrate holder provided in a vacuum evaporation system so that a surface over which the first electrode was formed was placed downward. Then, after the vacuum evaporation system was exhausted to reduce the pressure to approximately 10$^{-4}$ Pa, PCzPCA1 and molybdenum oxide (VI) were co-evaporated over the first electrode to form a layer including a composite material of the present invention. A thickness thereof was set to 50 nm and a weight ratio of PCzPCA1 and molybdenum oxide (VI) was adjusted to be 1:0.5. The co-evaporation method indicates an evaporation method by which evaporation is concurrently conducted from a plurality of evaporation sources in one treatment chamber.

Next, NPB was formed to have a thickness of 10 nm by an evaporation method using resistance heating to form a hole transporting layer.

Further, a light emitting layer having a thickness of 40 nm was formed over the hole transporting layer by co-evaporation of Alq and coumarin 6. Here, a weight ratio of Alq and coumarin 6 was adjusted to be 1:0.01 (=Alq:coumarin 6). Accordingly, coumarin 6 is to be dispersed in a layer made of Alq.

Thereafter, Alq was formed to have a thickness of 10 nm over the light emitting layer by an evaporation method using resistance heating to form an electron transporting layer.

Further, an electron injecting layer having a thickness of 10 nm is formed over the electron transporting layer by co-evaporation of Alq and lithium. Here, a weight ratio of Alq and lithium was adjusted to be 1:0.01 (=Alq:lithium). Accordingly, lithium is to be dispersed in a layer made of Alq.

Next, PCzPCA1 and molybdenum oxide (VI) were co-evaporated to form a layer including a composite material of the present invention having a thickness of 20 nm. A weight ratio of PCzPCA1 and molybdenum oxide (VI) was adjusted to be 1:0.5.

After forming a layer including a light emitting substance, which is formed by laminating the layer including the composite material of the present invention, the hole transporting layer, the light emitting layer, the electron transporting layer, the electron injecting layer, and the layer including the composite material of the present invention, a second electrode is formed by a sputtering method or an evaporation method. In this embodiment, aluminum is formed to have a thickness of 200 nm over the layer including the composite material of the present invention by an evaporation method using resistance heating, thereby forming the second electrode. The light emitting element manufactured in this Embodiment is referred to as a light emitting element 27 of the present invention.

Figure 58:
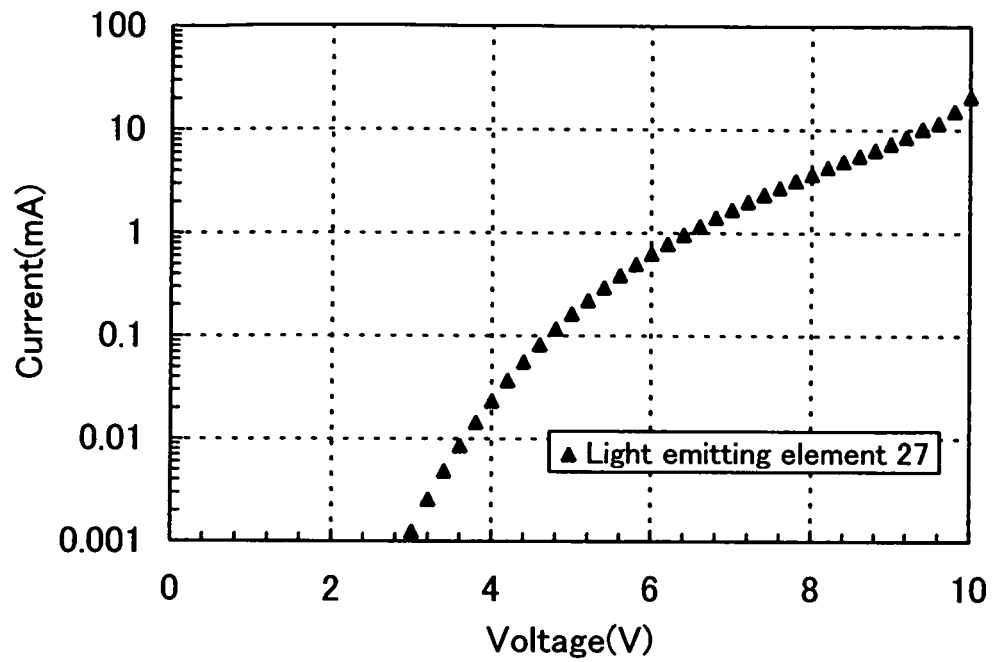
FIG. 58 is a view showing current-voltage characteristics of a light emitting element of the present invention.
Figure 59:
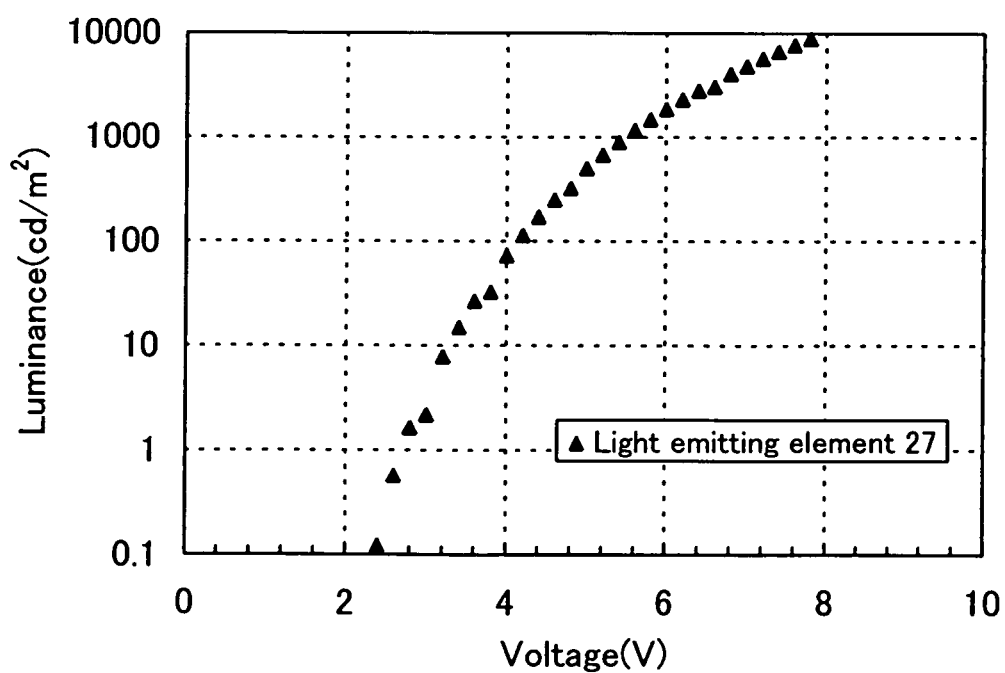
FIG. 59 is a view showing luminance-voltage characteristics of a light emitting element of the present invention.

FIG. 58 shows current-voltage characteristics of the light emitting element 27 of the present invention. Further, FIG. 59 shows luminance-voltage characteristics. According to FIGS. 58 and 59, it is revealed that the light emitting element provided with the layers including the composite material of the present invention to be in contact with both electrodes, respectively, of the light emitting element serves as a light emitting element. Specifically, in the light emitting element 27 of the present invention, a voltage necessary to obtain luminance of 1200 cd/m$^2$ was 5.6 V, and a current flowing at the time was 0.388 mA (current density was 9.70 mA/cm$^2$). In addition, current efficiency at this time was 12 cd/A, and power efficiency was 6.81 lm/W.

Thus, it is revealed that low voltage driving and low current driving can be obtained by applying the composite material of the present invention to a light emitting element.

Embodiment 17

In this embodiment, a light emitting element using a composite material of the present invention will be specifically described.

(Light Emitting Element 28)

First, indium tin oxide including silicon oxide was formed over a glass substrate by a sputtering method to form a first electrode. A thickness thereof was set to 110 nm and an electrode area was set to 2 mm×2 mm.

Next, the substrate provided with the first electrode was fixed to a substrate holder provided in a vacuum evaporation system so that a surface over which the first electrode was formed was placed downward. Then, after the vacuum evaporation system was exhausted to reduce the pressure to approximately 10$^{-4}$ Pa, PCzPCN1 and molybdenum oxide (VI) were co-evaporated over the first electrode to form a layer including a composite material of the present invention. A thickness thereof was set to 50 nm and a weight ratio of PCzPCN1 and molybdenum oxide (VI) was adjusted to be 1:0.5. The co-evaporation method indicates an evaporation method by which evaporation is concurrently conducted from a plurality of evaporation sources in one treatment chamber.

Next, NPB was formed to have a thickness of 10 nm by an evaporation method using resistance heating to form a hole transporting layer.

Further, a light emitting layer having a thickness of 40 nm was formed over the hole transporting layer by co-evaporation of Alq and coumarin 6. Here, a weight ratio of Alq and coumarin 6 was adjusted to be 1:0.01 (=Alq:coumarin 6). Accordingly, coumarin 6 is to be dispersed in a layer made of Alq.

Thereafter, Alq was formed to have a thickness of 10 nm over the light emitting layer by an evaporation method using resistance heating to form an electron transporting layer.

Further, an electron injecting layer having a thickness of 10 nm is formed over the electron transporting layer by co-evaporation of Alq and lithium. Here, a weight ratio of Alq and lithium was adjusted to be 1:0.01 (=Alq:lithium). Accordingly, lithium is to be dispersed in a layer made of Alq.

Next, PCzPCN1 and molybdenum oxide (VI) were co-evaporated to form a layer including a composite material of the present invention having a thickness of 20 nm. A weight ratio of PCzPCN1 and molybdenum oxide (VI) was adjusted to be 1:0.5.

After forming a layer including a light emitting substance, which is formed by laminating the layer including the composite material of the present invention, the hole transporting layer, the light emitting layer, the electron transporting layer, the electron injecting layer, and the layer including the composite material of the present invention, a second electrode is formed by a sputtering method or an evaporation method. In this embodiment, aluminum is formed to have a thickness of 200 nm over the layer including the composite material of the present invention by an evaporation method using resistance heating, thereby forming the second electrode. The light emitting element manufactured in this Embodiment is referred to as a light emitting element 28 of the present invention.

Figure 60:
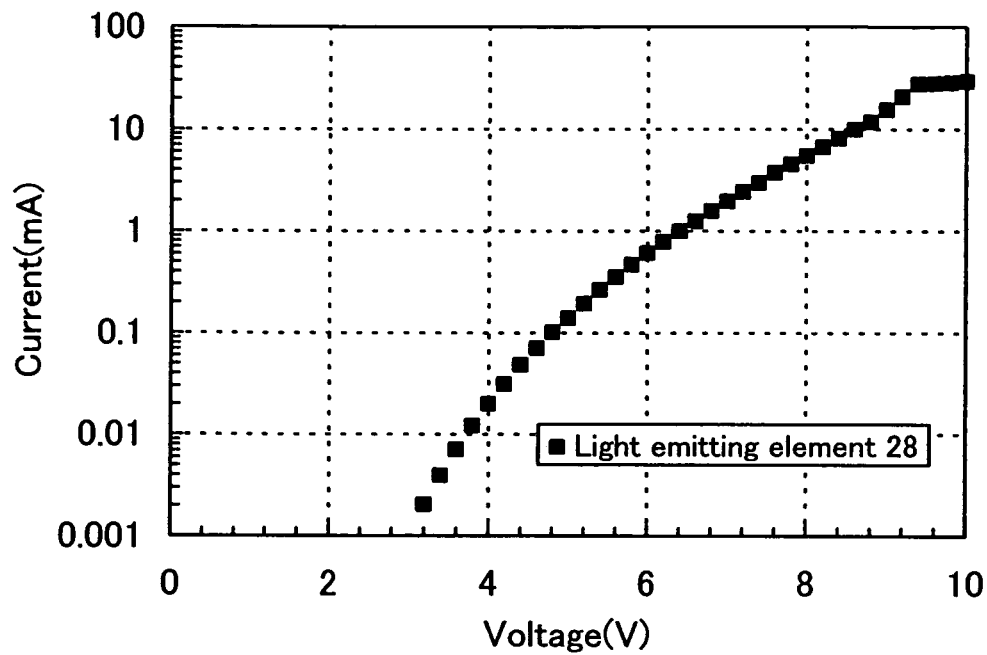
FIG. 60 is a view showing current-voltage characteristics of a light emitting element of the present invention.
Figure 61:
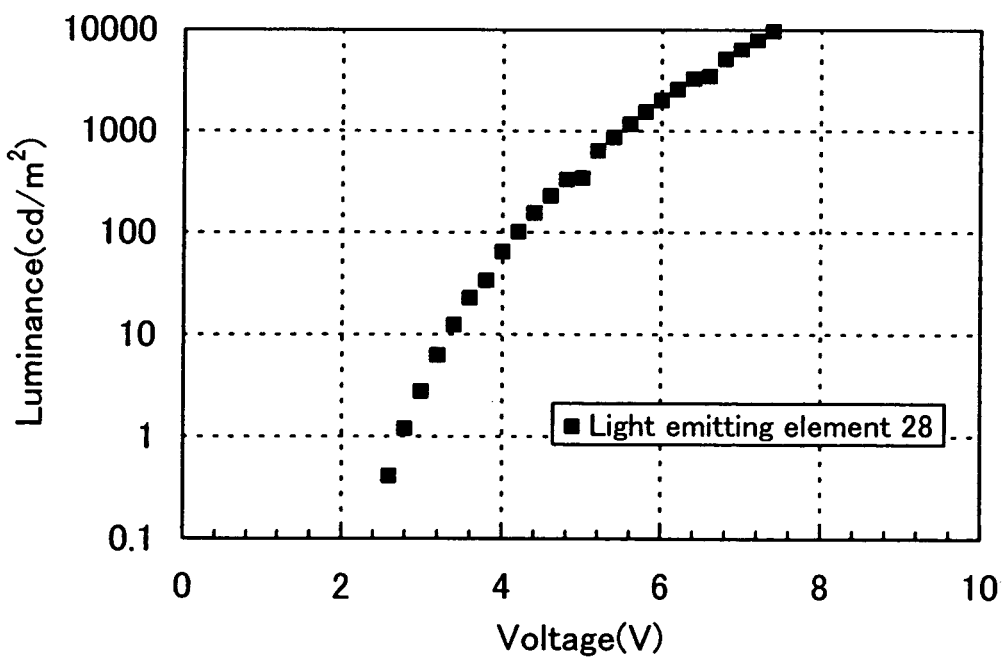
FIG. 61 is a view showing luminance-voltage characteristics of a light emitting element of the present invention.

FIG. 60 shows current-voltage characteristics of the light emitting element 28 of the present invention. Further, FIG. 61 shows luminance-voltage characteristics. According to FIGS. 60 and 61, it is revealed that the light emitting element provided with the layers including the composite material of the present invention to be in contact with both electrodes, respectively, of the light emitting element serves as a light emitting element. Specifically, in the light emitting element 28 of the present invention, a voltage necessary to obtain luminance of 1200 cd/m$^2$ was 5.6 V, and a current flowing at the time was 0.354 mA (current density was 8.85 mA/cm$^2$). In addition, current efficiency at this time was 13 cd/A, and power efficiency was 7.4 lm/W.

Thus, it is revealed that low voltage driving and low current driving can be obtained by applying the composite material of the present invention to a light emitting element.

Embodiment 18

In this embodiment, a light emitting element using a composite material of the present invention will be specifically described.

(Light Emitting Element 29)

First, indium tin oxide including silicon oxide was formed over a glass substrate by a sputtering method to form a first electrode. A thickness thereof was set to 110 nm and an electrode area was set to 2 mm×2 mm.

Next, the substrate provided with the first electrode was fixed to a substrate holder provided in a vacuum evaporation system so that a surface over which the first electrode was formed was placed downward. Then, after the vacuum evaporation system was exhausted to reduce the pressure to approximately 10$^{-4}$ Pa, CBP and molybdenum oxide (VI) were co-evaporated over the first electrode to form a layer including a composite material of the present invention. A thickness thereof was set to 50 nm and a weight ratio of CBP and molybdenum oxide (VI) was adjusted to be 1:0.5. The co-evaporation method indicates an evaporation method by which evaporation is concurrently conducted from a plurality of evaporation sources in one treatment chamber.

Next, NPB was formed to have a thickness of 10 nm by an evaporation method using resistance heating to form a hole transporting layer.

Further, a light emitting layer having a thickness of 40 nm was formed over the hole transporting layer by co-evaporation of Alq and coumarin 6. Here, a weight ratio of Alq and coumarin 6 was adjusted to be 1:0.01 (=Alq:coumarin 6). Accordingly, coumarin 6 is to be dispersed in a layer made of Alq.

Thereafter, Alq was formed to have a thickness of 10 nm over the light emitting layer by an evaporation method using resistance heating to form an electron transporting layer.

Further, an electron injecting layer having a thickness of 10 nm is formed over the electron transporting layer by co-evaporation of Alq and lithium. Here, a weight ratio of Alq and lithium was adjusted to be 1:0.01 (=Alq:lithium). Accordingly, lithium is to be dispersed in a layer made of Alq.

Next, CBP and molybdenum oxide (VI) were co-evaporated to form a layer including a composite material of the present invention having a thickness of 20 nm. A weight ratio of CBP and molybdenum oxide (VI) was adjusted to be 1:0.5.

After forming a layer including a light emitting substance, which is formed by laminating the layer including the composite material of the present invention, the hole transporting layer, the light emitting layer, the electron transporting layer, the electron injecting layer, and the layer including the composite material of the present invention, a second electrode is formed by a sputtering method or an evaporation method. In this embodiment, aluminum is formed to have a thickness of 200 nm over the layer including the composite material of the present invention by an evaporation method using resistance heating, thereby forming the second electrode. The light emitting element manufactured in this Embodiment is referred to as a light emitting element 29 of the present invention.

Figure 62:
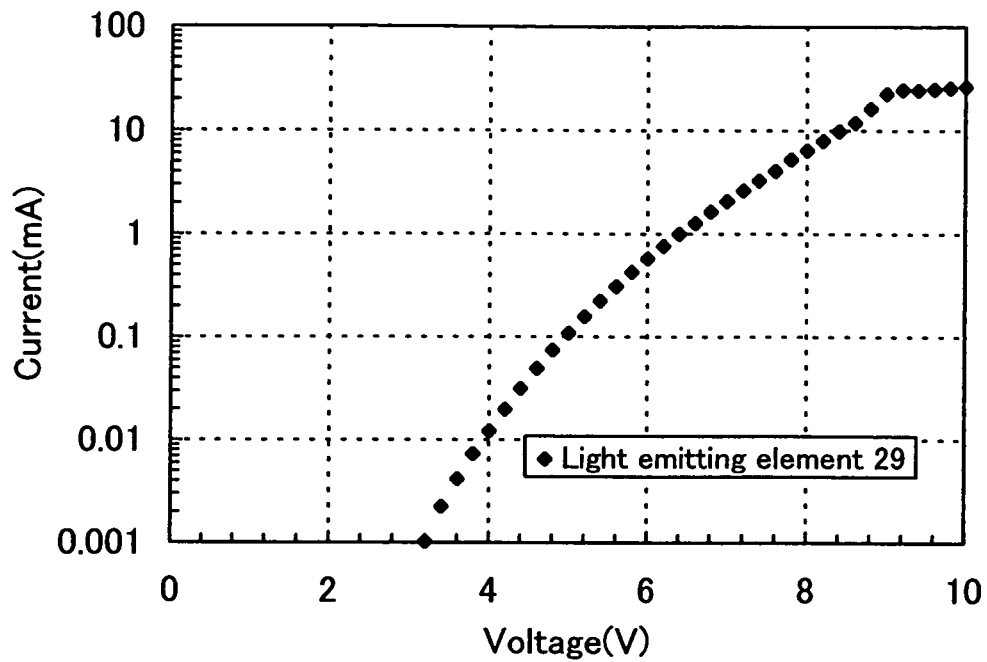
FIG. 62 is a view showing current-voltage characteristics of a light emitting element of the present invention.
Figure 63:
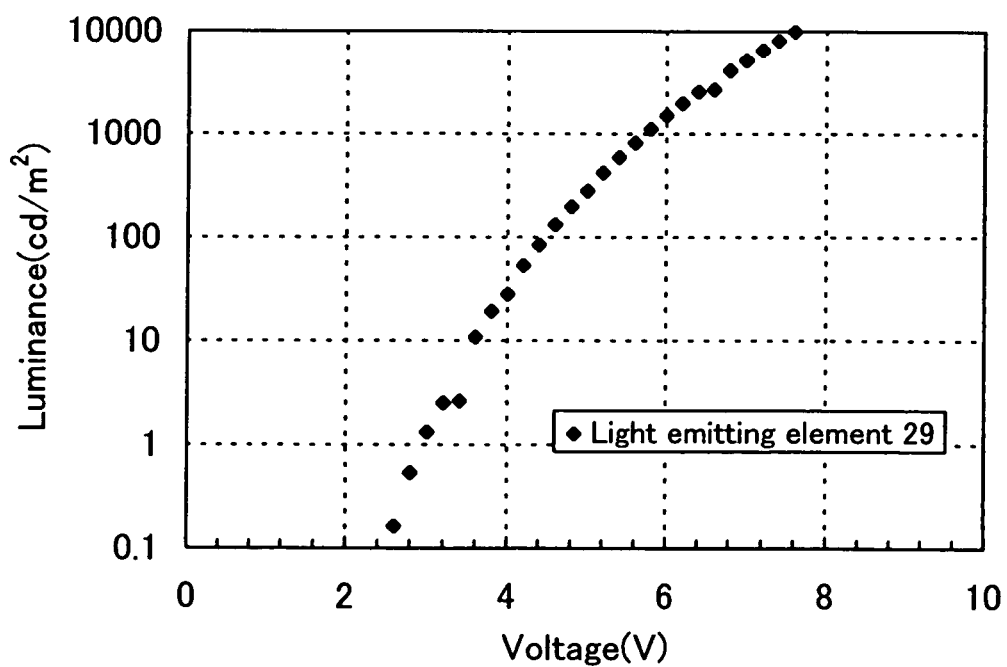
FIG. 63 is a view showing luminance-voltage characteristics of a light emitting element of the present invention.

FIG. 62 shows current-voltage characteristics of the light emitting element 29 of the present invention. Further, FIG. 63 shows luminance-voltage characteristics. According to FIGS. 60 and 61, it is revealed that the light emitting element provided with the layers including the composite material of the present invention to be in contact with both electrodes, respectively, of the light emitting element serves as a light emitting element. Specifically, in the light emitting element 29 of the present invention, a voltage necessary to obtain luminance of 1100 cd/m$^2$ was 5.8 V, and a current flowing at the time was 0.424 mA (current density was 10.6 mA/cm$^2$). In addition, current efficiency at this time was 11 cd/A, and power efficiency was 5.7 lm/W.

Thus, it is revealed that low voltage driving and low current driving can be obtained by applying the composite material of the present invention to a light emitting element.

Embodiment 19

Figure 64:
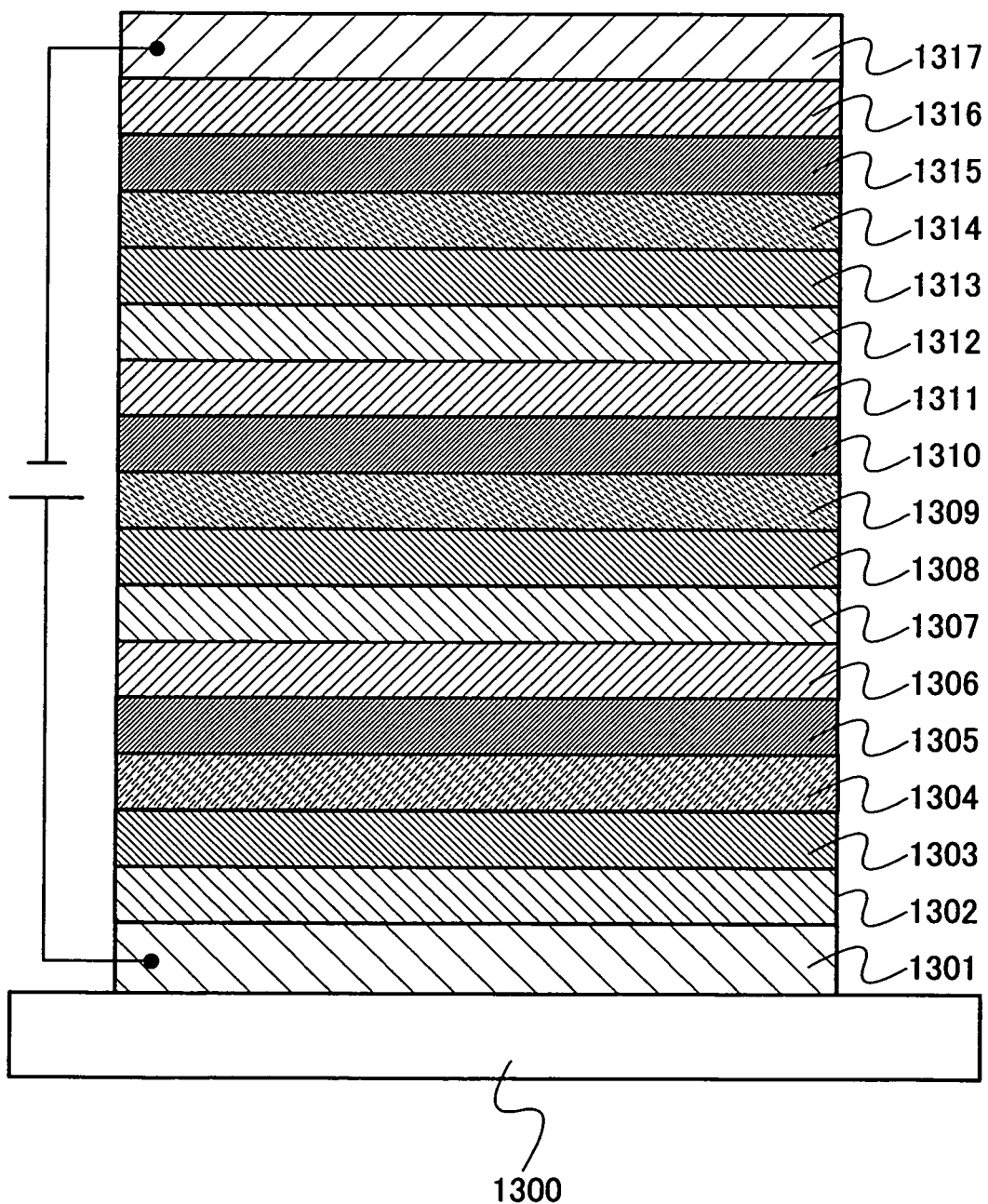
FIG. 64 is a view explaining a light emitting element of the present invention.

An embodiment of the present invention will be described with reference to FIG. 64.

Indium tin oxide was formed to have a thickness of 110 nm over a glass substrate 1300 by a sputtering method to form a layer 1301 including indium tin oxide.

A layer 1302 including NPB and molybdenum oxide with a thickness of 50 nm was formed over the layer 1301 including indium tin oxide by co-evaporation of NPB and molybdenum oxide so that a weight ratio of NPB to molybdenum oxide satisfied 1:0.25. Further, the co-evaporation method indicates an evaporation method by which evaporation is concurrently conducted from a plurality of evaporation sources in one treatment chamber.

Next, NPB was formed over the layer 1302 including NPB and molybdenum oxide by evaporation to form a layer 1303 including NPB with a thickness of 10 nm.

A layer 1304 including Alq, rubrene, and DCJTI with a thickness of 37.5 nm was formed over the layer 1303 including NPB by co-evaporation of Alq, rubrene, and DCJTI so that the Alq-rubrene-DCJTI weight ratio satisfied 1:1:0.02.

Then, Alq was formed over the layer 1304 including Alq, rubrene, and DCJTI by evaporation to form a layer 1305 including Alq with a thickness of 27.5 nm.

A layer 1306 including BCP and lithium (Li) with a thickness of 10 nm was formed over the layer 1305 including Alq by co-evaporation of BCP and lithium such that the weight ratio of BCP to lithium satisfied 1:0.005.

A layer 1307 including NPB and molybdenum oxide with a thickness of 50 nm was formed over the layer 1306 including BCP and lithium by co-evaporation of NPB and molybdenum oxide such that the weight ratio of NPB to molybdenum oxide satisfied 1:0.25.

Next, NPB was formed over the layer 1307 including NPB and molybdenum oxide by evaporation to form a layer 1308 including NPB with a thickness of 10 nm.

A layer 1309 including Alq and coumarin 6 with a thickness of 37.5 nm was formed over the layer 1308 including NPB by co-evaporation of Alq and coumarin 6 such that the weight ratio of Alq to coumarin 6 satisfied 1:0.005.

Next, Alq was formed over the layer 1309 including Alq and coumarin 6 by evaporation to form a layer 1310 including Alq with a thickness of 27.5 nm.

A layer 1311 including BCP and lithium (Li) with a thickness of 10 nm was formed over the layer 1310 including Alq by co-evaporation of BCP and lithium such that the weight ratio of BCP to lithium satisfied 1:0.005.

A layer 1312 including NPB and molybdenum oxide with a thickness of 50 nm was formed over the layer 1311 including BCP and lithium by co-evaporation of NPB and molybdenum oxide such that the weight ratio of NPB to molybdenum oxide satisfied 1:0.25.

Subsequently, NPB was formed over the layer 1312 including NPB and molybdenum, oxide by evaporation to form a layer 1313 including NPB with a thickness of 10 nm.

Next, t-BuDNA was formed over the layer 1313 including NPB by evaporation to form a layer 1314 including t-BuDNA with a thickness of 37.5 nm.

Alq was next formed over the layer 1314 including t-BuDNA by evaporation to form a layer 1315 including Alq with a thickness of 27.5 nm.

A layer 1316 including BCP and lithium (Li) with a thickness of 10 nm was formed over the layer 1315 including Alq by co-evaporation of BCP and lithium such that the weight ratio of BCP to lithium (Li) satisfied 1:0.005.

Subsequently, aluminum was formed over the layer 1316 including BCP and lithium by evaporation to form a layer 1317 including aluminum with a thickness of 200 nm.

In the thus-manufactured light emitting element, the layer 1301 including indium tin oxide serves as an anode, and the layer 1317 including aluminum serves as a cathode.

The layer 1302 including NPB and molybdenum oxide has a function of injecting holes into the layer 1303 including NPB. Also, the layer 1307 including NPB and molybdenum oxide has a function of injecting holes into the layer 1308 including NPB. The layer 1312 including NPB and molybdenum oxide has a function of injecting holes into the layer 1313 including NPB.

The layer 1303 including NPB has a function of transporting the injected holes to the layer 1304 including Alq, rubrene, and DCJTI. The layer 1308 including NPB has a function of transporting the injected holes to the layer 1309 including Alq and coumarin 6. The layer 1313 including NPB serves as a hole transporting layer for transporting the injected holes to the layer 1314 including t-BuDNA.

The layer 1306 including BCP and lithium has a function of injecting electrons in the layer 1305 including Alq. Further, the layer 1311 including BCP and lithium has a function of injecting electrons to the layer 1310 including Alq. The layer 1316 including BCP and lithium has a function of injecting electrons into the layer 1315 including Alq.

The layer 1305 including Alq has a function of transporting the injected electrons to the layer 1304 including Alq, rubrene, and DCJTI. The layer 1310 including Alq has a function of transporting electrons injected from the layer 1311 including BCP and lithium to the layer 1309 including Alq and coumarin 6. The layer 1315 including Alq serves as an electron transporting layer for transporting electrons injected from the layer 1316 including BCP and lithium to the layer 1314 including t-BuDNA.

In the layers 1302, 1307, and 1312 each including NPB and molybdenum oxide, molybdenum oxide serves as an electron acceptor. Further, in the layers 1306, 1311, and 1316 each including BCP and lithium, lithium serves as an electron donor.

In this light emitting element, when a voltage is applied to the layer 1301 including indium tin oxide and the layer 1317 including aluminum, current flows through the layer 1301 including indium tin oxide and the layer 1317 including aluminum. Therefore, the layer 1304 including Alq, rubrene and DCJTI emits light with a peak in a wavelength range of 600 to 680 nm. The layer 1309 including Alq and coumarin 6 emits light with a peak in a wavelength range of 500 to 550 nm. The layer 1314 including t-BuDNA emits light with a peak in a wavelength range of 420 to 480 nm. Light generated in these layers is emitted outside through the layer 1301 including indium tin oxide. As can be seen from the above description, in the light emitting element of this embodiment, the layer exhibiting light emission with a shorter wavelength of 420 to 480 nm is provided to be closer to a layer with high reflectance such as the layer 1317 including aluminum than the layer exhibiting light emission with a longer wavelength of 600 to 680 nm. Consequently, interference of light emitted and light reflected by the layer 1317 including aluminum can be reduced.

Figure 65:
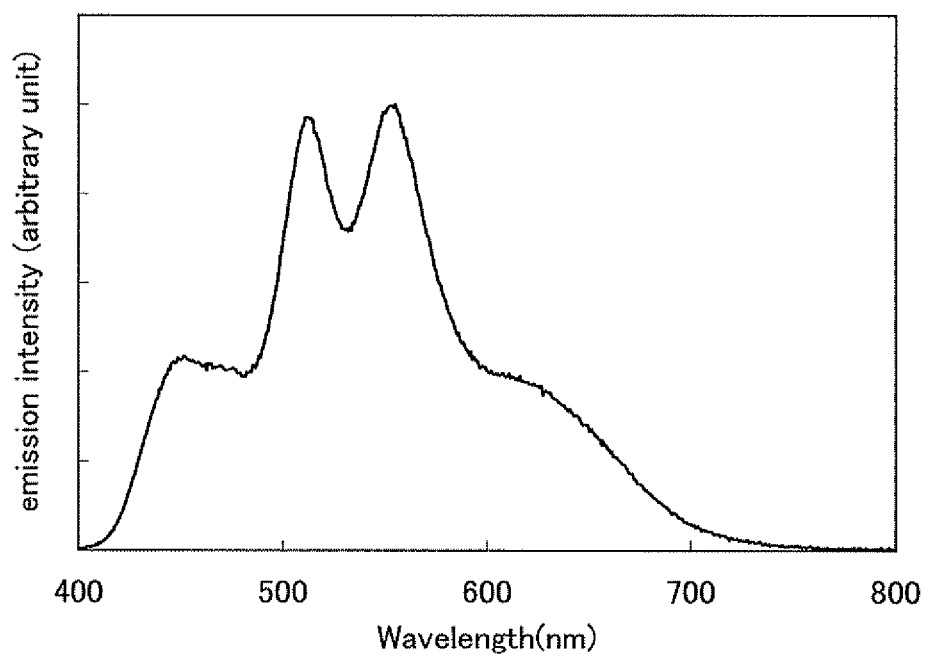
FIG. 65 is a view showing emission spectrum of a light emitting element of the present invention.

The emission spectrums in a case where the light emitting element manufactured in this embodiment emits light will be shown in FIG. 65. In FIG. 65, a horizontal axis indicates a wavelength (nm) and a longitudinal axis indicates emission intensity (an arbitrary unit). According to FIG. 65, it is revealed that the light emitting element manufactured in this embodiment emits light in a wavelength range of 450 to 620 mm. The CIE chromaticity coordinate at 0.979 mA (current density is 24.5 mA/cm$^2$) were x=0.33, y=0.46, and luminance was 1900 cd/m$^2$. Therefore, it was revealed that the light emitting element manufactured in this embodiment emits white light.

By manufacturing a tandem light emitting element described above, a light emitting element with high current efficiency can be obtained. In addition, as in this embodiment, white emission having wide spectrum in a visible light region can be obtained. Further, by manufacturing using a substance with a low moisture absorbing property such as molybdenum oxide, a light emitting element with low deterioration due to mixture of moisture can be obtained. Furthermore, interference of emitted light and reflected light is low in a light emitting element of the present invention; therefore, chromaticity of emitted light can be easily adjusted.

Embodiment 20

In this embodiment, current-voltage characteristics of a layer including a composite material of the present invention were measured.

(Element 1)

First, indium tin oxide including silicon oxide (ITSO) was formed over a glass substrate by a sputtering method to form a first electrode. The size of the electrode was set to 2 mm×2 mm.

Next, the substrate provided with the first electrode was fixed to a substrate holder provided in a vacuum evaporation system so that a surface over which the first electrode was formed was placed downward.

Then, after the vacuum evaporation system was exhausted to reduce the pressure, NPB and molybdenum oxide (VI) were co-evaporated over the first electrode to form a layer including a composite material of the present invention. A thickness thereof was set to 200 nm. The co-evaporation method indicates an evaporation method by which evaporation is concurrently conducted from a plurality of evaporation sources in one treatment chamber. A weight ratio of NPB and molybdenum oxide (VI) was adjusted to be 4:1.

Aluminum (Al) was formed over the layer including a composite material of the present invention by an evaporation method using resistance heating to form a second electrode, and accordingly, an element 1 was manufactured.

(Element 2) First, indium tin oxide including silicon oxide (ITSO) was formed over a glass substrate by a sputtering method to form a first electrode. The size of the electrode was set to 2 mm×2 mm.

Next, the substrate provided with the first electrode was fixed to a substrate holder provided in a vacuum evaporation system so that a surface over which the first electrode was formed was placed downward.

Then, after the vacuum evaporation system was exhausted to reduce the pressure, DNTPD and molybdenum oxide (VI) were co-evaporated over the first electrode to form a layer including a composite material of the present invention. A thickness thereof was set to 200 nm. The co-evaporation method indicates an evaporation method by which evaporation is concurrently conducted from a plurality of evaporation sources in one treatment chamber. A weight ratio of DNTPD and molybdenum oxide (VI) was adjusted to be 4:2.

Aluminum (Al) was formed over the layer including a composite material of the present invention by an evaporation method using resistance heating to form a second electrode, and accordingly, an element 2 was manufactured.

(Element 3)

First, indium tin oxide including silicon oxide (ITSO) was formed over a glass substrate by a sputtering method to form a first electrode. The size of the electrode was set to 2 mm×2 mm.

Next, the substrate provided with the first electrode was fixed to a substrate holder provided in a vacuum evaporation system so that a surface over which the first electrode was formed was placed downward.

Then, after the vacuum evaporation system was exhausted to reduce the pressure, PCzPCN1 and molybdenum oxide (VI) were co-evaporated over the first electrode to form a layer including a composite material of the present invention. A thickness thereof was set to 200 nm. The co-evaporation method indicates an evaporation method by which evaporation is concurrently conducted from a plurality of evaporation sources in one treatment chamber. A weight ratio of PCzPCN1 and molybdenum oxide (VI) was adjusted to be 4:2.

Aluminum (Al) was formed over the layer including a composite material of the present invention by an evaporation method using resistance heating to form a second electrode, and accordingly, an element 3 was manufactured.

(Element 4)

First, indium tin oxide including silicon oxide (ITSO) was formed over a glass substrate by a sputtering method to form a first electrode. The size of the electrode was set to 2 mm×2 mm.

Next, the substrate provided with the first electrode was fixed to a substrate holder provided in a vacuum evaporation system so that a surface over which the first electrode was formed was placed downward.

Then, after the vacuum evaporation system was exhausted to reduce the pressure, t-BuDNA and molybdenum oxide (VI) were co-evaporated over the first electrode to form a layer including a composite material of the present invention. A thickness thereof was set to 200 nm. The co-evaporation method indicates an evaporation method by which evaporation is concurrently conducted from a plurality of evaporation sources in one treatment chamber. A weight ratio of t-BuDNA and molybdenum oxide (VI) was adjusted to be 4:2.

Aluminum (Al) was formed over the layer including a composite material of the present invention by an evaporation method using resistance heating to form a second electrode, and accordingly, an element 4 was manufactured.

(Comparative Element 5)

First, indium tin oxide including silicon oxide (ITSO) was formed over a glass substrate by a sputtering method to form a first electrode. The size of the electrode was set to 2 mm×2 mm.

Next, the substrate provided with the first electrode was fixed to a substrate holder provided in a vacuum evaporation system so that a surface over which the first electrode was formed was placed downward.

Then, after the vacuum evaporation system was exhausted to reduce the pressure, a layer including t-BuDNA was formed over the first electrode. A thickness thereof was set to 200 nm.

Aluminum (Al) was formed over the layer including t-BuDNA by an evaporation method using resistance heating to form a second electrode, and accordingly, a comparative element 5 was manufactured.

The measurement of current-voltage characteristics were conducted by a two-terminal method, provided that a case where ITSO is an anode and Al is a cathode is a forward direction, whereas a case where ITSO is a cathode and Al is an anode is a backward direction.

Figure 67:
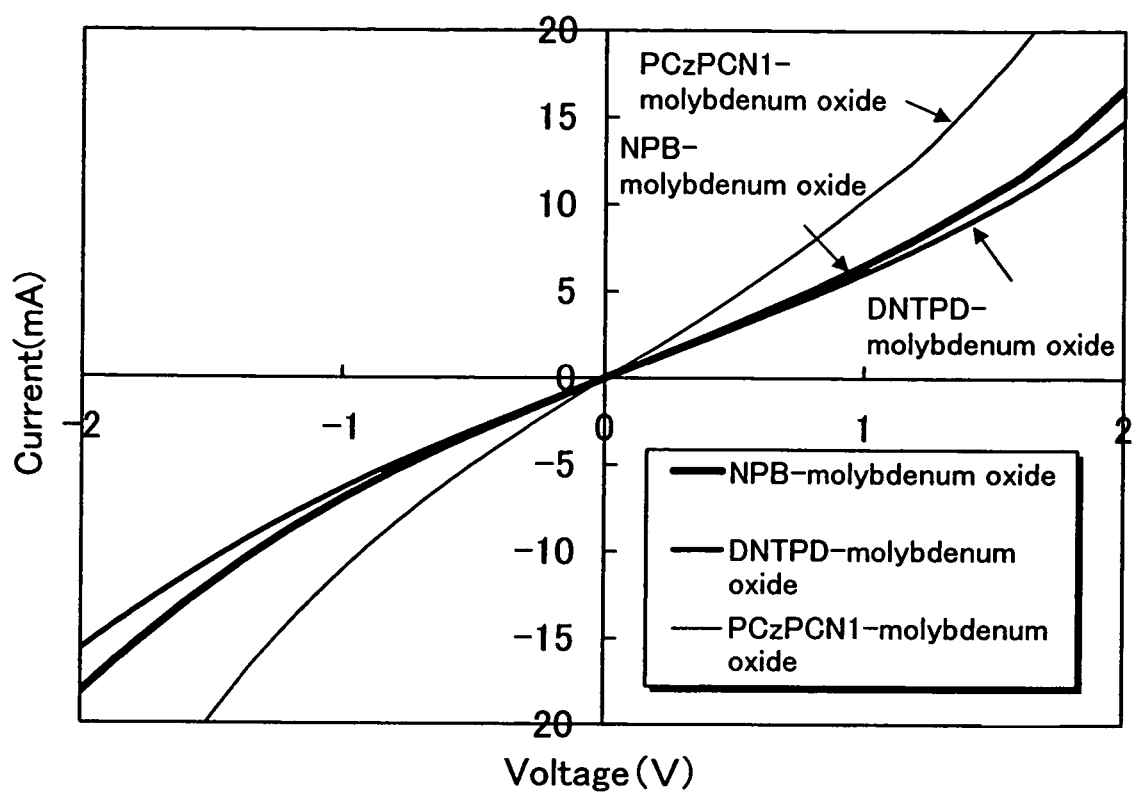
FIG. 67 is a view showing current-voltage characteristics of an element manufactured in Embodiment 20.

FIG. 67 shows a result of current-voltage characteristics of the elements 1 to 3 at 25° C. In the elements 1 to 3, it is revealed that current flows in both forward direction and backward direction, and current-voltage characteristics thereof are symmetrical with respect to an origin of the coordinate axes. The current-voltage characteristics are symmetrical, though different electrodes of ITSO and Al are used in the elements 1 to 3; therefore, it is conceivable that an interface between the electrode and the layer including the composite material of the present invention does not have Schottky contact.

Figure 68A:
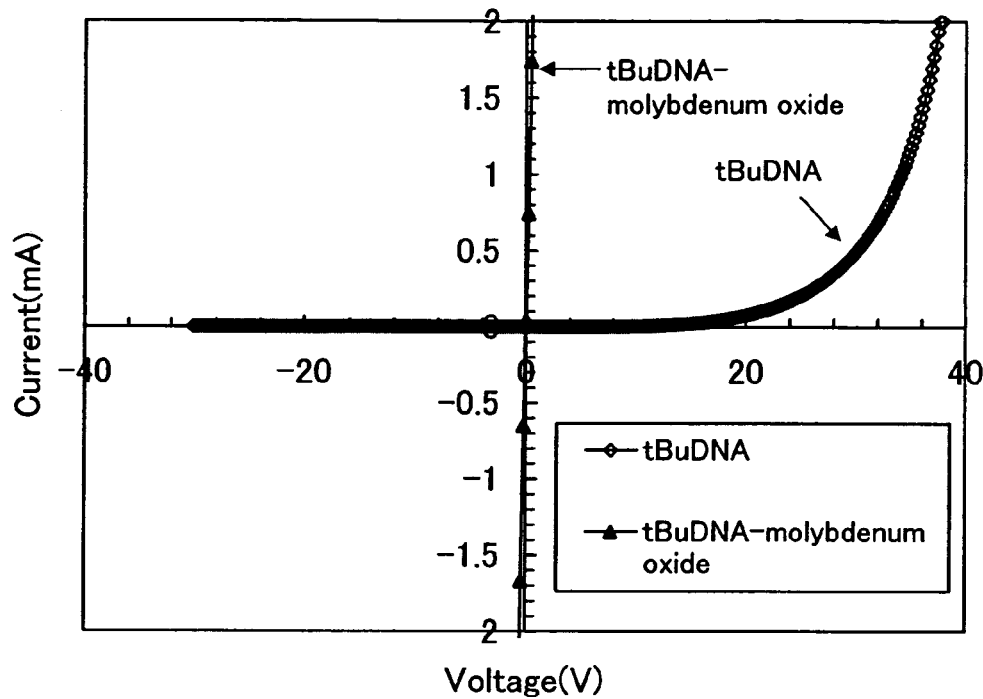
FIGS. 68A and 68B are views each showing current-voltage characteristics of an element manufactured in Embodiment 20.
Figure 68B:
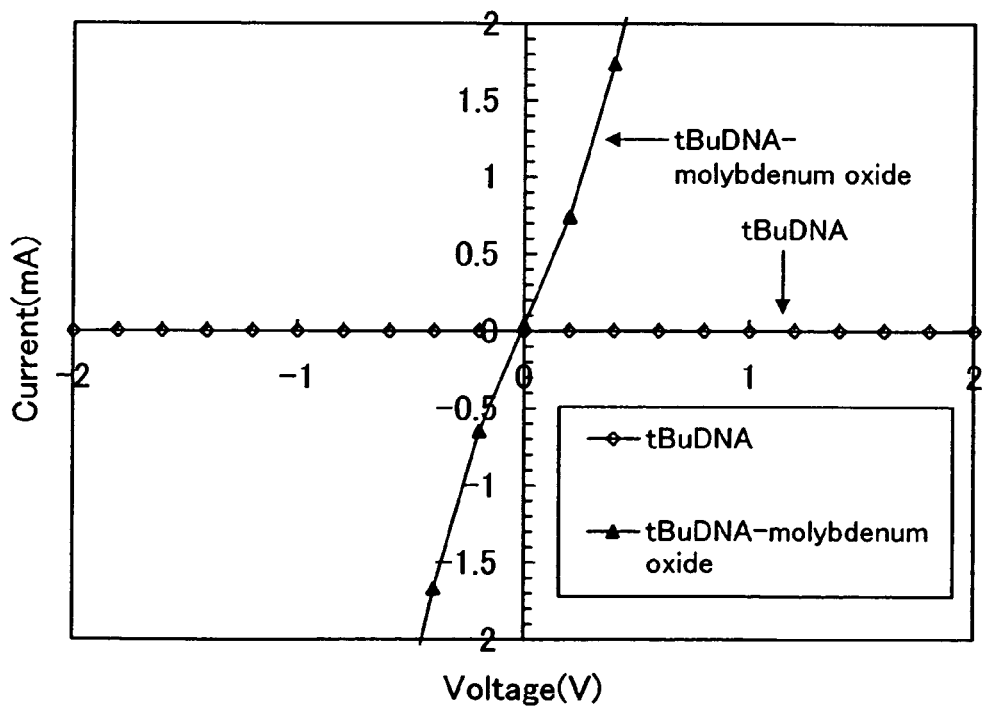

Further, FIGS. 68A and 68B each show a result of current-voltage characteristics of the element 4 and the comparative element 5. It is to be noted that FIG. 68B is an enlarged view of a portion in FIG. 68A where a voltage value is within the range of −2 V to 2 V. It is revealed that, as for the element 4 having a layer having the composite material of the present invention, carriers are easily injected from an electrode and conductivity is high, compared with the comparative element 5 having a layer including only an organic compound. Further, also in the element 4, it is revealed that current flows in both forward direction and backward direction, and current-voltage characteristics thereof are symmetrical with respect to an origin of the coordinate axes. The current-voltage characteristics are symmetrical, though different electrodes of ITSO and Al are used in the elements 1 to 3; therefore, it is conceivable that an interface between the electrode and the layer including the composite material of the present invention is not Schottky contact.

Embodiment 21

In this embodiment, ionization potential of each substance was calculated by converting a value of an oxidation peak potential of each substance measured in Embodiment 1 into electron volt [eV].

First, calculation was made to figure out what electron volt potential energy of the reference electrode potential used in Embodiment 1 corresponds. In other words, ionization potential of an Ag/Ag$^+$ electrode was calculated. It is known that an oxidation-reduction potential of ferrocene in methanol is +0.610 [V vs. SHE] with respect to a standard hydrogen electrode (Reference: Christian R. Goldsmith et al., J. Am. Chem. Soc., Vol. 124, No. 1, pp. 83-96, 2002). It is also known that a standard hydrogen electrode potential is 4.44 eV (Reference: Toshihiro Ohnishi and Tamami Koyama, High molecular EL material, Kyoritsu shuppan, pp. 64-67). Accordingly, it is revealed that potential energy of an oxidation-reduction potential of ferrocene in methanol is 5.05 eV.

On the other hand, an oxidation-reduction potential of ferrocene in methanol is obtained using a reference electrode used in Embodiment 1 was +0.20 V [vs. Ag/Ag$^+$]. Therefore, provided that potential energy of the reference electrode used in Embodiment 1 is ER [eV], ER+0.20=5.05 [eV] could be obtained. Thus, a potential ER of the reference electrode used in Embodiment 1 could be calculated as follows: 5.05−0.20=4.85 [eV].

Here, ionization potential Ip of each substance in a DMIF solution can be calculated by using the following equation: Ip=ER+Epa=4.85+Epa [eV]. Therefore, from the result of Table 1, the ionization potential Ip of each substance is as shown in Table 2 below. It is to be noted that the ionization potential of BCP, OXD-7, and TPBi is not observed in the range of 4.85 [eV] and 6.35 [eV]. Thus, ionization potential of an organic compound which can be used for the composite material of the present invention is 4.8 [eV] to 6.4 [eV], preferably 5.0 [eV] to 6.0 [eV] from the result of Table 2.

[Table 2]

"−" indicates that oxidation peak potential or ionization potential was not observed.

Embodiment 22

In this embodiment, a half-wave potential was calculated from a value of an

TABLE 2

| | organic compound | $E_{pa}$ [V vs. Ag/Ag$^+$] | ionization potential [eV] |
|---|---|---|---|
| Measurement example 1 | NPB | 0.45 | 5.30 |
| Measurement example 2 | DNTPD | 0.26 | 5.11 |
| Measurement example 3 | PCzPCA1 | 0.27 | 5.12 |
| Measurement example 4 | PCzPCN1 | 0.26 | 5.11 |
| Measurement example 5 | CBP | 1.00 | 5.85 |
| Measurement example 6 | t-BuDNA | 0.89 | 5.74 |
| Measurement example 7 | DPVBi | 1.00 | 5.85 |
| Measurement example 8 | Alq | 0.82 | 5.67 |
| Comparative measurement example 1 | BCP | — | — |

TABLE 2-continued

| | organic compound | $E_{pa}$ [V vs. Ag/Ag$^+$] | ionization potential [eV] |
|---|---|---|---|
| Comparative measurement example 2 | OXD-7 | — | — |
| Comparative measurement example 3 | TBPi | — | — | oxidation peak potential of each substance measured in Embodiment 1.

An oxidation peak potential (Epa) of oxidation reaction by which a neutral organic compound releases electron to be a cation was measured in Embodiment 1. However, by using a value of a reduction peak potential (Epc) of reduction reaction by which the cation receives an electron to return to a neutral organic compound, a potential in an equilibrium state of giving and receiving electrons (namely, formal potential) can be obtained. A formal potential can be considered to be approximately consistent with a middle value (namely, half-wave potential) between an oxidation peak potential (Epa) and a reduction peak potential (Epc) and is not affected by temperature or changing speed. Table 3 shows a value of a reduction peak potential (Epc) of each substance measured in Embodiment 1 and a half-wave potential (E½) converted from a measurement value in Embodiment 1. It is to be noted that a measurement value (three places of decimals) in Embodiment 1 is used for the calculation, and the result of calculation is denoted in Table 3 by three places of decimals of a significant figure. Further, in Table 3, a value of a half-wave potential [vs. Fc/Fc$^+$] was obtained by conversion in the same manner as a case of an oxidation peak potential (Epa).

TABLE 3

| | organic compound | $E_{pc}$ [V vs. Ag/Ag$^+$] | $E_{1/2}$ [V vs. Ag/Ag$^+$] | $E_{1/2}$ [V vs. Fc/Fc$^+$] |
|---|---|---|---|---|
| Measurement example 1 | NPB | 0.30 | 0.37 | 0.28 |
| Measurement example 2 | DNTPD | 0.16 | 0.21 | 0.12 |
| Measurement example 3 | PCzPCA1 | 0.20 | 0.24 | 0.15 |
| Measurement example 4 | PCzPCN1 | 0.19 | 0.22 | 0.13 |
| Measurement example 5 | CBP | — | — | — |
| Measurement example 6 | t-BuDNA | 0.76 | 0.82 | 0.73 |
| Measurement example 7 | DPVBi | — | — | — |
| Measurement example 8 | Alq | — | — | — |
| Comparative Measurement example 1 | BCP | — | — | — |
| Comparative measurement example 2 | OXD-7 | — | — | — |
| Comparative measurement example 3 | TBPi | — | — | — |

"—" indicates that reduction peak potential or half-wave potential was not observed.

According to Table 3, it is revealed that a half-wave potential [V vs. Ag/Ag$^+$] of an organic compound which can be used for the composite material of the present invention is 0.2 to 0.9 [V vs. Fc/Fc$^+$]. Further, it is revealed that a half-wave potential [vs. Fc/Fc$^+$] of an organic compound which can be used for the composite material of the present invention is 0.1 to 0.8 [vs. Fc/Fc$^+$].

This application is based on Japanese Patent Application serial No. 2005-200953 field in Japan Patent Office on Jul. 8, 2005, the entire contents of which are hereby incorporated by reference.

What is claimed is:

1. A light emitting device comprising:
   a light emitting element over a substrate, the light emitting element comprising:
   a layer including a light emitting substance between a pair of electrodes,
   wherein the layer including the light emitting substance includes at least a first layer including a first composite material and a second layer including a second composite material,
   wherein the first layer including the first composite material is provided to be in contact with one of the pair of electrodes serving as an anode, and the second layer including the second composite material is provided to be in contact with the other electrode of the pair of electrodes serving as a cathode,
   wherein the first composite material and the second composite material includes a metal oxide and an organic compound having an oxidation peak potential with respect to an Ag/Ag$^+$ electrode in dimethylformamide (DMF) at room temperature within the range of 0 V or more and 1.5 V or less (vs. Ag/Ag$^+$), and
   wherein the metal oxide is one or more selected from the group consisting of niobium oxide, tantalum oxide, and manganese oxide.

2. A light emitting device according to claim 1, wherein the metal oxide shows an electron accepting property with respect to the organic compound.

3. A light emitting device according to claim 1, wherein the light emitting device further comprises a controlling means for controlling light emission of the light emitting element.

4. A light emitting device according to claim 1, wherein the light emitting device is incorporated into an electronic device selected from the group consisting of a video camera, a digital camera, a goggle type display, a navigation system, an audio reproducing device, a computer, a game machine, a mobile computer, mobile phone, a portable game machine, an electronic book, and an image reproducing device provided with a recording medium.

5. A light emitting device comprising:
   a light emitting element over a substrate, the light emitting element comprising:
   a layer including a light emitting substance between a pair of electrodes,
   wherein the layer including the light emitting substance includes at least a first layer including a first composite material and a second layer including a second composite material,
   wherein the first layer including the first composite material is provided to be in contact with one of the pair of electrodes serving as an anode, and the second layer including the second composite material is provided to be in contact with the other electrode of the pair of electrodes serving as a cathode,
   wherein the first composite material and the second composite material includes a metal oxide and an organic compound having an oxidation peak potential with respect to an Ag/Ag$^+$ electrode in dimethylformamide (DMF) at room temperature within the range of 0.2 V or more and 1.1 V or less (vs. Ag/Ag$^+$), and
   wherein the metal oxide is one or more selected from the group consisting of niobium oxide, tantalum oxide, and manganese oxide.

6. A light emitting device according to claim 5, wherein the metal oxide shows an electron accepting property with respect to the organic compound.

7. A light emitting device according to claim 5, wherein the light emitting device further comprises a controlling means for controlling light emission of the light emitting element.

8. A light emitting device according to claim 5, wherein the light emitting device is incorporated into an electronic device selected from the group consisting of a video camera, a digital camera, a goggle type display, a navigation system, an audio reproducing device, a computer, a game machine, a mobile computer, mobile phone, a portable game machine, an electronic book, and an image reproducing device provided with a recording medium.

9. A light emitting device comprising:
a light emitting element over a substrate, the light emitting element comprising:
a layer including a light emitting substance between a pair of electrodes,
wherein the layer including the light emitting substance includes at least a first layer including a first composite material and a second layer including a second composite material,
wherein the first layer including the first composite material is provided to be in contact with one of the pair of electrodes serving as an anode, and the second layer including the second composite material is provided to be in contact with the other electrode of the pair of electrodes serving as a cathode,
wherein the first composite material and the second composite material includes a metal oxide and an organic compound having an oxidation peak potential with respect to an oxidation-reduction potential of ferrocene in dimethylformamide (DMF) at room temperature within the range of 0 V or more and 1.5 V or less (vs. Fc/Fc$^+$), and
wherein the metal oxide is one or more selected from the group consisting of niobium oxide, tantalum oxide, and manganese oxide.

10. A light emitting device according to claim 9, wherein the metal oxide shows an electron accepting property with respect to the organic compound.

11. A light emitting device according to claim 9, wherein the light emitting device further comprises a controlling means for controlling light emission of the light emitting element.

12. A light emitting device according to claim 9, wherein the light emitting device is incorporated into an electronic device selected from the group consisting of a video camera, a digital camera, a goggle type display, a navigation system, an audio reproducing device, a computer, a game machine, a mobile computer, mobile phone, a portable game machine, an electronic book, and an image reproducing device provided with a recording medium.

13. A light emitting device comprising:
a light emitting element over a substrate, the light emitting element comprising:
a layer including a light emitting substance between a pair of electrodes,
wherein the layer including the light emitting substance includes at least a first layer including a first composite material and a second layer including a second composite material,
wherein the first layer including the first composite material is provided to be in contact with one of the pair of electrodes serving as an anode, and the second layer including the second composite material is provided to be in contact with the other electrode of the pair of electrodes serving as a cathode,
wherein the first composite material and the second composite material includes a metal oxide and an organic compound having an oxidation peak potential with respect to an oxidation-reduction potential of ferrocene in dimethylformamide (DMF) at room temperature within the range of 0.1 V or more and 1.0 V or less (vs. Fc/Fc$^+$), and
wherein the metal oxide is one or more selected from the group consisting of niobium oxide, tantalum oxide, and manganese oxide.

14. A light emitting device according to claim 13, wherein the metal oxide shows an electron accepting property with respect to the organic compound.

15. A light emitting device according to claim 13, wherein the light emitting device further comprises a controlling means for controlling light emission of the light emitting element.

16. A light emitting device according to claim 13, wherein the light emitting device is incorporated into an electronic device selected from the group consisting of a video camera, a digital camera, a goggle type display, a navigation system, an audio reproducing device, a computer, a game machine, a mobile computer, mobile phone, a portable game machine, an electronic book, and an image reproducing device provided with a recording medium.

17. A light emitting device comprising:
a light emitting element over a substrate, the light emitting element comprising:
a layer including a light emitting substance between a pair of electrodes,
wherein the layer including the light emitting substance includes at least a first layer including a first composite material and a second layer including a second composite material,
wherein the first layer including the first composite material is provided to be in contact with one of the pair of electrodes serving as an anode, and the second layer including the second composite material is provided to be in contact with the other electrode of the pair of electrodes serving as a cathode,
wherein the first composite material and the second composite material includes a metal oxide and an organic compound having ionization potential in dimethylformamide (DMF) solution at room temperature within the range of 4.8 eV or more and 6.4 eV or less, and
wherein the metal oxide is one or more selected from the group consisting of niobium oxide, tantalum oxide, and manganese oxide.

18. A light emitting device according to claim 17, wherein the metal oxide shows an electron accepting property with respect to the organic compound.

19. A light emitting device according to claim 17, wherein the light emitting device further comprises a controlling means for controlling light emission of the light emitting element.

20. A light emitting device according to claim 17, wherein the light emitting device is incorporated into an electronic device selected from the group consisting of a video camera, a digital camera, a goggle type display, a navigation system, an audio reproducing device, a computer, a game machine, a mobile computer, mobile phone, a portable game machine, an electronic book, and an image reproducing device provided with a recording medium.

21. A light emitting device comprising:
a light emitting element over a substrate, the light emitting element comprising:
a layer including a light emitting substance between a pair of electrodes,
wherein the layer including the light emitting substance includes at least a first layer including a first composite material and a second layer including a second composite material,
wherein the first layer including the first composite material is provided to be in contact with one of the pair of electrodes serving as an anode, and the second layer including the second composite material is provided to be in contact with the other electrode of the pair of electrodes serving as a cathode,
wherein the first composite material and the second composite material includes a metal oxide and an organic compound having ionization potential in dimethylformamide (DMF) solution at room temperature within the range of 5.0 eV or more and 6.0 eV or less, and
wherein the metal oxide is one or more selected from the group consisting of niobium oxide, tantalum oxide, and manganese oxide.

22. A light emitting device according to claim 21, wherein the metal oxide shows an electron accepting property with respect to the organic compound.

23. A light emitting device according to claim 21, wherein the light emitting device further comprises a controlling means for controlling light emission of the light emitting element.

24. A light emitting device according to claim 21, wherein the light emitting device is incorporated into an electronic device selected from the group consisting of a video camera, a digital camera, a goggle type display, a navigation system, an audio reproducing device, a computer, a game machine, a mobile computer, mobile phone, a portable game machine, an electronic book, and an image reproducing device provided with a recording medium.

25. A light emitting device according to claim 1, wherein the organic compound is one selected from the group consisting of an aromatic amine compound, a carbazole derivative, an aromatic hydrocarbon, a metal complex, an organic metal complex, and a high molecular compound.

26. A light emitting device according to claim 5, wherein the organic compound is one selected from the group consisting of an aromatic amine compound, a carbazole derivative, an aromatic hydrocarbon, a metal complex, an organic metal complex, and a high molecular compound.

27. A light emitting device according to claim 9, wherein the organic compound is one selected from the group consisting of an aromatic amine compound, a carbazole derivative, an aromatic hydrocarbon, a metal complex, an organic metal complex, and a high molecular compound.

28. A light emitting device according to claim 13, wherein the organic compound is one selected from the group consisting of an aromatic amine compound, a carbazole derivative, an aromatic hydrocarbon, a metal complex, an organic metal complex, and a high molecular compound.

29. A light emitting device according to claim 17, wherein the organic compound is one selected from the group consisting of an aromatic amine compound, a carbazole derivative, an aromatic hydrocarbon, a metal complex, an organic metal complex, and a high molecular compound.

30. A light emitting device according to claim 21, wherein the organic compound is one selected from the group consisting of an aromatic amine compound, a carbazole derivative, an aromatic hydrocarbon, a metal complex, an organic metal complex, and a high molecular compound.

31. A light emitting device comprising:
a light emitting element over a substrate, the light emitting element comprising:
a layer including a light emitting substance between a pair of electrodes,
wherein the layer including the light emitting substance includes at least one layer including a composite material,
wherein the composite material includes a metal oxide and an organic compound having an oxidation peak potential with respect to an Ag/Ag+ electrode in dimethylformamide (DMF) at room temperature within the range of 0 V or more and 1.5 V or less (vs. Ag/Ag+),
wherein the organic compound is one selected from the group consisting of an aromatic amine compound, a carbazole derivative, and an aromatic hydrocarbon,
wherein the metal oxide is one or more selected from the group consisting of niobium oxide, tantalum oxide, and manganese oxide.

32. The light emitting element according to claim 31, wherein the at least one layer including the composite material is provided to be in contact with one of the pair of electrodes serving as an anode or the other electrode of the pair of electrodes serving as a cathode.

33. The light emitting element according to claim 31, wherein the at least one layer including the composite material is provided to be in contact with the pair of electrodes, respectively.

34. The light emitting device according to claim 31, wherein the light emitting device further comprises a controlling means for controlling light emission of the light emitting element.

35. The light emitting device according to claim 31, wherein the light emitting device is incorporated into an electronic device selected from the group consisting of a video camera, a digital camera, a goggle type display, a navigation system, an audio reproducing device, a computer, a game machine, a mobile computer, mobile phone, a portable game machine, an electronic book, and an image reproducing device provided with a recording medium.

36. A light emitting device comprising:
a light emitting element over a substrate, the light emitting element comprising:
a layer including a light emitting substance between a pair of electrodes,
wherein the layer including the light emitting substance includes at least one layer including a composite material,
wherein the composite material includes a metal oxide and an organic compound having an oxidation peak potential with respect to an Ag/Ag+ electrode in dimethylformamide (DMF) at room temperature within the range of 0.2 V or more and 1.1 V or less (vs. Ag/Ag+),
wherein the organic compound is one selected from the group consisting of an aromatic amine compound, a carbazole derivative, and an aromatic hydrocarbon,
wherein the metal oxide is one or more selected from the group consisting of niobium oxide, tantalum oxide, and manganese oxide.

37. The light emitting element according to claim 36, wherein the at least one layer including the composite material is provided to be in contact with one of the pair of electrodes serving as an anode or the other electrode of the pair of electrodes serving as a cathode.

38. The light emitting element according to claim 36, wherein the at least one layer including the composite material is provided to be in contact with the pair of electrodes, respectively.

39. The light emitting device according to claim 36, wherein the light emitting device further comprises a controlling means for controlling light emission of the light emitting element.

40. The light emitting device according to claim 36, wherein the light emitting device is incorporated into an electronic device selected from the group consisting of a video camera, a digital camera, a goggle type display, a navigation system, an audio reproducing device, a computer, a game machine, a mobile computer, mobile phone, a portable game machine, an electronic book, and an image reproducing device provided with a recording medium.

41. A light emitting device comprising:
a light emitting element over a substrate, the light emitting element comprising:
a layer including a light emitting substance between a pair of electrodes,
wherein the layer including the light emitting substance includes at least one layer including a composite material,
wherein the composite material includes a metal oxide and an organic compound having an oxidation peak potential with respect to an Ag/Ag+ electrode in dimethylformamide (DMF) at room temperature within the range of 0 V or more and 1.5 V or less (vs. Fe/Fe+),
wherein the organic compound is one selected from the group consisting of an aromatic amine compound, a carbazole derivative, and an aromatic hydrocarbon,
wherein the metal oxide is one or more selected from the group consisting of niobium oxide, tantalum oxide, and manganese oxide.

42. The light emitting element according to claim 41, wherein the at least one layer including the composite material is provided to be in contact with one of the pair of electrodes serving as an anode or the other electrode of the pair of electrodes serving as a cathode.

43. The light emitting element according to claim 41, wherein the at least one layer including the composite material is provided to be in contact with the pair of electrodes, respectively.

44. The light emitting device according to claim 41, wherein the light emitting device further comprises a controlling means for controlling light emission of the light emitting element.

45. The light emitting device according to claim 41, wherein the light emitting device is incorporated into an electronic device selected from the group consisting of a video camera, a digital camera, a goggle type display, a navigation system, an audio reproducing device, a computer, a game machine, a mobile computer, mobile phone, a portable game machine, an electronic book, and an image reproducing device provided with a recording medium.

46. A light emitting device comprising:
a light emitting element over a substrate, the light emitting element comprising:
a layer including a light emitting substance between a pair of electrodes,
wherein the layer including the light emitting substance includes at least one layer including a composite material,
wherein the composite material includes a metal oxide and an organic compound having an oxidation peak potential with respect to an Ag/Ag+ electrode in dimethylformamide (DMF) at room temperature within the range of 0.1 V or more and 1.0 V or less (vs. Fe/Fe+),
wherein the organic compound is one selected from the group consisting of an aromatic amine compound, a carbazole derivative, and an aromatic hydrocarbon,
wherein the metal oxide is one or more selected from the group consisting of niobium oxide, tantalum oxide, and manganese oxide.

47. The light emitting element according to claim 46, wherein the at least one layer including the composite material is provided to be in contact with one of the pair of electrodes serving as an anode or the other electrode of the pair of electrodes serving as a cathode.

48. The light emitting element according to claim 46, wherein the at least one layer including the composite material is provided to be in contact with the pair of electrodes, respectively.

49. The light emitting device according to claim 46, wherein the light emitting device further comprises a controlling means for controlling light emission of the light emitting element.

50. The light emitting device according to claim 46, wherein the light emitting device is incorporated into an electronic device selected from the group consisting of a video camera, a digital camera, a goggle type display, a navigation system, an audio reproducing device, a computer, a game machine, a mobile computer, mobile phone, a portable game machine, an electronic book, and an image reproducing device provided with a recording medium.

51. A light emitting device comprising:
a light emitting element over a substrate, the light emitting element comprising:
a layer including a light emitting substance between a pair of electrodes,
wherein the layer including the light emitting substance includes at least one layer including a composite material,
wherein the composite material includes a metal oxide and an organic compound having an ionization potential in dimethylformamide (DMF) solution at room temperature within the range of 4.8 eV or more and 6.4 eV or less,
wherein the organic compound is one selected from the group consisting of an aromatic amine compound, a carbazole derivative, and an aromatic hydrocarbon,
wherein the metal oxide is one or more selected from the group consisting of niobium oxide, tantalum oxide, and manganese oxide.

52. The light emitting element according to claim 51, wherein the at least one layer including the composite material is provided to be in contact with one of the pair of electrodes serving as an anode or the other electrode of the pair of electrodes serving as a cathode.

53. The light emitting element according to claim 51, wherein the at least one layer including the composite material is provided to be in contact with the pair of electrodes, respectively.

54. The light emitting device according to claim 51, wherein the light emitting device further comprises a controlling means for controlling light emission of the light emitting element.

55. The light emitting device according to claim 51, wherein the light emitting device is incorporated into an electronic device selected from the group consisting of a video camera, a digital camera, a goggle type display, a navigation system, an audio reproducing device, a computer, a game machine, a mobile computer, mobile phone, a portable game machine, an electronic book, and an image reproducing device provided with a recording medium.

56. A light emitting device comprising:
a light emitting element over a substrate, the light emitting element comprising:
a layer including a light emitting substance between a pair of electrodes,
wherein the layer including the light emitting substance includes at least one layer including a composite material,
wherein the composite material includes a metal oxide and an organic compound having an ionization potential in dimethylformamide (DMF) solution at room temperature within the range of 5 eV or more and 6.0 eV or less,
wherein the organic compound is one selected from the group consisting of an aromatic amine compound, a carbazole derivative, and an aromatic hydrocarbon,
wherein the metal oxide is one or more selected from the group consisting of niobium oxide, tantalum oxide, and manganese oxide.

57. The light emitting element according to claim 56, wherein the at least one layer including the composite material is provided to be in contact with one of the pair of electrodes serving as an anode or the other electrode of the pair of electrodes serving as a cathode.

58. The light emitting element according to claim 56, wherein the at least one layer including the composite material is provided to be in contact with the pair of electrodes, respectively.

59. The light emitting device according to claim 56, wherein the light emitting device further comprises a controlling means for controlling light emission of the light emitting element.

60. The light emitting device according device according to claim 56, wherein the light emitting device is incorporated into an electronic device selected from the group consisting of a video camera, a digital camera, a goggle type display, a navigation system, an audio reproducing device, a computer, a game machine, a mobile computer, mobile phone, a portable game machine, an electronic book, and an image reproducing device provided with a recording medium.

* * * * *

UNITED STATES PATENT AND TRADEMARK OFFICE
CERTIFICATE OF CORRECTION

PATENT NO. : 8,659,008 B2
APPLICATION NO. : 11/482086
DATED : February 25, 2014
INVENTOR(S) : Satoshi Seo and Kumi Kojima It is certified that error appears in the above-identified patent and that said Letters Patent is hereby corrected as shown below:

In the Specification:

Column 2, Line 42; Change "Ag/Ag" to --Ag/Ag+--.

Column 10, Line 1; Change "tris(1-phenyl-1-1H-" to --tris(1-phenyl-1H- --.

Column 31, Line 14; Change "set 15 to" to --set to--.

Column 32, Line 53; Change "set 20 to" to --set to--.

Column 52, Line 36; Change "molybdenum, oxide" to --molybdenum oxide--.

Column 53, Line 46; Change "mm." to --nm.--.

Column 56, Line 35; Change "DMIF" to --DMF--.

In the Claims:

Column 63, Line 27, Claim 41; Change "to an Ag/Ag+ electrode in" to
　　　　　　　　　　--to an oxidation-reduction potential of ferrocene in--.

Column 63, Line 29, Claim 41; Change "Fe/Fe+" to --Fc/ Fc+--.

Column 63, Line 67, Claim 46; Change "an Ag/Ag+ electrode in" to
　　　　　　　　　　--an oxidation-reduction potential of ferrocene in--.

Column 64, Line 2, Claim 46; Change "Fe/Fe+" to --Fc/ Fc+--.

Column 65, Line 14, Claim 56; Change "5 eV" to --5.0 eV--.

Column 66, Line 13, Claim 60; Change "emitting device according device according to" to
　　　　　　　　　　--emitting device according to--.

Signed and Sealed this
First Day of July, 2014

Michelle K. Lee
*Deputy Director of the United States Patent and Trademark Office*